(12) United States Patent
Takeuchi

(10) Patent No.: US 7,492,643 B2
(45) Date of Patent: Feb. 17, 2009

(54) NONVOLATILE SEMICONDUCTOR MEMORY

(75) Inventor: Ken Takeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/898,377

(22) Filed: Jul. 26, 2004

(65) Prior Publication Data

US 2005/0207220 A1    Sep. 22, 2005

(30) Foreign Application Priority Data

Mar. 16, 2004    (JP)    ............... 2004-074968

(51) Int. Cl.
*G11C 16/04*    (2006.01)

(52) U.S. Cl. ............ 365/185.28; 365/185.22; 365/185.18; 365/185.24; 365/185.17

(58) Field of Classification Search ............ 365/185.28, 365/185.22, 185.18, 185.24, 185.17, 185.03
See application file for complete search history.

(56) References Cited

U.S. PATENT DOCUMENTS

| | | | | |
|---|---|---|---|---|
| 5,563,821 | A | * | 10/1996 | Kumagai et al. ............ 365/96 |
| 5,986,933 | A | | 11/1999 | Takeuchi et al. |
| 6,055,188 | A | | 4/2000 | Takeuchi et al. |
| 6,081,453 | A | * | 6/2000 | Iwahashi ............ 365/185.22 |
| 6,104,641 | A | * | 8/2000 | Itou ............ 365/189.01 |
| 6,134,154 | A | * | 10/2000 | Iwaki et al. ............ 365/189.04 |
| 6,373,746 | B1 | | 4/2002 | Takeuchi et al. |
| 6,459,621 | B1 | * | 10/2002 | Kawahara et al. ...... 365/185.24 |
| 6,522,580 | B2 | * | 2/2003 | Chen et al. ............ 365/185.02 |
| 6,529,405 | B2 | | 3/2003 | Chang |
| 6,614,070 | B1 | * | 9/2003 | Hirose et al. ........... 365/185.17 |
| 6,657,891 | B1 | * | 12/2003 | Shibata et al. ......... 365/185.03 |
| 6,775,185 | B2 | * | 8/2004 | Fujisawa et al. ....... 365/185.11 |
| 6,990,019 | B2 | * | 1/2006 | Tanaka et al. .......... 365/185.17 |
| 7,057,937 | B1 | * | 6/2006 | Matsubara et al. ..... 365/185.24 |
| 2005/0207220 | A1 | | 9/2005 | Takeuchi |

FOREIGN PATENT DOCUMENTS

| | | |
|---|---|---|
| JP | 10-177797 | 6/1998 |
| KR | 2002-0057055 | 7/2002 |

OTHER PUBLICATIONS

U.S. Appl. No. 11/533,205, filed Sep. 19, 2006, Takeuchi et al.
U.S. Appl. No. 11/533,638, filed Sep. 20, 2006, Takeuchi.

* cited by examiner

*Primary Examiner*—David Lam
(74) *Attorney, Agent, or Firm*—Oblon, Spivak, McClelland, Maier & Neustadt, P.C.

(57) ABSTRACT

A nonvolatile semiconductor memory according to an example of the present invention comprises a memory cell array composed of a plurality of memory cells, an internal circuit which writes into the plurality of memory cells by use of one of a first mode in which a first threshold distribution can be obtained and a second mode in which a second threshold distribution different from the first threshold distribution can be obtained, and a threshold distribution control circuit which controls switchover between the first mode and the second mode.

28 Claims, 32 Drawing Sheets

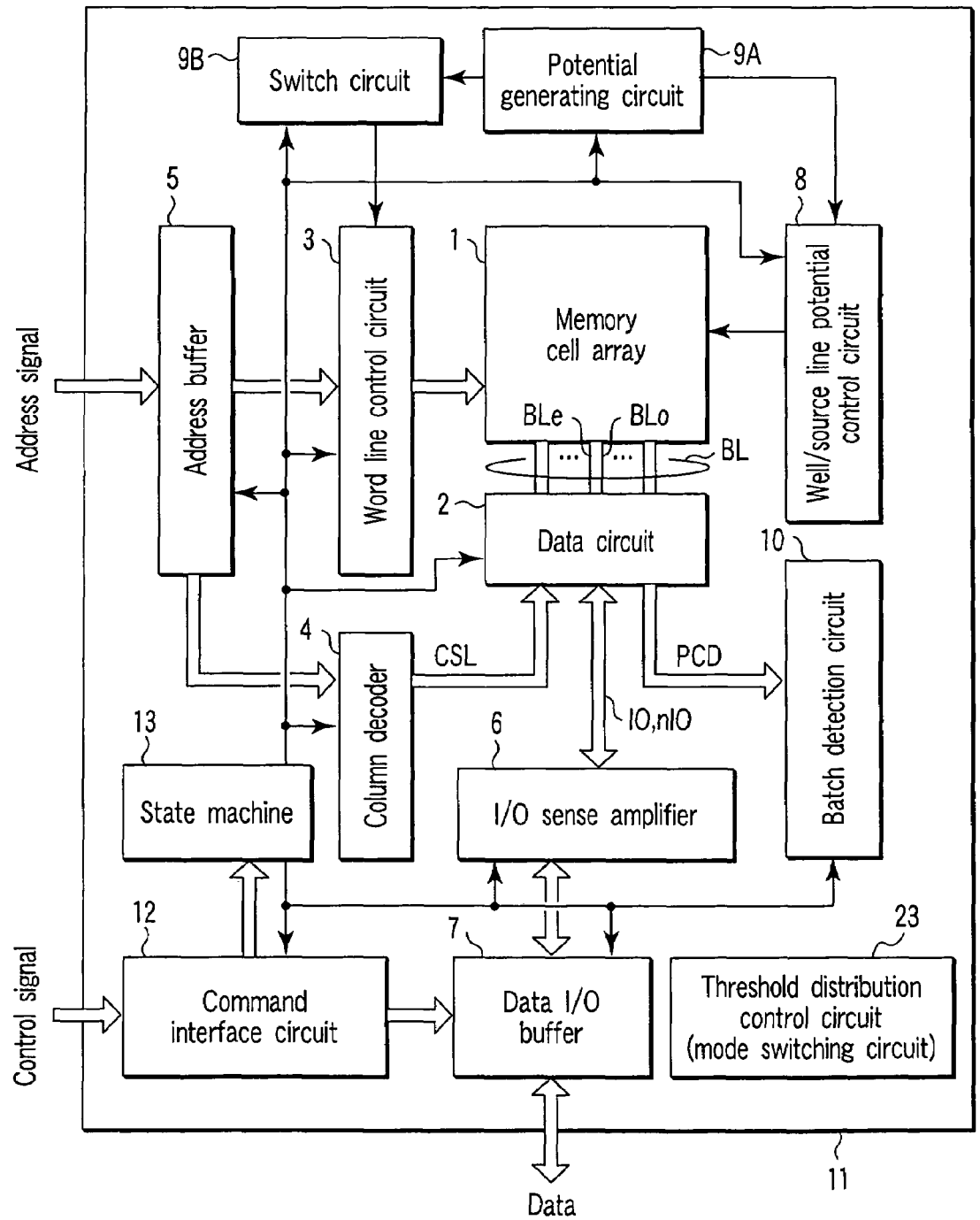
F I G. 1

Mode decision example 1

Mode decision example 2

Mode decision example 3

Mode decision example 4

Mode decision example 5

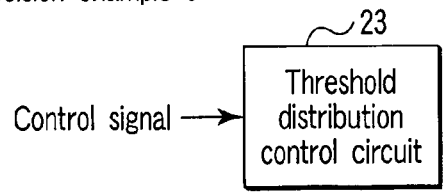

* Control signal is directly input from outside of chip.
 The control signal includes a signal whose value is fixed during wafer process or during chip bonding (such as packaging, direct mounting onto printed circuit board) in addition to signal from another chip.
 (ex. Vdd, Vss)

FIG. 11

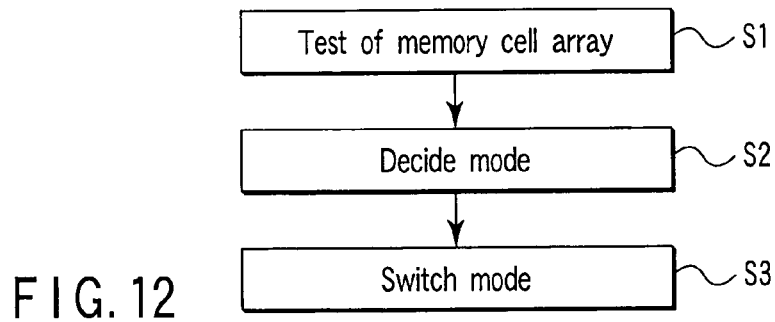

FIG. 12

Mode switch example 1
(When step-up width of write potential can be
varied to control threshold distribution shape)

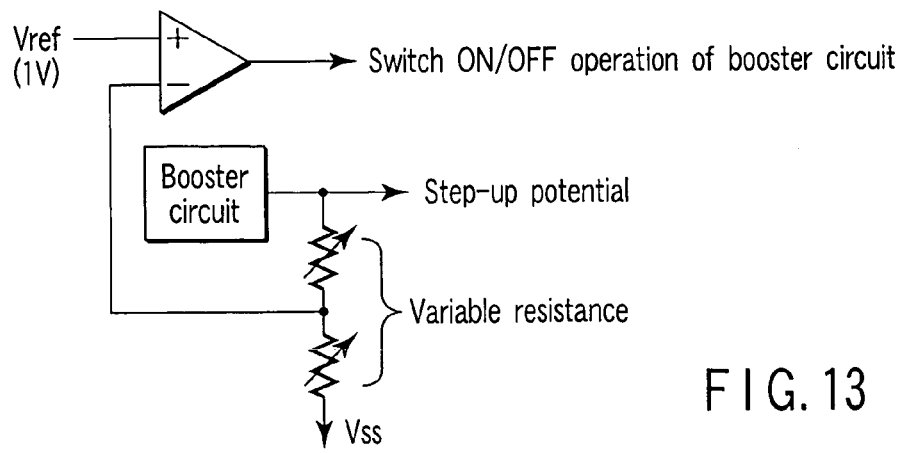

FIG. 13

Mode switch example 2
(When read potential value or verification read potential
value can be varied to control threshold distribution shape)

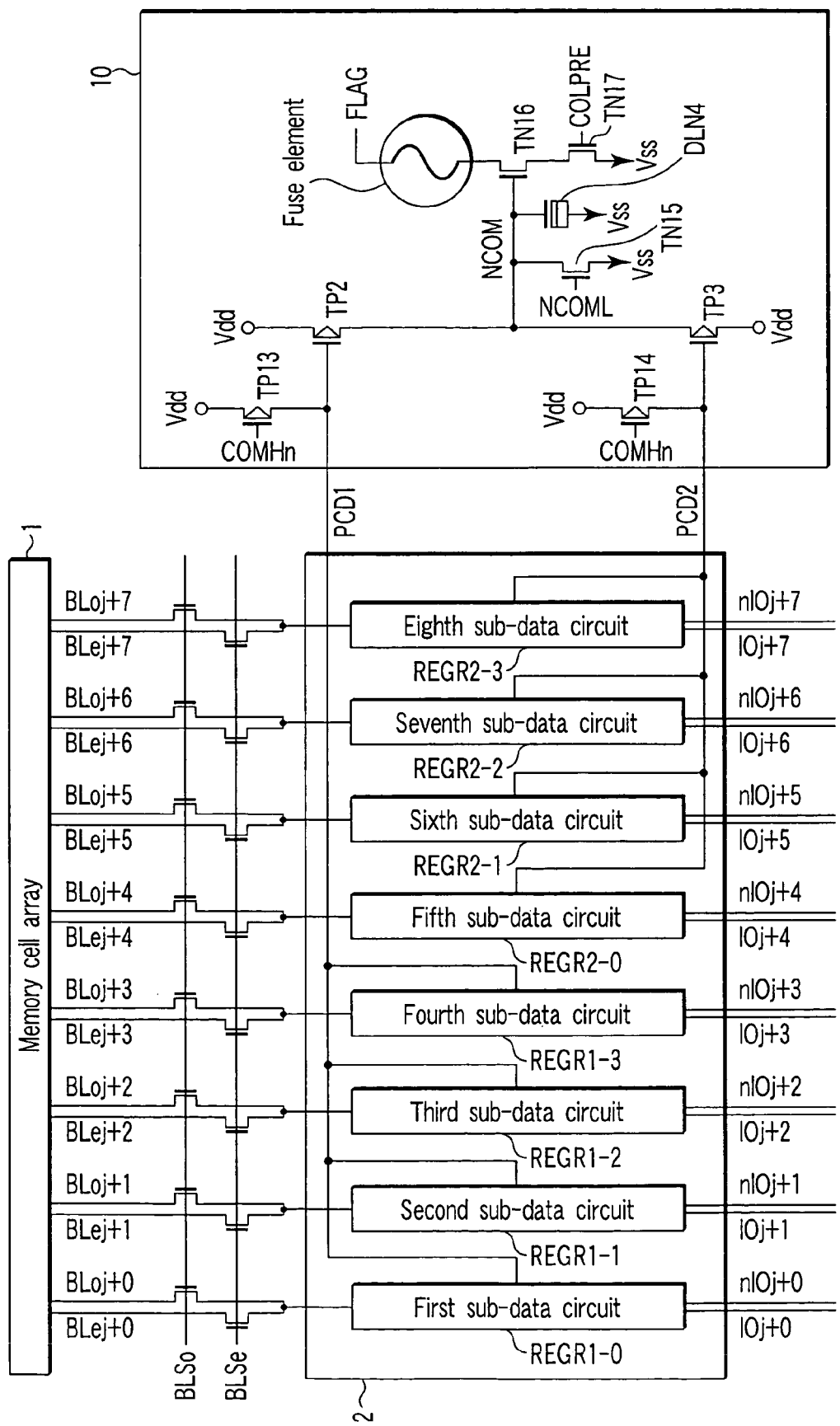
F I G. 21

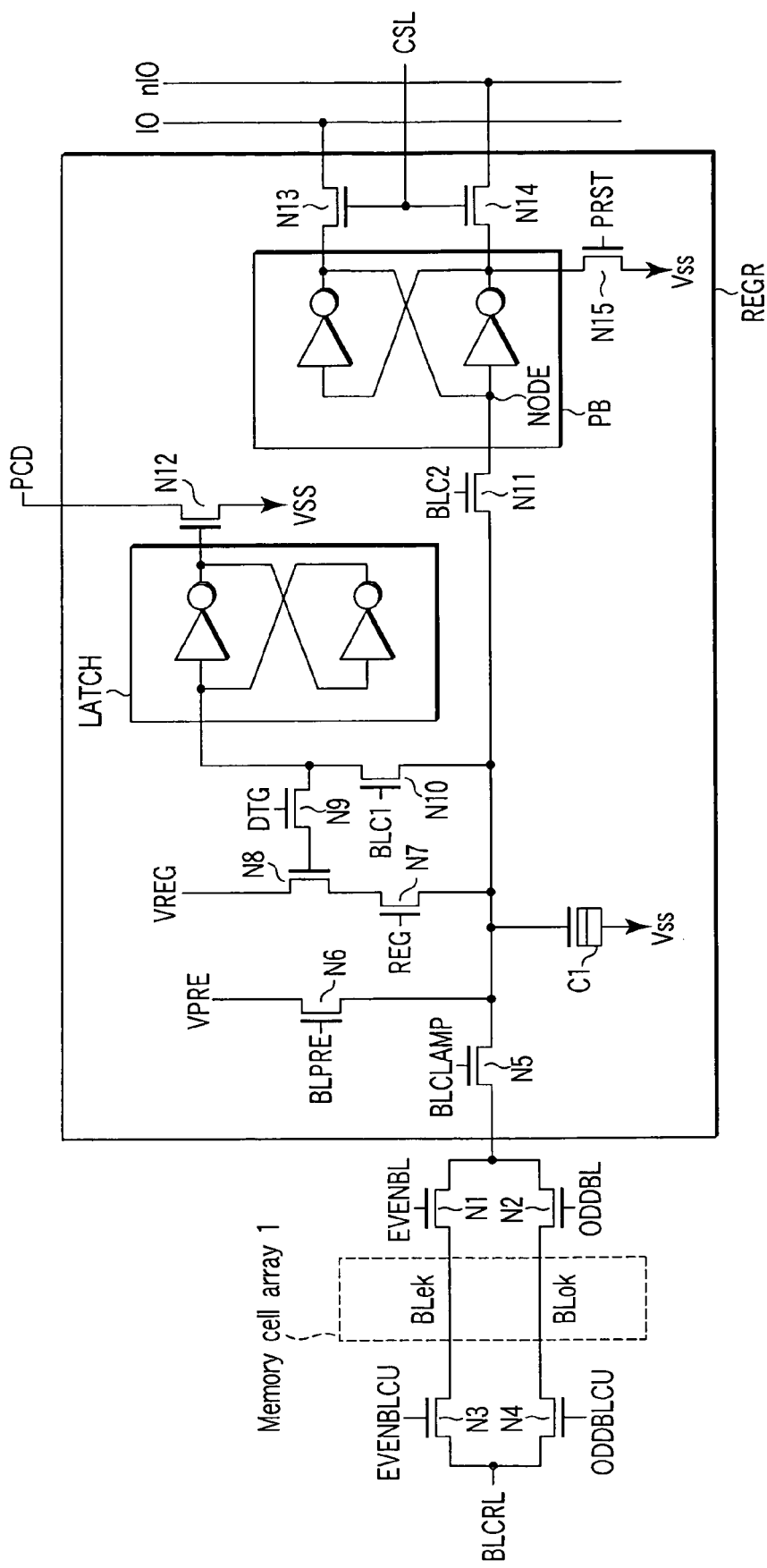
F I G. 23

RMAINi : i-th first word line driver
RADDi : i-th first row address decoder
RDECADS : Word line driver selection signal
i=1, 2, 3, 4, ···

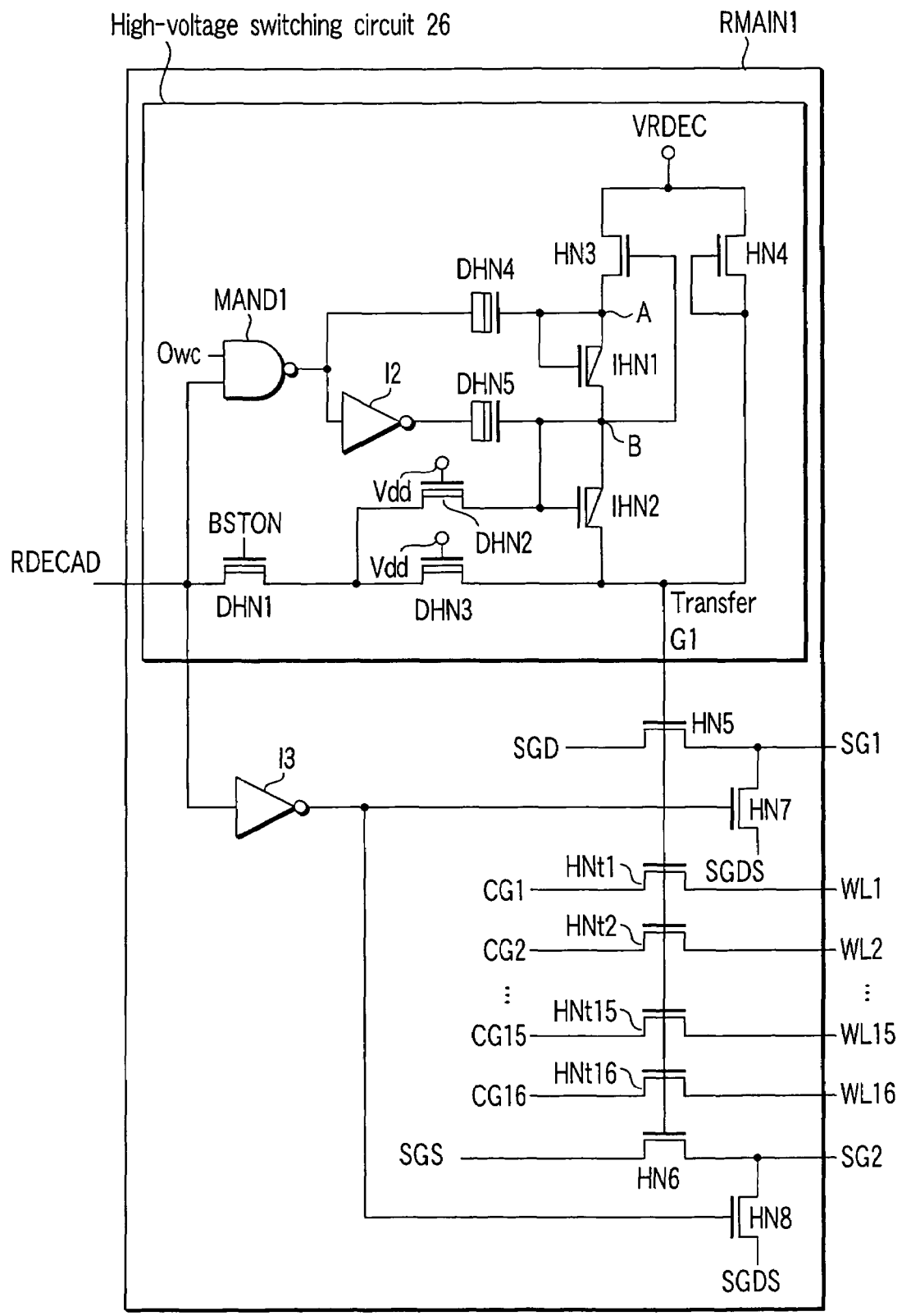
F I G. 26

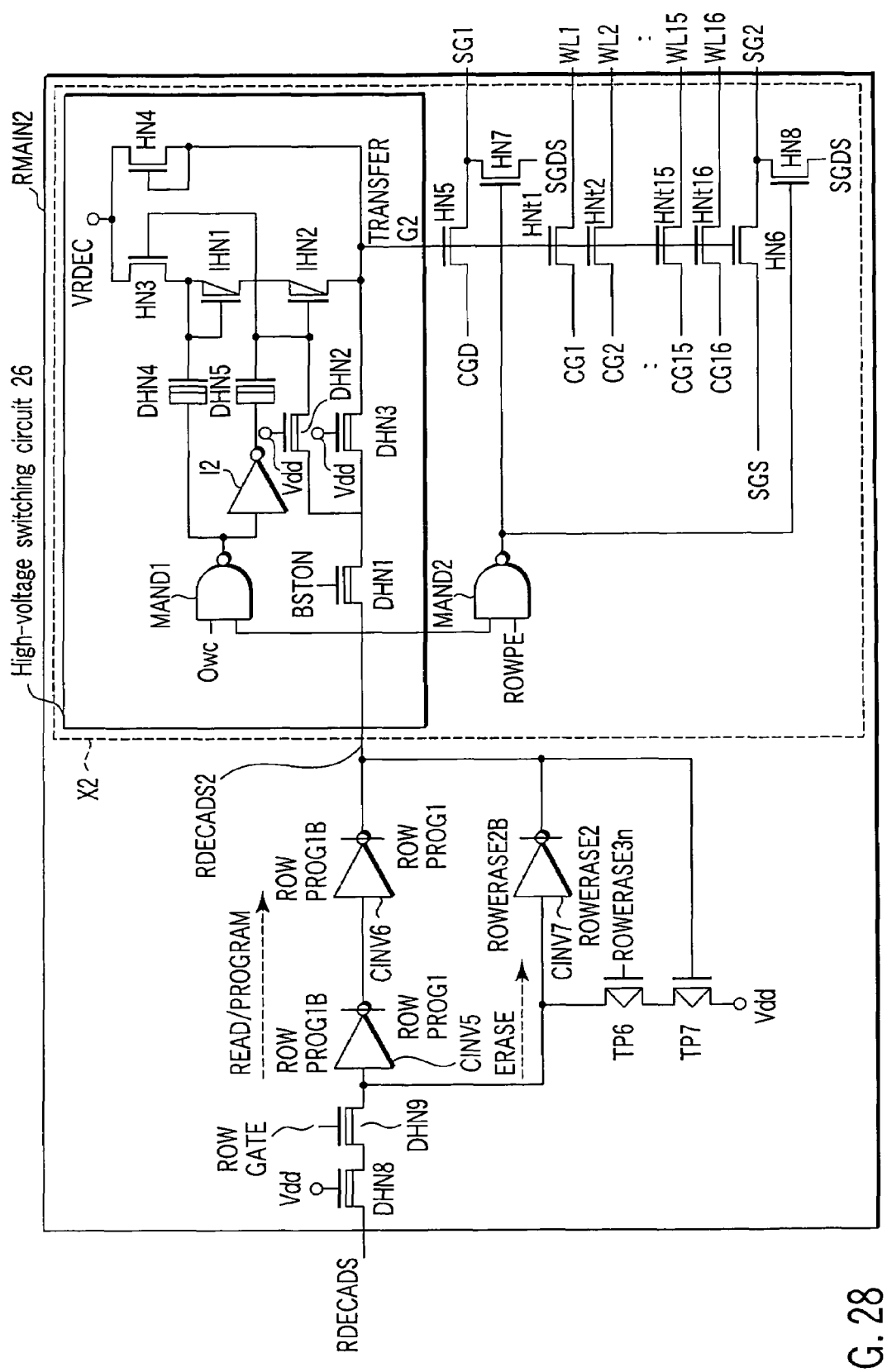
F I G. 28

Program of logical lower-level page

Before writing into memory cell linked to odd bit line

After writing into memory cell linked to odd bit line

NONVOLATILE SEMICONDUCTOR MEMORY

CROSS-REFERENCE TO RELATED APPLICATIONS

This application is based upon and claims the benefit of priority from prior Japanese Patent Application No. 2004-074968, filed Mar. 16, 2004, the entire contents of which are incorporated herein by reference.

BACKGROUND OF THE INVENTION

1. Field of the Invention

The present invention relates to a nonvolatile semiconductor memory, and is particularly used for a multi-level NAND-structured flash memory.

2. Description of the Related Art

A flash memory changes the amount of electric charges stored in a floating gate electrode of a memory cell to vary its threshold value, and stores data. For example, "1" corresponds to the threshold value of the memory cell being negative, and "0" corresponds to the threshold value being positive (e.g., refer to Jpn. Pat. Appln. KOKAI Publication No. 10-177797).

Recently, in order to decrease the value per bit or to increase a storage capacity, so-called multi-level flash memories have been developed to store multiple bit data in one memory cell. When 2-bit data is stored in one memory cell, four threshold distributions of the memory cell exist in accordance with the quaternary data.

Consequently, it is generally desired that the shape of the threshold distribution of the memory cell be narrow and sharp in view of a decrease in a power supply voltage and manufacturing variability. However, in order to obtain such a narrow and sharp threshold distribution, it is necessary to give specific consideration, for example, to narrow a step-up width of the write potential Vpgm, resulting in an adverse effect such as a lower write speed.

On the other hand, for example, a highly accurate and highly reliable multi-level flash memory can be manufactured in some manufacturing techniques. In such a case, it is not necessary to obtain the narrow and sharp threshold distribution at the cost of the write speed.

Furthermore, if attention is focused on the memory cells in one chip, only some memory cells are less reliable, while other cells are highly reliable in some cases. In such a case, it is not preferable in terms of yield ratio improvement and cost reduction that the chip be considered defective become of some less reliable memory cells.

Therefore, if the chip itself has a function whereby it can freely decide the shape of threshold distribution depending on characteristics of the memory cells, or a function to produce shapes of threshold distribution which are different in highly reliable memory cells and less reliable memory cells, products that have conventionally been treated as defective products can be non-defective products, which is effective for the yield ratio improvement and cost reduction.

BRIEF SUMMARY OF THE INVENTION

A nonvolatile semiconductor memory according to an example of the present invention comprises: a memory cell array composed of a plurality of memory cells; an internal circuit which writes into the plurality of memory cells by use of one of a first mode in which a first threshold distribution can be obtained and a second mode in which a second threshold distribution different from the first threshold distribution can be obtained; and a threshold distribution control circuit which controls switchover between the first mode and the second mode.

BRIEF DESCRIPTION OF THE SEVERAL VIEWS OF THE DRAWING

FIG. 1 is a diagram showing main parts of a flash memory according to an example the present invention;

FIG. 11 is a diagram showing a mode decision example 5;
FIG. 12 is a diagram showing a flow from the mode decision to a mode switch;
FIG. 13 is a diagram showing a mode switch example 1;
FIG. 21 is a circuit diagram showing an example of a batch detection circuit;
FIG. 23 is a diagram showing an example of the data circuit;
FIG. 26 is a diagram showing a circuit example of RMAIN1 of FIG. 24;
FIG. 28 is a diagram showing a circuit example of RMAIN2 of FIG. 24.

DETAILED DESCRIPTION OF THE INVENTION

Figure 2:
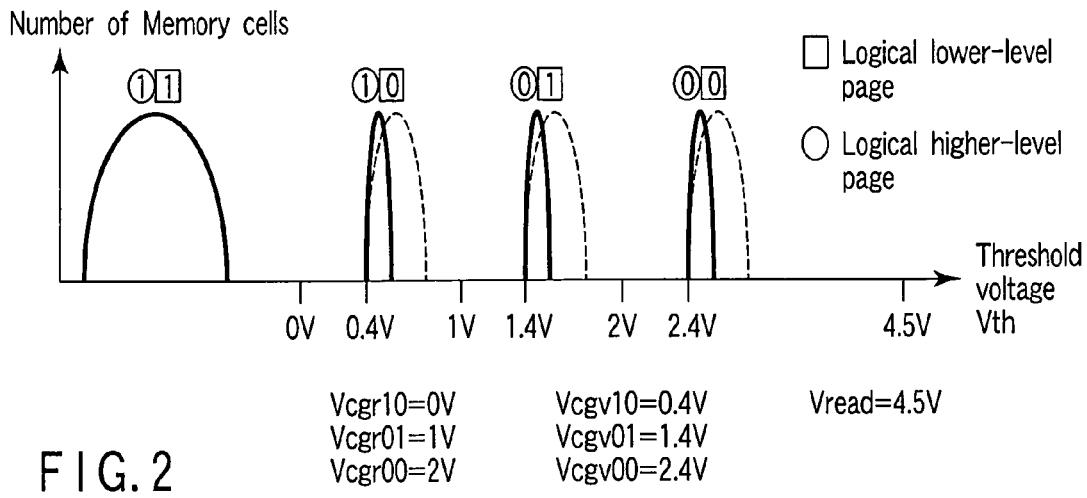
FIG. 2 is a diagram showing a first example of threshold distribution control.

A nonvolatile semiconductor memory of an aspect of the present invention will be described below in detail with reference to the accompanying drawing.

1. Outline

In examples of the present invention, firstly, a chip itself has a function whereby it can freely set a shape of threshold distribution depending on characteristics of memory cells.

It is generally desired that the shape of the threshold distribution of the memory cell be narrow and sharp in view of a decrease in a power supply voltage and manufacturing variability. However, in order to obtain such a threshold distribution, it is necessary to give specific consideration, for example, to narrow a step-up width of a write potential Vpgm, resulting in an adverse effect such as a lower write speed.

Therefore, in the examples of the present invention, the chip is provided with an internal circuit which writes into a memory cell using one of a first mode in which a first threshold distribution can be obtained and a second mode in which a second threshold distribution can be obtained; and a threshold distribution control circuit which controls switchover between the first mode and the second mode.

Furthermore, for example, when a highly accurate and highly reliable multi-level flash memory can be manufactured by an advanced manufacturing technique, the threshold distribution control circuit selects the first mode to increase a write speed. When the narrow and sharp threshold distribution needs to be obtained, the threshold distribution control circuit selects the second mode.

In the examples of the present invention, secondly, the chip itself has a function to produce different shapes of threshold distribution in highly reliable memory cells and less reliable memory cells.

If attention is focused on the memory cells in one chip, only some memory cells are less reliable, while other cells can assure high reliability in some cases. In such a case, it is not preferable in terms of yield ratio improvement and cost reduction that the chip be considered defective become of some less reliable memory cells.

Therefore, in the examples of the present invention, the chip is provided with an internal circuit which writes into the highly reliable memory cells using a first mode in which a first threshold distribution can be obtained, and writes into the less reliable memory cells using a second mode in which a second threshold distribution can be obtained; and a threshold distribution control circuit which controls switchover between the first mode and the second mode.

In addition, the memory cells can be divided in association with the reliability in units of word line, block or sub-cell array.

2. Circuit Example

Circuit examples of the flash memory according to an example of the present invention will be specifically described below.

(1) Overall View

FIG. 1 shows main parts of a NAND-structured flash memory according to an example of the present invention.

A memory cell array 1 has, for example, a NAND cell unit composed of a plurality of memory cells connected in series, and two select transistors connected to both ends thereof. The circuit examples and structure examples of the memory cell array 1 will be described later.

A data circuit 2 has a plurality of storage circuits (including page buffers). Circuit examples of the data circuit 2 will be described later. Here, a function of the data circuit 2 will be simply described.

The data circuit 2 temporarily stores 2-bit (quaternary) write data during writing, and 2-bit (quaternary) read data during reading. Accordingly, at least two storage circuits are provided for one bit line connected to a selected memory cell targeted for a write/read operation. One of the two storage circuits stores logical lower-level page data, and the other stores logical higher-level page data.

A word line control circuit 3 includes a row address decoder and a word line driver. The word line control circuit 3 controls potentials of a plurality of word lines in the memory cell array 1, on the basis of an operation mode (such as write, erase or read) and an address designated by a row address signal. Circuit examples of the word line control circuit 3 will be described later.

A column decoder 4 selects a column of the memory cell array 1 on the basis of a column address signal.

During writing, the write data is input into the storage circuit in the data circuit 2 belonging to the selected column, via a data I/O buffer 7 and an I/O sense amplifier 6. During reading, the read data is temporarily stored in the storage circuit in the data circuit 2 belonging to the selected column, and then output to the outside of a memory chip 11 via the I/O sense amplifier 6 and the data I/O buffer 7.

The row address signal is input to the word line control circuit 3 via an address buffer 5. The column address signal is input to the column decoder 4 via the address buffer 5.

A well/source line potential control circuit 8 controls potentials of a plurality of well areas (e.g., a double well area composed of an n-well and a p-well) corresponding to a plurality of blocks that constitute the memory cell array 1, and a potential of a source line, on the basis of the operation mode (such as write, erase or read).

A potential generating circuit (booster circuit) 9A, for example, generates a write potential (e.g., about 20 V) Vpgm and a transfer potential (e.g., about 10 V) Vpass during writing. The potentials Vpgm and Vpass are allocated by a switch circuit 9B, for example, to a plurality of word lines in the selected block among a plurality of blocks that constitute the memory cell array 1.

Furthermore, the potential generating circuit 9A generates, for example, an erase potential (e.g., about 20 V) Vera during erasing, and this potential Vera is given to one or two or more well areas (both the n-well and p-well) corresponding to one or two or more selected blocks among a plurality of blocks that constitute the memory cell array 1.

A threshold distribution control circuit (mode switching circuit) 23 controls switchover between a first mode in which a first threshold distribution can be obtained and a second mode in which a second threshold distribution can be obtained, in writing into the memory cells in the memory cell array 1.

Here, the second threshold distribution is narrower and sharper than the first threshold distribution. For example, the first mode is selected by the threshold distribution control circuit for a chip in which the write speed is given priority, while the second mode is selected by the threshold distribution control circuit for a chip in which the narrow and sharp threshold distribution needs to be obtained.

Furthermore, in one chip, writing can be performed in the first mode for the highly reliable memory cells, while writing can be performed in the second mode for the less reliable memory cells.

For example, as shown in FIG. 2, if a first write potential having a first step-up width (e.g., 0.2 V) is used to write into the memory cells when the first mode is selected, high-speed writing can be achieved, but the width of threshold distribution of the memory cell is large as indicated by broken lines.

On the contrary, if a second write potential having a second step-up width (e.g., 0.05 V) smaller than the first step-up width is used to write into the memory cells when the second mode is selected, the write speed is reduced, but the width of threshold distribution of the memory cell is small and sharp as indicated by full lines.

Figure 3:
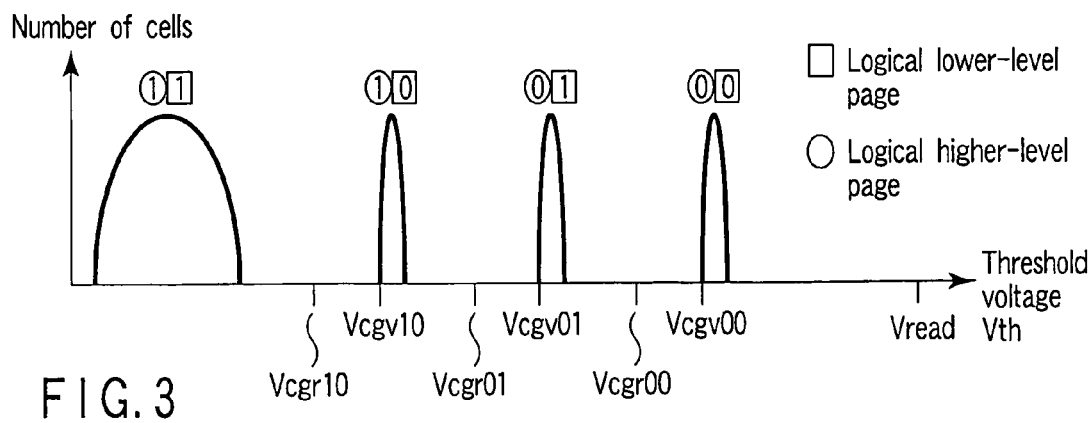
FIG. 3 is a diagram showing a second example of threshold distribution control.

Furthermore, as shown in FIG. 3, read potential values Vcgr10, Vcgr01 and Vcgr00, or verification read potential values Vcgv10, Vcgv01 and Vcgv00 may be variable in the first mode and second mode.

Table 1 shows an example in which the read potential values Vcgr10, Vcgr01 and Vcgr00, the verification read potential values Vcgv10, Vcgv01 and Vcgv00, or a value Vread of the transfer potential during reading are changed in accordance with the mode, so that the different threshold distribution can be obtained in accordance with the mode.

TABLE 1

|  |  | First mode | Second mode | Third mode | ... |
|---|---|---|---|---|---|
| Read potential | Vcgr10 | 0 V | 0 V | ... | ... |
|  | Vcgr01 | 1 V | 0.5 V |  |  |
|  | Vcgr00 | 2 V | 1 V |  |  |
| Verification read | Vcgv10 | 0.4 V | 0.2 V | ... | ... |
|  | Vcgv01 | 1.4 V | 0.7 V |  |  |

TABLE 1-continued

|  |  | First mode | Second mode | Third mode | ... |
|---|---|---|---|---|---|
| potential | Vcgv00 | 2.4 V | 1.2 V |  |  |
| Transfer potential during read | Vread | 4.5 V | 3 V | ... | ... |

The number of modes is not limited to two, but may be three or more. Moreover, the read potential values Vcgr10, Vcgr01 and Vcgr00, the verification read potential values Vcgv10, Vcgv01 and Vcgv00, or the value Vread of the transfer potential during reading may all be changed in accordance with the mode as shown in Table 1, or only one of them may be changed.

A batch detection circuit 10 verifies whether or not predetermined data is accurately written into the memory cells during writing, and verifies whether or not the data in the memory cell is properly erased during erasing.

A command interface circuit 12 judges whether or not data input to the data I/O buffer 7 is command data provided from a host microcomputer, on the basis of a control signal generated by a chip (e.g., host microcomputer) which is different from the memory chip 11. If the data input to the data I/O buffer 7 is the command data, the command interface circuit 12 transfers the command data to a state machine (control circuit) 13.

The state machine 13 decides the operation mode (such as write, erase or read) of the flash memory on the basis of the command data, and on the basis of the operation mode, controls the entire operation of the flash memory, more specifically, the operation of the data circuit 2, the word line control circuit 3, the column decoder 4, the address buffer 5, the I/O sense amplifier 6, the data I/O buffer 7, the well/source line potential control circuit 8, the potential generating circuit 9A, the switch circuit 9B, and the batch detection circuit 10.

(2) Example of Mode Selection

Figure 4:
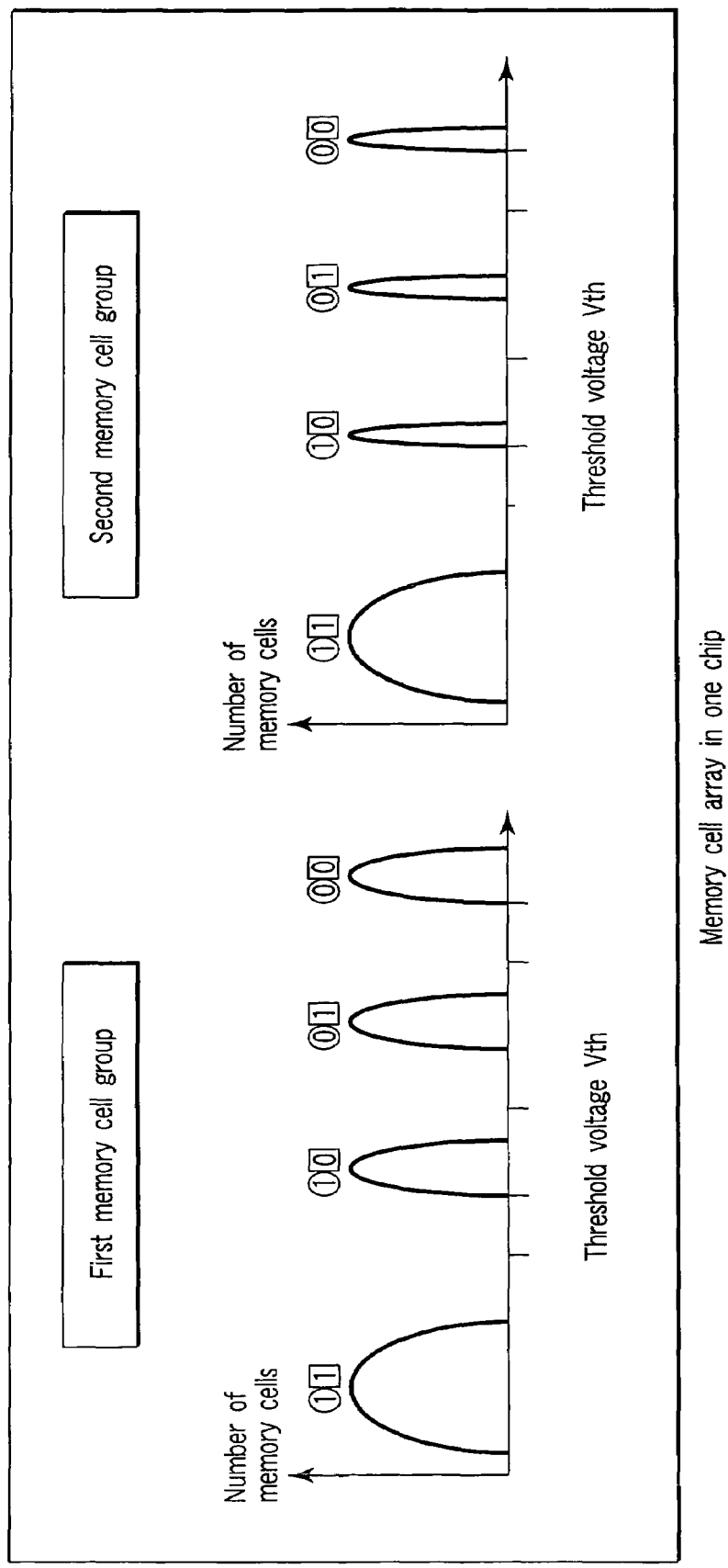
FIG. 4 is a diagram showing an example of forming memory cell groups having different threshold distributions in a chip.

In the examples of the present invention, the memory cell array in one chip is divided into a highly reliable first memory cell group and a less reliable second memory cell group, for example, as shown in FIG. 4. Further, writing is performed in the first mode and a threshold distribution as shown in FIG. 4 is achieved for the first memory cell group, while writing is performed in the second mode and a threshold distribution as shown in FIG. 4 is achieved for the second cell memory group.

Here, the first memory cell group and the second cell memory group can be separated in units of sub-cell array or block.

Figure 5:
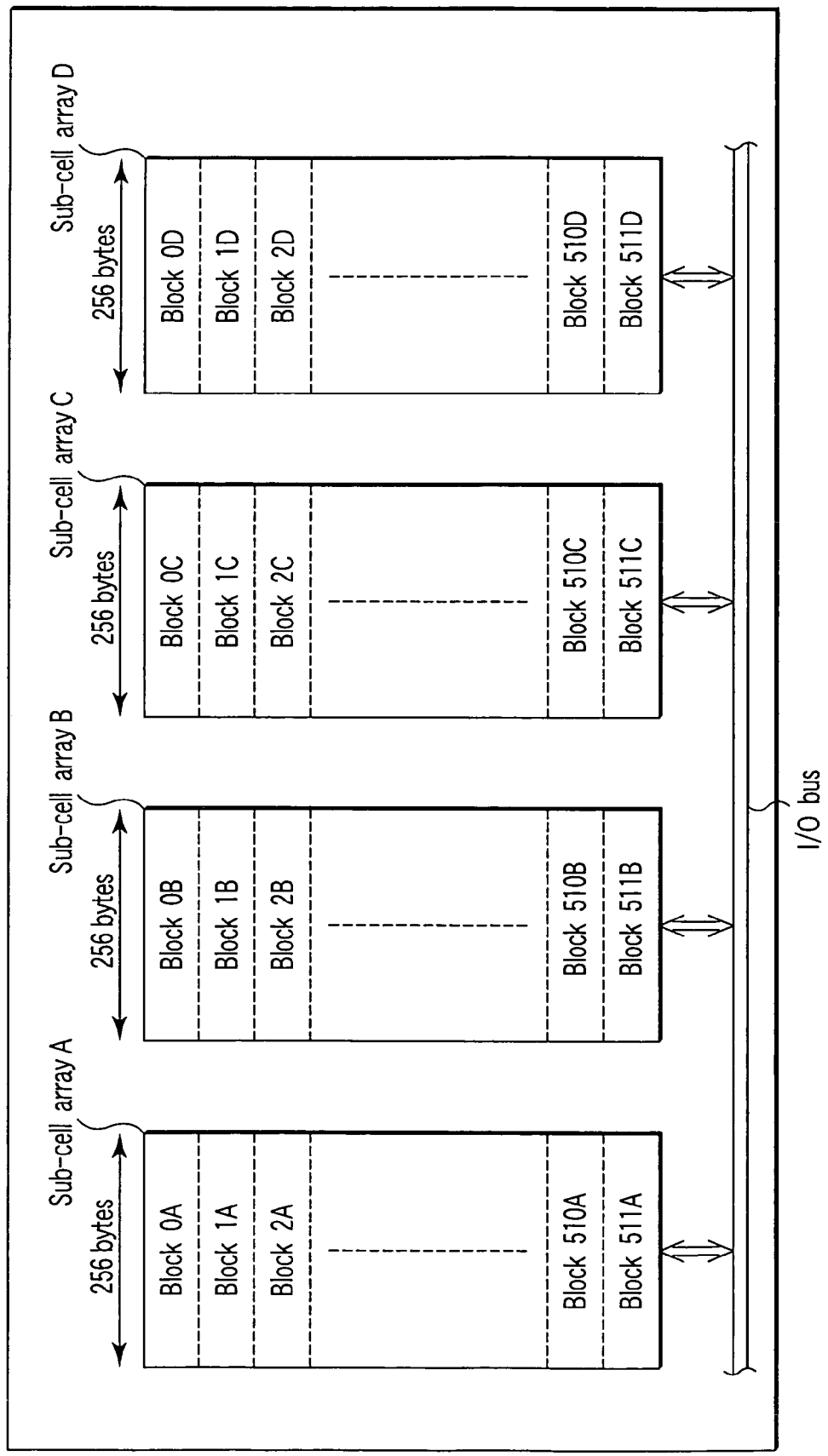
FIG. 5 is a diagram showing an example of forming the memory cell groups having different threshold distributions in the chip.

For example, if sub-arrays B and C are the first memory cell group and sub-arrays A and D are the second cell memory group as shown in FIG. 5, writing can be performed in the first mode for the sub-arrays B and C, and writing can be performed in the second mode for the sub-arrays A and D.

Furthermore, if blocks 1A to 510A in the sub-array A are the first memory cell group and blocks 0A and 511A in the sub-array A are the second cell memory group, writing can be performed in the first mode for the memory cells of the blocks 1A to 510A, while writing can be performed in the second mode for the blocks 0A and 511A.

Figure 6:
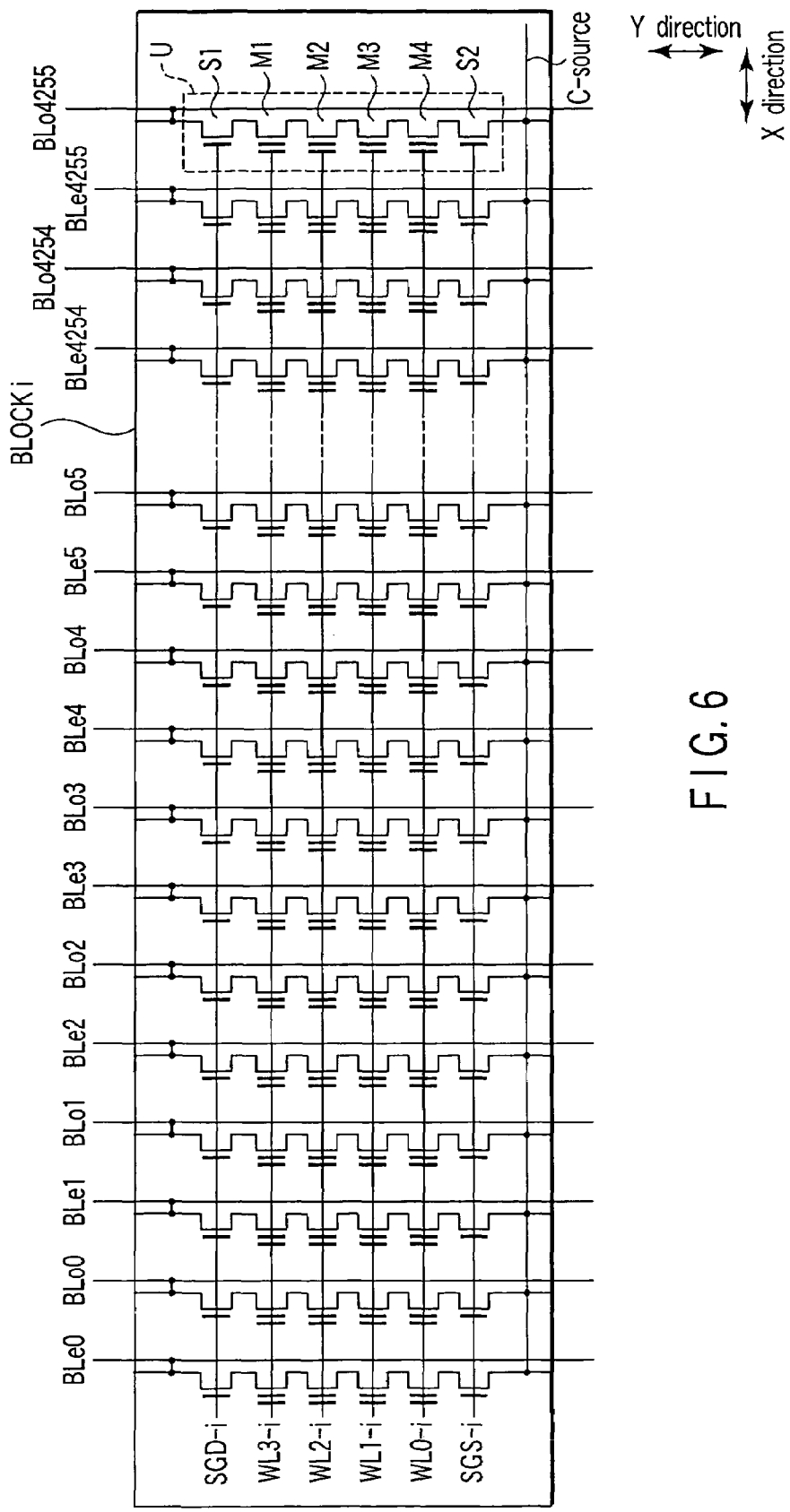
FIG. 6 is a diagram showing an example of forming the memory cell groups having different threshold distributions in the chip.

Still further, as shown in FIG. 6, the memory cells connected to word lines WL1-i and WL2-i are the first memory cell group and the memory cells connected to word lines WL0-i and WL3-i are the second cell memory group, writing can be performed in the first mode for the memory cells connected to the word lines WL1-i and WL2-i, while writing can be performed in the second mode for the memory cells connected to the word lines WL0-i and WL3-i.

Generally, in the flash memory, the word lines WL0-i and WL3-i close to select gate lines SGS-i and SGD-i are thin due to manufacturing variability, and the memory cells connected to them have lower reliability, so that these memory cells achieve the narrow and sharp threshold distribution by reducing the step-up width of the write potential Vpgm or setting the low verification read potential in the second mode.

On the contrary, the other memory cells achieve high-speed writing by increasing the step-up width of the write potential Vpgm or setting the high verification read potential in the first mode.

(3) Mode Decision Example

A mode decision, that is, a circuit for selecting one of the first mode in which the first threshold distribution is obtained and the second mode in which the second threshold distribution is obtained will be described.

[1] EXAMPLE 1

Figure 7:
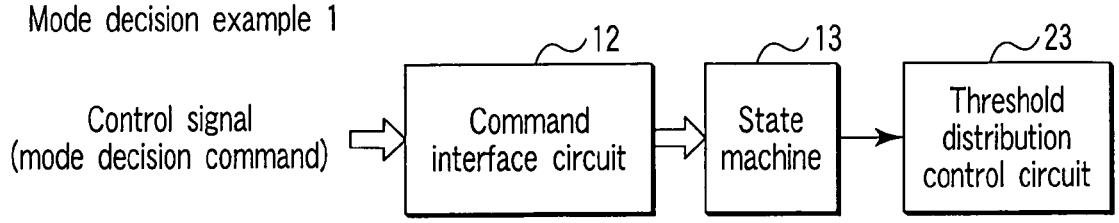
FIG. 7 is a diagram showing a mode decision example 1.

FIG. 7 shows a mode decision example 1.

In this example, the mode is decided on the basis of a control signal (command) from a chip which is different from the flash memory chip, for example, a microprocessor.

The control signal is input to the state machine 13 via the command interface circuit 12. The state machine 13 decodes the control signal, and gives a result thereof to the threshold distribution control circuit 23. For example, when the control signal indicates the first mode, the threshold distribution control circuit 23 controls the internal circuit to write in the first mode, and controls the internal circuit to write in the second mode when the control signal indicates the second mode.

[2] EXAMPLE 2 to EXAMPLE 4

Figure 8:
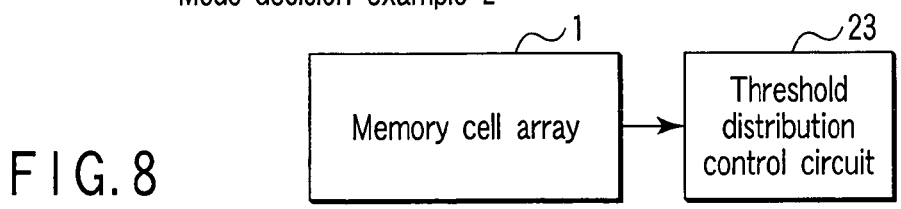
FIG. 8 is a diagram showing a mode decision example 2.
Figure 9:
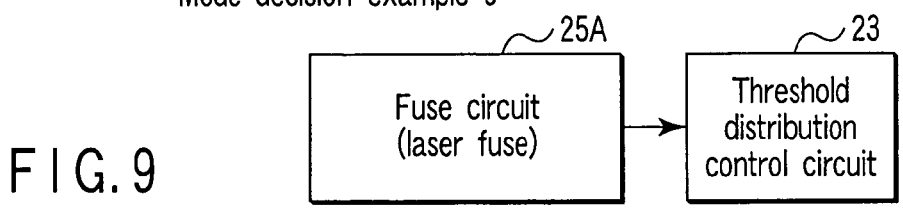
FIG. 9 is a diagram showing a mode decision example 3.
Figure 10:
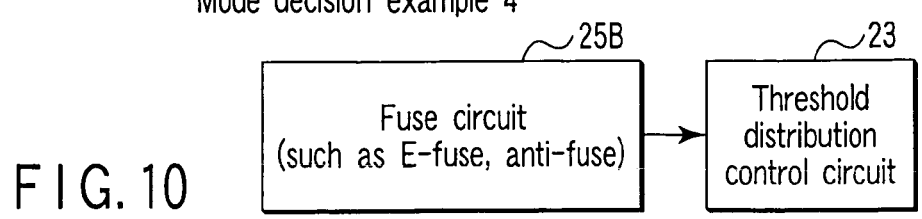
FIG. 10 is a diagram showing a mode decision example 4.

FIGS. 8 to 10 show mode decision examples 2 to b 4.

In these examples, the mode is decided on the basis of data stored in a memory element in the flash memory chip.

In an example of FIG. 8, part of the memory cell array 1 is used as the memory element. In other words, data for the mode decision is previously stored in the part of the memory cell array 1, and the data is supplied to the threshold distribution control circuit 23.

In an example of FIG. 9, a fuse circuit (laser fuse) 25A is used as the memory element. In this case, the mode is decided during a wafer process.

On the contrary, in an example of FIG. 10, a fuse circuit (such as electrically writable E-fuse, anti-fuse) 25B is used as the memory element. In this case, the mode can be decided not only during the wafer process, but also after an assembly process or after a packaging process.

[3] EXAMPLE 5

FIG. 11 shows a mode decision example 5.

In this example, the mode is decided by inputting the control signal from the outside of the flash memory chip directly into the threshold distribution control circuit 23.

The control signal includes a signal whose value is fixed (such as a power supply voltage Vdd, Vss) during the wafer process or during chip bonding in addition to the signal from the different chip (such as the microprocessor).

(4) Mode Switch Example

In the examples of the present invention, after the memory cell array is tested (step S1), the memory cell array is divided into a plurality of memory cell groups, for example, as shown in FIG. 12. Further, the mode is decided for each memory cell group (step S2), and then the mode is switched for each memory cell group during writing (step S3).

Here, for example, the step-up width of the write potential Vpgm, or the value of the read potential or the verification read potential is made variable as described above, whereby the mode can be switched.

FIG. 13 shows an example of a circuit which makes the step-up width of the write potential variable to control the shape of threshold distribution.

A reference potential Vref (1 V) is generated by, for example, a band gap reference circuit. In this circuit example, a resistance value of a variable resistor can be changed to change a value of a step-up voltage. Therefore, a variation of the resistance value of the variable resistor can be controlled to control the step-up width of the write potential.

Figure 14:
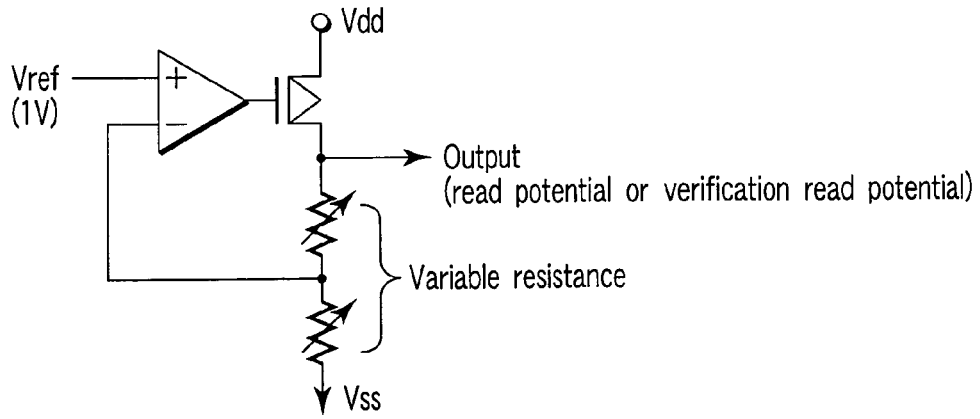
FIG. 14 is a diagram showing a mode switch example 2.

FIG. 14 shows an example of a circuit which makes the value of the read potential or the verification read potential variable to control the shape of threshold distribution.

The reference potential Vref (1 V) is generated by, for example, the band gap reference circuit. Also in this circuit example, the resistance value of the variable resistor can be changed to change a value of an output potential. Therefore, if this output potential is used as the read potential or the verification read potential, the shape of threshold distribution can be controlled.

(5) Example of Memory Cell Array Configuration

Figure 15:
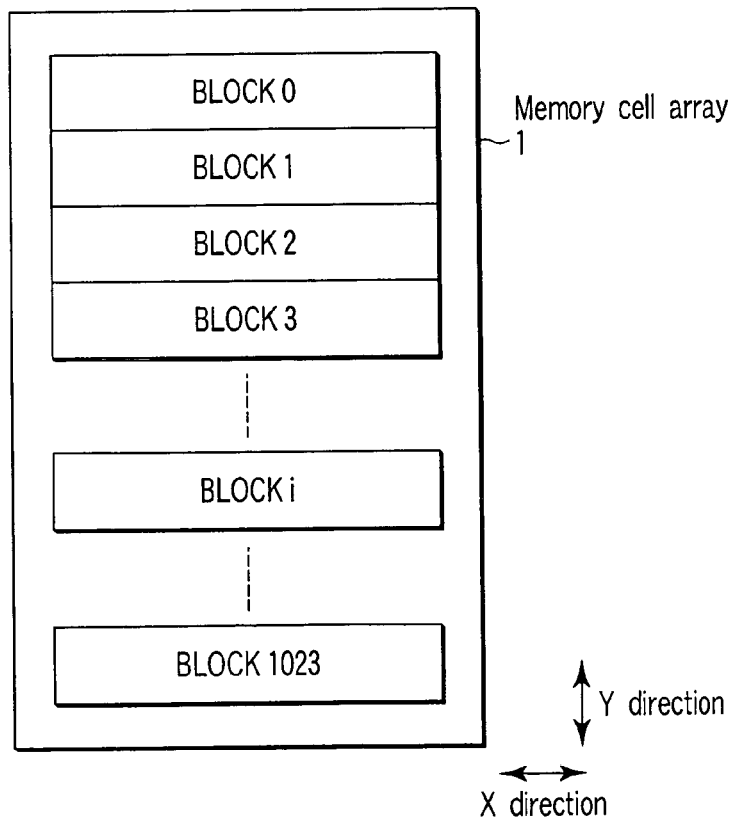
FIG. 15 is a diagram showing an example of a memory cell array.
Figure 16:
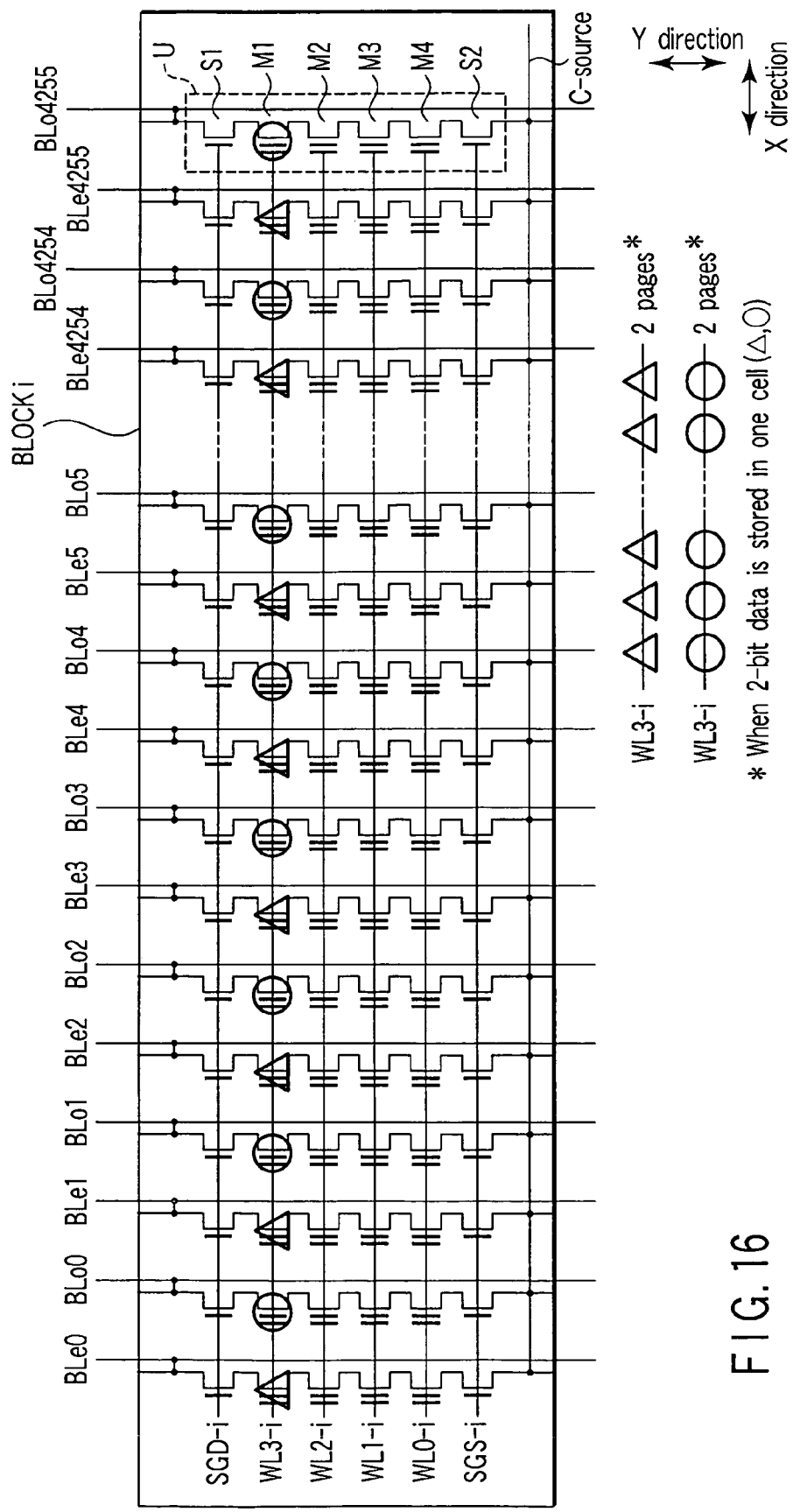
FIG. 16 is a diagram showing an example of the memory cell array.

FIG. 15 shows an example of a memory array configuration. FIG. 16 shows one block BLOCKi among a plurality of blocks shown in FIG. 15.

The memory cell array 1 is composed of a plurality (1024 in the present example) of blocks BLOCK0 to BLOCK1023. The plurality of blocks BLOCK0 to BLOCK1023 are arranged in a Y direction. The block means a minimum unit during erasing, that is, the minimum number of memory cells from which data can be erased at a time.

The one block BLOCKi is composed of a plurality (8512 in the present example) of NAND cell units U arranged in an X direction. One NAND cell unit U is constituted of a NAND string including four memory cells M1, M2, M3 and M4 connected in series, a select gate transistor S1 connected to one end of the NAND string, and a select gate transistor S2 connected to the other end of the NAND string.

In the present example, the NAND string is comprised of the four memory cells M1, M2, M3 and M4, but the NAND string may be comprised of one or two or more memory cells, and is not particularly limited to four memory cells.

The select gate transistor S1 is connected to a bit line BLek or a bit line BLok (k=0, 1 . . . 4255), and the select gate transistor S2 is connected to a common source line C-source.

The word lines (control gate lines) WL0-i, WL1-i, WL2-i and WL3-i extend in the X direction, and are commonly connected to a plurality of memory cells in the X direction. The select gate line SGD-i extends in the X direction, and is commonly connected to the plurality of select gate transistors S1 in the X direction. The select gate line SGS-i also extends in the X direction, and is commonly connected to the plurality of select gate transistors S2 in the X direction.

In the present example, in the write/read operation, a plurality of even bit lines BLe0, BLe1, . . . BLe4255 from one end of the block BLOCKi, and a plurality of odd bit lines BLo0, BLo1, . . . BLo4255 (ODD) from one end thereof are driven independently from each other. However, the bit lines are counted from 0.

In other words, the write/read operation is performed simultaneously for 4256 memory cells (indicated by triangles) connected to the plurality of even bit lines BLe0, BLe1, ... BLe4255, among 8512 memory cells connected to one word line, for example, the word line WL3-i. Further, the write/read operation is performed simultaneously for 4256 memory cells (indicated by circles) connected to the plurality of odd bit lines BLo0, BLo1, ... BLo4255, among the 8512 memory cells connected the word line WL3-i.

When one memory cell stores 1-bit data, 4256 memory cells (indicated by triangles) located at an intersection of one word line, for example, the word line WL3-i and the plurality of even bit lines BLe0, BLe1, ... BLe4255 constitute a unit called a page. In the same manner, 4256 memory cells (indicated by circles) located at an intersection of the word line WL3-i and the plurality of odd bit lines BLo0, BLo0, ... BLo4255 also constitute a unit called the page.

Furthermore, when one memory cell stores 2-bit data as in the present example, the 4256 memory cells (indicated by triangles) store data of two pages, and the 4256 memory cells (indicated by triangles) also store data of two pages.

(6) Example of Device Configuration

[1] Example of Well Configuration

Figure 17:
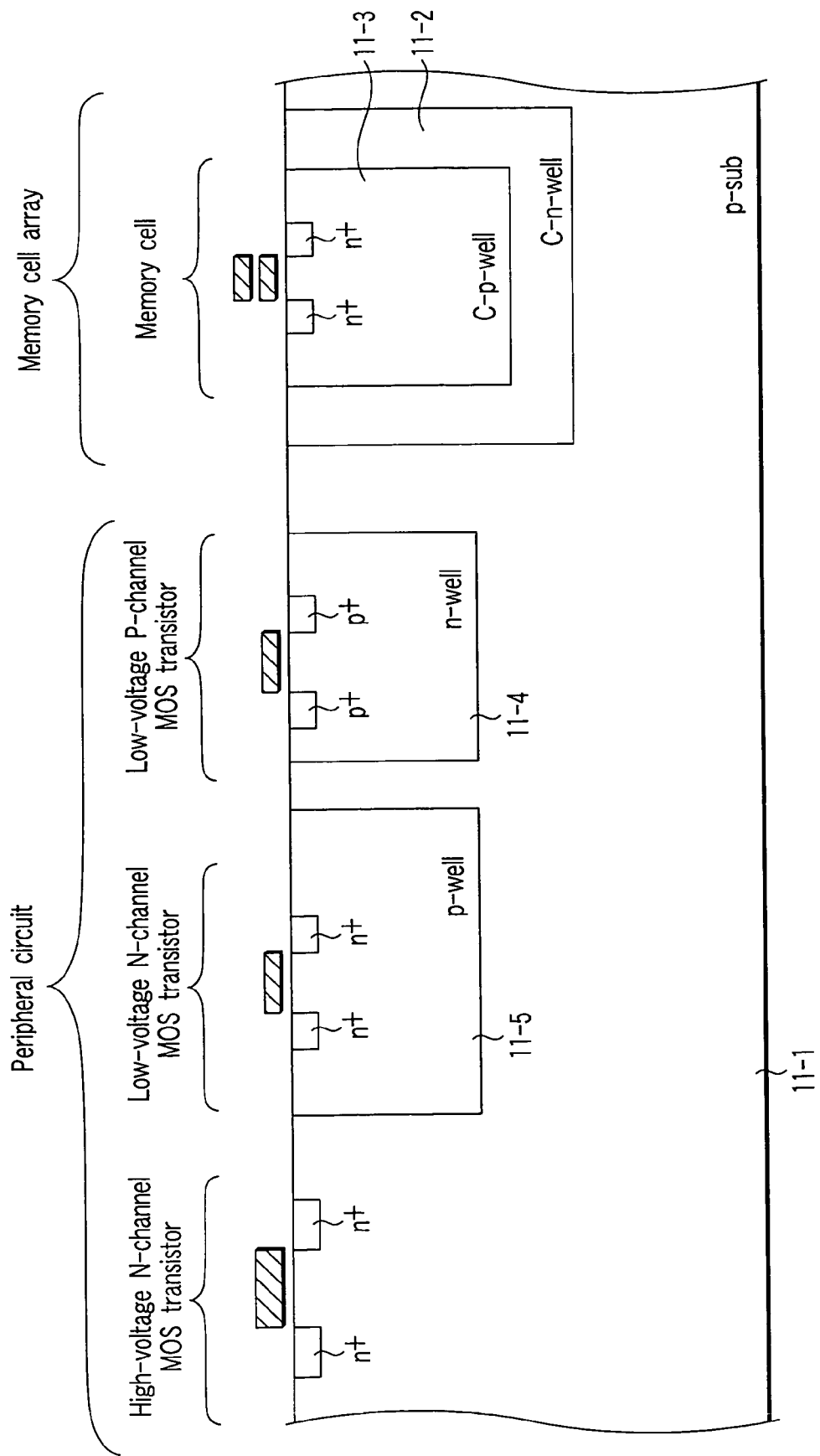
FIG. 17 is a sectional view showing an example of a device structure.

FIG. 17 shows an example of a well configuration of a NAND cell type flash memory.

In a p-type silicon substrate (p-sub) 11-1, there are formed a so-called double well area composed of an n-type well area (C-n-well) 11-2 and a p-type well area (C-p-well) 11-3; an n-type well area (n-well) 11-4; and a p-type well area (p-well) 11-5.

The double well area is formed in a memory cell array section, and the n-type well area 11-4 and the p-type well area 11-5 are formed in a peripheral circuit section.

The memory cell includes an N-channel MOS transistor, and is disposed in the p-type well area 11-3. The n-type well area 11-2 and the p-type well area 11-3 are set at the same potential.

A high voltage N-channel MOS transistor to which a voltage higher than the power supply voltage is applied is formed in a p-type silicon substrate (p-sub) 11-1. A low voltage P-channel MOS transistor to which the power supply voltage is applied is formed in the n-type well area (n-well) 11-4, and a low voltage N-channel MOS transistor to which the power supply voltage is applied is formed in the p-type well area (p-well) 11-5.

[2] Example of Cell Array Configuration

Figure 18:
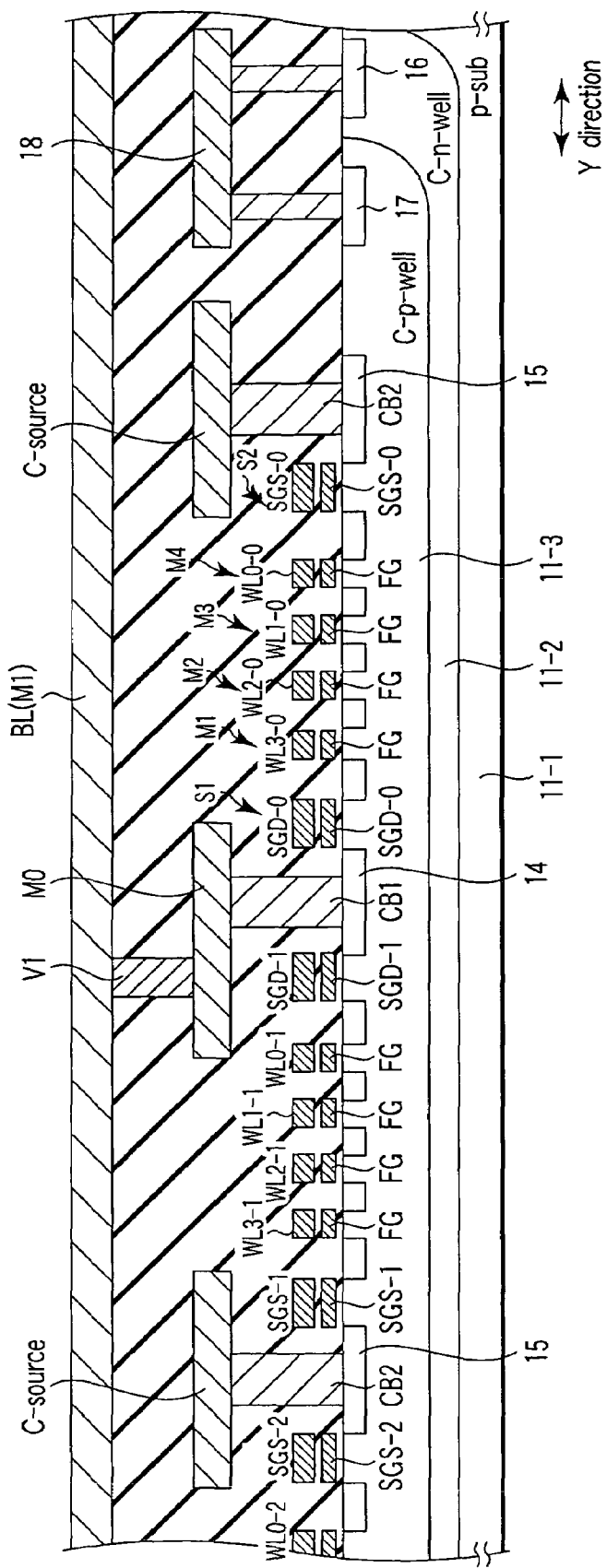
FIG. 18 is a sectional view showing an example of the device structure.

FIG. 18 shows an example of a Y-direction sectional configuration of the memory cell array section of the NAND cell type flash memory.

The double well area composed of the n-type well area 11-2 and the p-type well area 11-3 is formed in the p-type silicon substrate 11-1.

The four memory cells M1, M2, M3 and M4 connected in series are disposed in the p-type well area 11-3. The four memory cells M1, M2, M3 and M4 include N-channel MOS transistors, and has a stack gate configuration comprised of a floating gate electrode FG and control gate electrodes WL0-i, WL1-i, WL2-i and WL3-i.

The select gate transistor S1 is connected to one end of the NAND string comprised of the serially connected four memory cells M1, M2, M3 and M4, and the select gate transistor S2 is connected to the other end thereof. The select gate transistors S1 and S2 include the N-channel MOS transistors, and have a configuration approximate to the memory cells M1, M2, M3 and M4, that is, the double-structured select gate lines SGS-i and SGD-i.

One end of the NAND cell unit, that is, a diffused layer (drain diffused layer) 14 of the select gate transistor S1 is connected to a first metal wiring layer M0 through a contact plug CB1. Further, the first metal wiring layer M0 is connected to a second metal wiring layer M1 as a bit line BL through a via plug V1. The bit line BL is connected to the data circuit.

The other end of the NAND cell unit, that is, a diffused layer (source diffused layer) 15 of the select gate transistor S2 is connected to the first metal wiring layer M0 as a common source line C-source through a contact plug CB2. The common source line C-source is connected to a source potential control circuit.

The n-type well area (C-n-well) 11-2 is connected to a C-p-well potential setting line 18 through an n-type diffused layer 16, and the p-type well area (C-p-well) 11-3 is connected to the C-p-well potential setting line 18 through a p-type diffused layer 17. In other words, the n-type well area 11-2 and the p-type well area 11-3 are set at the same potential. The C-p-well potential setting line 18 is connected to a well potential control circuit.

In addition, the floating gate electrode FG, the control gate electrodes WL0-i, WL1-i, WL2-i and WL3-i, and the select gate lines SGS-i and SGD-i are made of, for example, conductive polysilicon containing impurities. Moreover, the first and second metal wiring layers M0 and M1 are made of, for example, aluminum, copper or an alloy of these metals.

Figure 19:
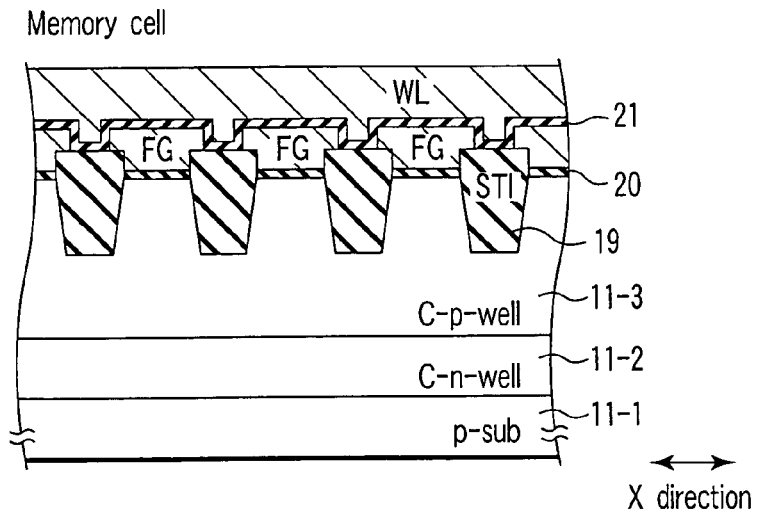
FIG. 19 is a sectional view showing an example of the device structure.
Figure 20:
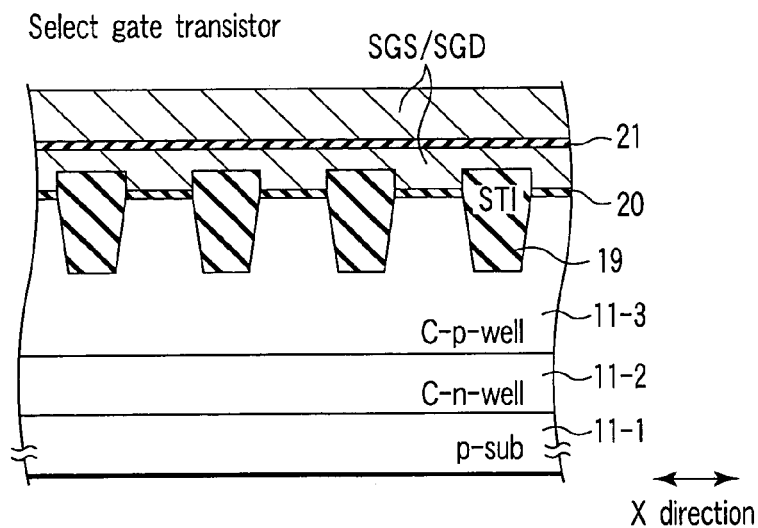
FIG. 20 is a sectional view showing an example of the device structure.

FIG. 19 shows an example of an X-direction sectional configuration of the memory cell, and FIG. 20 shows an example of an X-direction sectional configuration of the select gate transistor.

A Dlurality of memory cells (FG+WL) in the X direction is electrically separated from each other by an element separation layer 19 having an STI (shallow trench isolation) configuration. The floating gate electrode FG is disposed on the p-type well area 11-3 via a very thin tunnel oxide film 20. The control gate electrode WL is disposed on the floating gate electrode FG via an ONO (oxide/nitride/oxide) film 21.

The select gate line SGS/SGD has a double-structure. The lower select gate line SGS/SGD and the upper select gate line SGS/SGD are electrically connected to each other at the end of the memory cell array, and also in the memory cell array, are electrically connected to each other at certain intervals, for example, every 512 bit lines.

(7) Example of Configuration of Batch Detection Circuit

FIG. 21 shows an example of configuration of the batch detection circuit.

The batch detection circuit 10 has a function (completion detection) to check whether or not writing or erasing has been properly performed in all the selected memory cells after a verification reading (completion detection).

As has also been described in connection with the configuration example of the memory cell, the present example is based on the premise that, in the write/read operation, the plurality of even bit lines and the plurality of odd bit lines are driven independently from each other. Therefore, one sub-data circuit is provided for two bit lines including one even bit line and one odd bit line.

More specifically, as the 8512 bit lines BLek, BLok (k=0, 1 ... 4255) are present, the data circuit 2 is composed of 4256 sub-data circuits. It is to be noted that configuration examples of the sub-data circuits in the data circuit 2 will be described later.

In the present example, only 8 sub-data circuits REGR1-0, REGR1-1, REGR1-2, REGR1-3, REGR2-0, REGR2-1, REGR2-2 and REGR2-3 among the 4256 sub-data circuits are shown.

A sub-data circuit REGR1-y is connected to two bit lines BLej+y and BLoj+y, and also connected to an I/O line pair IOj+y and nIOj+y. Further, a sub-data circuit REGR2-y is connected to two bit lines BLej+y+4 and BLoj+y+4, and also connected to an I/O line pair IOj+y+4 and nIOj+y+4. However, y=0, 1, 2, 3.

An output node RCD1 of the first to fourth sub-data circuits REGR1-0, REGR1-1, REGR1-2 and REGR1-3 is commonly connected, and the connection node RCD1 is connected to a gate of a P-channel MOS transistor TP2. In the same manner, an output node RCD2 of the fifth to eighth sub-data circuits REGR2-0, REGR2-1, REGR2-2 and REGR2-3 is commonly connected, and the connection node RCD2 is connected to a gate of a P-channel MOS transistor TP3.

P-channel MOS transistors TP13 and TP14 have a function to pre-charge the nodes RCD1 and RCD2 on the basis of a control signal COMHn at the completion detection. In other words, after the control signal COMHn is set to "L" to set the nodes RCD1 and RCD2 to the power supply voltage Vdd, the control signal COMHn is set to "L" to bring the nodes RCD1 and RCD2 into a floating state. At this moment, the P-channel MOS transistors TP2 and TP3 are in an off-state.

An N-channel MOS transistor TNI5 has a function to bring a node NCOM into a floating state at the completion detection after setting the node NCOM to the ground potential Vss. The MOS transistor TNI5 is controlled by a control signal NCOML.

At the completion detection, potential level of the common node RCD1 or the common node RCD2 is lowered from "H" to "L" for the sub-data circuits corresponding to the memory cells in which writing/erasing has not been adequately accomplished.

Therefore, if at least one memory cell is present in which writing/erasing has not been adequately accomplished, the P-channel MOS transistor TP2 or TP3 is in an on-state, and the node NCOM turns from "L" to "H", and then a FLAG turns to "L".

On the other hand, if the writing/erasing has been adequately accomplished in all the memory cells, all the sub-data circuits keep the potential level of the common nodes RCD1 and RCD2 at "H". Therefore, the node NCOM remains at "L", and the FLAG is "H".

In this way, it is possible to check whether or not the writing/erasing has been performed properly in all the selected memory cells by detecting the potential level of the FLAG.

In the present example, eight sub-data circuits are combined to one, and the completion detection, that is, the detection of the potential level of the FLAG is performed for each of the eight sub-data circuits.

The eight sub-data circuits are thus combined to one because the memory cells are replaced by a redundancy circuit in units of eight columns corresponding to the eight sub-data circuits. That is, if a fuse element is cut off, the memory cells connected to these eight sub-data circuits are always in an unselected state, and preliminary memory cells in a redundancy area are selected instead.

Therefore, if the memory cells are replaced by the redundancy circuit in units of n columns corresponding to n (n is a natural number) sub-data circuits, the n sub-data circuits are combined to one.

In addition, a FLAG is a common node adapted to all the columns. For example, when the data circuit 2 is composed of 4256 sub-data circuits, 532 circuits as shown in FIG. 21 are present in the chip if the eight sub-data circuits are one unit for redundancy replacement. These 532 circuits are connected to the common node FLAG.

(8) Example of Configuration of Data Circuit

Figure 22:
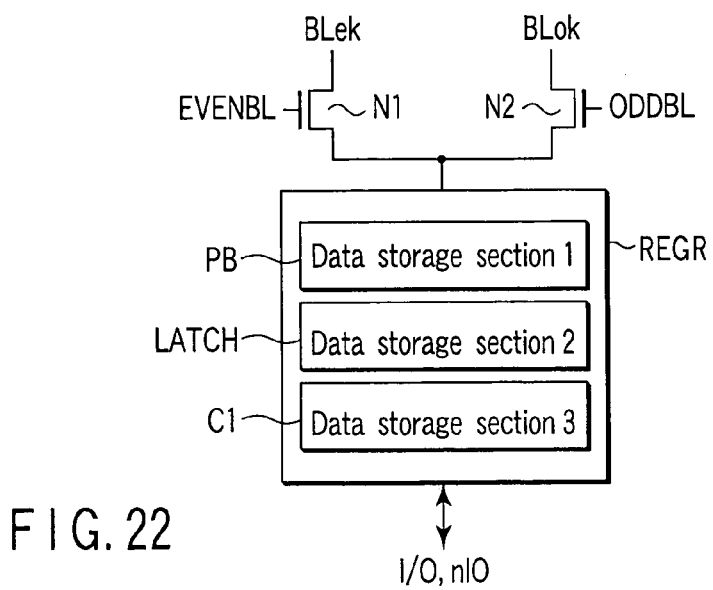
FIG. 22 is a diagram showing an example of a data circuit.

FIG. 22 shows a configuration example of the sub-data circuit in the data circuit.

In the present example, the data circuit is composed of a plurality (e.g., 4256) of sub-data circuits, and each sub-data circuit has a configuration shown in FIG. 22.

A sub-data circuit REGR has three data storage sections PB, LATCH and C1. The data storage sections PB, LATCH and C1 are used to perform a writing or read operation of 2-bit data in the selected one memory cell.

Furthermore, one sub-data circuit is provided for two bit lines including one even bit line and one odd bit line. The even bit line BLek is connected to the sub-data circuit REGR via an N-channel MOS transistor N1, and the one odd bit line BLok is connected to the sub-data circuit REGR via a via an N-channel MOS transistor N2.

Since the N-channel MOS transistor N1 is in an on-state when a control signal EVENBL is "H" and a control signal ODDBL is "L", the even bit line BLek is electrically connected to the sub-data circuit REGR. Further, since the N-channel MOS transistor N2 is in an on-state when the control signal EVENBL is "L" and the control signal ODDBL is "H", the odd bit line BLok is electrically connected to the sub-data circuit REGR.

In addition, the control signal EVENBL is commonly input to a gate of the MOS transistor N1 connected to the even bit line BLek, and the control signal ODDBL is commonly input to a gate of the MOS transistor N2 connected to the odd bit line BLok.

FIG. 23 shows an example of the sub-data circuit of FIG. 22.

In the present example, the sub-data circuit for one column (corresponding to the two bit lines BLek and BLok) is shown in a manner corresponding to FIG. 22.

The sub-data circuit REGR has the three data storage sections PB, LATCH and C1.

The data storage section C1 includes a depression type N-channel MOS capacitor. The data storage section LATCH includes a CMOS flip-flop circuit comprising two inverters, and the data storage section PB also includes a CMOS flip-flop circuit comprising two inverters. The data storage section PB corresponds to the page buffer.

The MOS capacitor C1 has one end connected to the bit lines BLek and BLok via an N-channel MOS transistor N5, and the N-channel MOS transistors N1 and N2, and the other end connected to the ground point Vss. The N-channel MOS transistor N5 is a transcript transistor to electrically connect/cut off the bit lines BLek and BLok and the sub-data circuit REGR.

The MOS transistor N5 is in an on-state when a control signal BLCLAMP is "H", and for example, the even bit line BLek is electrically connected to the one end of the MOS capacitor C1. At this point, the control signal EVENBL is set to "H ", and the control signal ODDBL is set to "L". Moreover, at this point, a control signal EVENBLCU is set to "L", and a control signal ODDBLCU is set to "H", and a bias potential (e.g., ground potential) BLCRL is supplied to the odd bit line BLok.

If the odd bit line BLok is electrically connected to the one end of the MOS capacitor C1, the control signal EVENBL is set to "L", and the control signal ODDBL is set to "H". Moreover, at this point, the control signal EVENBLCU is set to "H", and the control signal ODDBLCU is set to "L", and the bias potential (e.g., ground potential) BLCRL is supplied to the even bit line BLek.

Since the MOS transistor N5 is in an off-state when the control signal BLCLAMP is "L", the bit lines BLek and BLok and the sub-data circuit REGR are electrically cut off.

An N-channel MOS transistor N6 is connected to the one end of the MOS capacitor C1. The MOS transistor N6 is an element to charge the one end of the MOS capacitor C1 to a pre-charge potential VPRE. When a control signal BLPRE is "H", the one end of the MOS capacitor C1 is charged to the pre-charge potential VPRE.

An N-channel MOS transistor N8 is connected to the one end of the MOS capacitor C1 via an N-channel MOS transistor N7. When a control signal REG is "H", that is, when N-channel MOS transistor N7 is in an on-state, the MOS transistor N8 compulsorily turns the potential of the one end of the MOS capacitor C1 to VREG on the basis of a gate level (data value) thereof.

For example, when the gate level of the MOS transistor N8 is "H", that is, when the data value is "1", the one end of the MOS capacitor C1 is compulsorily set to VREG if the control signal REG is "H". Moreover, when the gate level of the MOS transistor N8 is "L", that is, when the data value is "0", the potential of the one end of the MOS capacitor C1 is not affected by VPRE.

The data storage sections LATCH and PB both include the CMOS flip-flop circuits, as described above.

An N-channel MOS transistor N10 as a switch element is connected between the data storage section C1 and the data storage section LATCH. The MOS transistor N10 is controlled by a control signal BLC1, and used to transfer data between the data storage section C1 and the data storage section LATCH.

An N-channel MOS transistor N9 as a switch element is connected between a gate of the MOS transistor N8 and the data storage section LATCH. The MOS transistor N9 is controlled by a control signal DTG, and used to transfer data stored in the data storage section LATCH to the gate of the MOS transistor N8.

An N-channel MOS transistor N11 as a switch element is connected between the data storage section C1 and the data storage section PB. The MOS transistor N11 is controlled by a control signal BLC2, and used to transfer data between the data storage section C1 and the data storage section PB.

An N-channel MOS transistor N15 is an element to reset data in the data storage section PB. For example, during writing, before the write data is input to the data storage section PB, the MOS transistor N15 sets the state of the data storage section PB into a state retaining "1", that is, sets a node NODE to a "H" state.

The data storage section PB is connected to I/O lines (data lines) IO and nIO via the N-channel MOS transistors N13 and N14 as column selection switches.

Since a column selection signal CSLk (k=0, 1 ... 4255) is "H" in the column selected by the column address signal, the data storage section PB in the selected column and the I/O lines IO and nIO are electrically connected.

An N-channel MOS transistor N12 is an element to decide a level of a common node PCD on the basis of the data stored in the data storage section LATCH.

For example, in writing "0", "0" is stored in the data storage section LATCH. In other words, the N-channel MOS transistor N12 is in an on-state, and the level of the common node PCD is turned to "L". In the verification reading, because the read data will be "1" if "0" is properly written into the memory cell, "1" is stored in the data storage section PB. In other words, the N-channel MOS transistor N12 is in an off-state, and the level of the common node PCD is turned to "H".

In the above description, the data includes "0" and "1", and the level of the node includes "L" and "H", wherein "0"corresponds to "L", and "1" corresponds to "H".

Furthermore, in the present example, the two bit lines BLek and BLok are disposed in one column, and one sub-data circuit is connected to the two bit lines BLek and BLok. In this way, the two bit lines BLek and BLok are connected to one sub-data circuit, for such purposes as to (1) prevent noise from being produced due to a coupling capacitance between adjacent bit lines during reading (apply a technique of shield bit line reading), and (2) reduce the number of data circuits and reduce a chip area.

(9) Example of Configuration of Word Line Control Circuit

Figure 24:
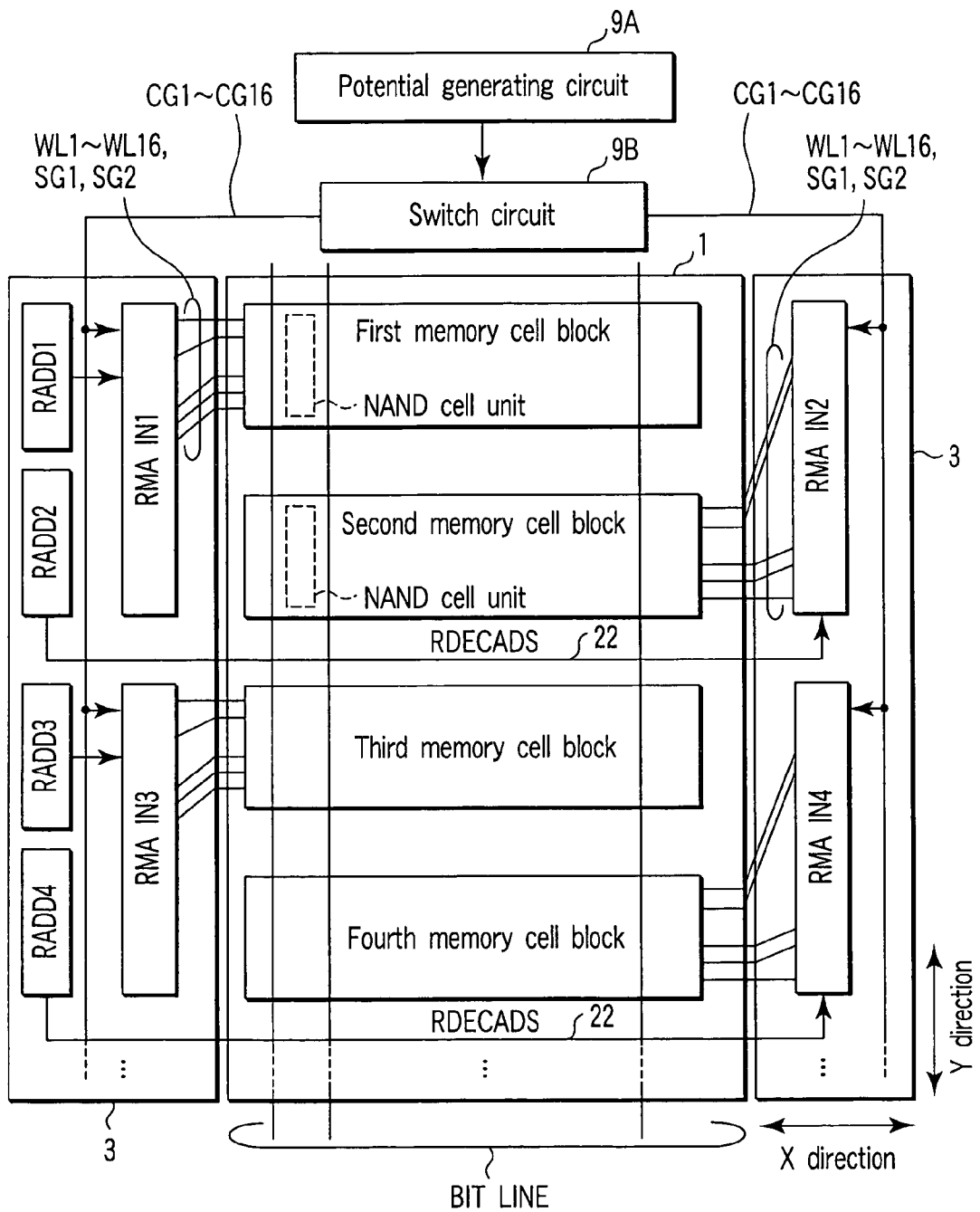
FIG. 24 is a diagram showing an example of a word line control circuit.

FIG. 24 shows a configuration example of the word line control circuit.

The memory cell array 1 is composed of a plurality of memory cell blocks arranged in the Y direction. Each memory cell block has a plurality of NAND cell units arranged in the X direction. Circuit examples of the memory cell array and the NAND cell units are as shown in FIG. 16.

However, the present example is based on the premise that the number of word lines WL1, ... WL16 in one block is 16, and is different from the example described above (FIG. 16). This is, however, not particularly an important point, so that the description will be simply continued.

In the present example, one row address decoder and one word line driver are provided to correspond to one memory cell block.

For example, the word lines WL1, ... WL16 and select gate lines SG1 and SGD2 in a first memory cell block are connected to a first word line driver RMAIN1, and the first word line driver RMAIN1 receives an output signal (decoding result) of a first row address decoder RADD1 that decides whether or not to select the first memory cell block.

In this way, the word lines WL1, ... WL16 and select gate lines SG1 and SGD2 in an i-th (i=1, 2 ... ) memory cell block are connected to an i-th word line driver RMAINi, and the word line driver RMAINi receives an output signal (decoding result) of an i-th row address decoder RADDi that decides whether or not to select an i-th memory cell block.

Here, the word line drivers are disposed on both sides (two ends in the X direction) of the memory cell array 1 in the present example.

More specifically, the word line drivers RMAIN1, RMAIN3, ... corresponding to the odd memory cell array blocks are disposed at one (left) of the two ends in the X direction of the memory cell array 1, and the word line drivers RMAIN2, RMAIN4, ... corresponding to the even memory cell array blocks are disposed at the other (right) of the two ends in the X direction of the memory cell array 1.

Thus, the word line drivers RMAINi can be disposed on both sides of the memory cell array 1 to facilitate the designing of (or to more freely lay out) the word line driver RMAINi. In other words, in the present example, one word line driver can secure a space to lay out two memory cell blocks in the Y direction.

Furthermore, since the word lines WL1, ... WL16 and the select gate lines SG1 and SG2 in one memory cell block are always driven from one side (or the other side) of the memory cell array 1 by the word line driver corresponding to this memory cell block, there is no difference in timing in supplying drive signals to the memory cells and select transistors in one predetermined NAND cell unit within the selected block.

On the other hand, the row address decoder RADDi (i=1, 2 ... ) is disposed at only one (one side) of the two ends in the X direction of the memory cell array 1. In this case, because a signal line (address bus) for supplying the row address signal to the row address decoder RADDi may be disposed at only one side of the memory cell array 1, the area of the address bus can be reduced, resulting in a contribution to chip area reduction.

In other words, if the row address decoders RADDi are disposed respectively at the two ends in the X direction of the memory cell array 1 similarly to the word line drivers RMAINi, the address buses also need to be disposed respectively at the two ends in the X direction of the memory cell array 1, which is a disadvantage for the chip area reduction.

As a result of disposing the row address decoder RADDi at only one (one side) of the two ends in the X direction of the memory cell array 1, a signal line 22 is disposed on the memory cell array 1, in the present example. The signal line 22 is used to supply the word line drivers RMAIN2, RMAIN4, . . . with an output signal (decoding result) RDECADS of row address decoders RADD2, RADD4, . . . corresponding to the even memory cell array block.

The signal RDECADS is transmitted to the signal line 22 in an ordinary operation. It is therefore necessary to prevent the potential of the signal line 22 from causing an adverse effect on the operation of the memory cell in the ordinary operation. It should be noted that the row address decoder RADDi and the word line driver RMAINi that prevent the potential of the signal line 22 from causing an adverse effect on the operation of the memory cell will be described later.

The potential generating circuit 9A has the booster circuit (charge pump circuit), and generates, for example, the write potential Vpgm or the transfer potential Vpass used in the write operation.

A step-up potential generated by the booster circuit can be varied by, for example, a configuration as shown in FIG. 13 so as to perform switching to the first mode or the second mode, which characterizes the flash memory according to the examples of the present invention.

The potential generating circuit 9A is connected to the switch circuit 9B. The switch circuit 9B allocates the potentials such as the write potential Vpgm, the transfer potential Vpass, the in-chip power supply potential Vdd and the ground potential Vss to signal lines CG1, . . . CG16 corresponding to the word lines WL1, . . . WL16.

The signal lines CG1, . . . CG16 are connected to the word line driver RMAINi. That is, the signal lines CG1, . . . CG16 are connected to the word lines WL1, . . . WL16 via potential transferring transistors HNt1, HNt2, . . . HNt16 (described later) in the word line driver RMAINi.

(10) Circuit Examples of Row Address Decoder and Word Line Driver

The flash memory according to the examples of the present invention controls the value of the read potential or the verification read potential output from the row address decoders and the word line drivers to switch the mode to the first mode or the second mode, thereby accomplishing the different threshold distributions for the memory cells in one chip.

Therefore, examples of the general configuration of the row address decoder and the word line driver will be described below.

Figure 25:
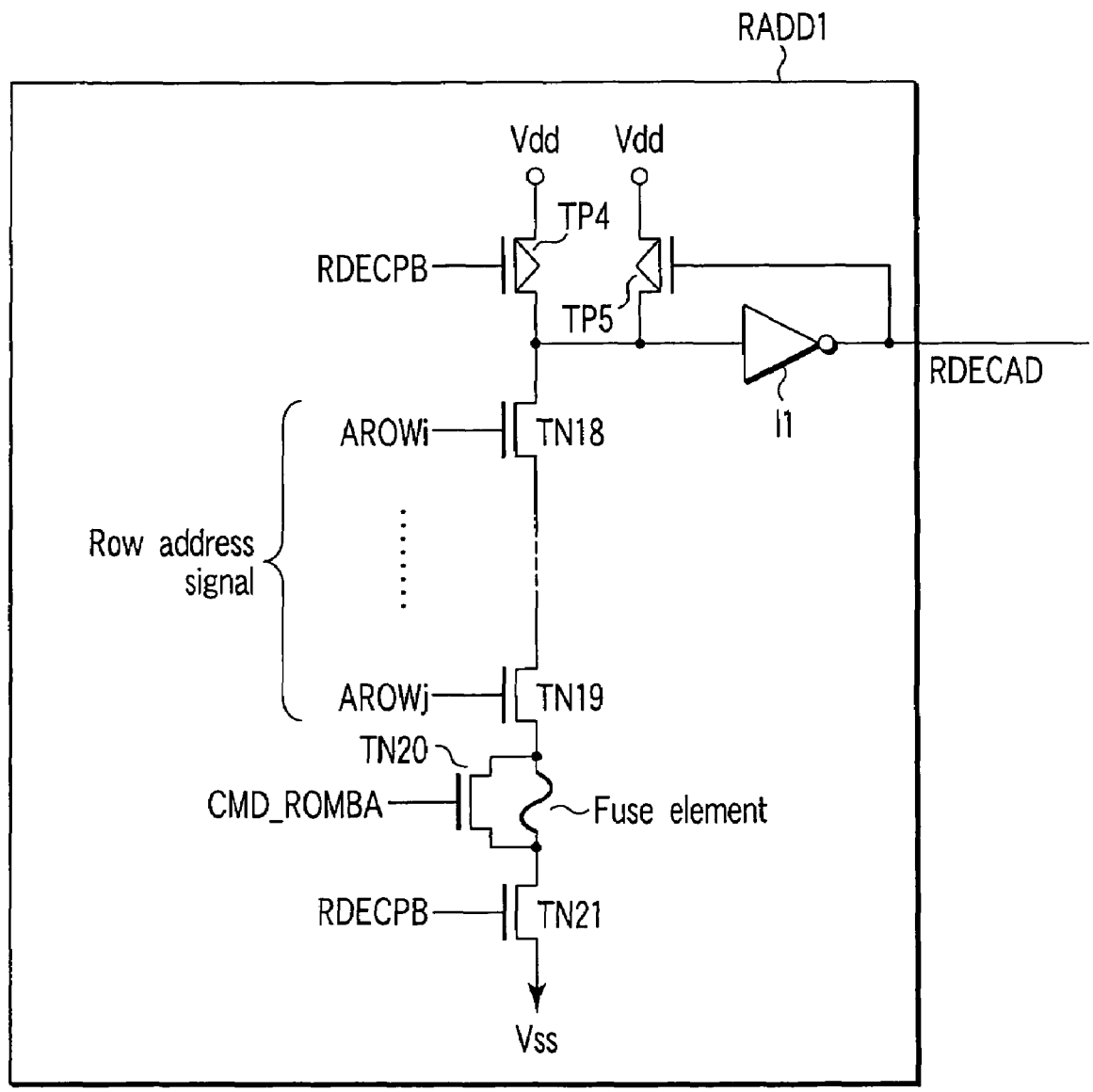
FIG. 25 is a diagram showing a circuit example of RADD1 of FIG. 24.

FIG. 25 shows main parts of the row address decoder provided to correspond to the odd memory cell block.

Precisely, this row address decoder RADD1 functions as a block decoder. That is, for example, when the first memory cell block is selected, all row address signals AROWi, . . . AROWj are "H", and the output signal RDECAD is "H".

FIG. 26 shows main parts of the word line driver provided to correspond to the odd memory cell block.

Main components of the word line driver RMAIN1 are a high voltage switching circuit 26 and transferring MOS transistors HN5, HN6, HNt1, . . . HNt16.

The high voltage switching circuit 26 comprises a first step-up unit constituted of a MOS capacitor DHN4 and a MOS transistor IHN1, and a second step-up unit constituted of a MOS capacitor DHN5 and a MOS transistor IHN2.

A gate of a MOS transistor HN3 is connected to a connection node B of the MOS transistors IHN1 and IHN2. In this case, the potential level of the gate and source of the MOS transistor HN3 synchronizes with a clock signal Owc while keeping a reversed phase, to gradually increase the potential of nodes A, B and TransferG1, thereby enhancing step-up efficiency.

The high voltage switching circuit 26 is in an active state when the output signal RDECAD of the row address decoder RADD1 is "H". That is, when the output signal RDECAD is "H", the output signal of a NAND circuit NAND 1 is a clock signal having a reversed phase to that of the clock signal Owc. The output signal of the NAND circuit NAND 1 is applied to one end of the MOS capacitors GHN4 and GHN5.

As a result, the step-up potential is applied to gates of the transferring MOS transistors HN5, HN6, HNt1, . . . HNt16, and the transferring MOS transistors HN5, HN6, HNt1, . . . HNt16 are in an on-state.

When the output signal RDECAD of the row address decoder RADD1 is "H", MOS transistors HN7 and HN8 are in an off-state. At this point, the signal lines SGD and SGS has, for example, the in-chip power supply potential Vdd, and this Vdd is supplied to the select gate lines SG1 and SGD2 via the transferring MOS transistors HN5 and HN6.

Furthermore, the signal lines CG1, CG2, . . . CG16 are respectively set to predetermined potentials in accordance with the operation mode by the switch circuit 9B (see FIG. 1). Then, the potential of the signal lines CG1, CG2, . . . CG16 is supplied to the word lines WL1, WL2, . . . WL16 via the transferring MOS transistors HNt1, . . . HNt16.

Figure 27:
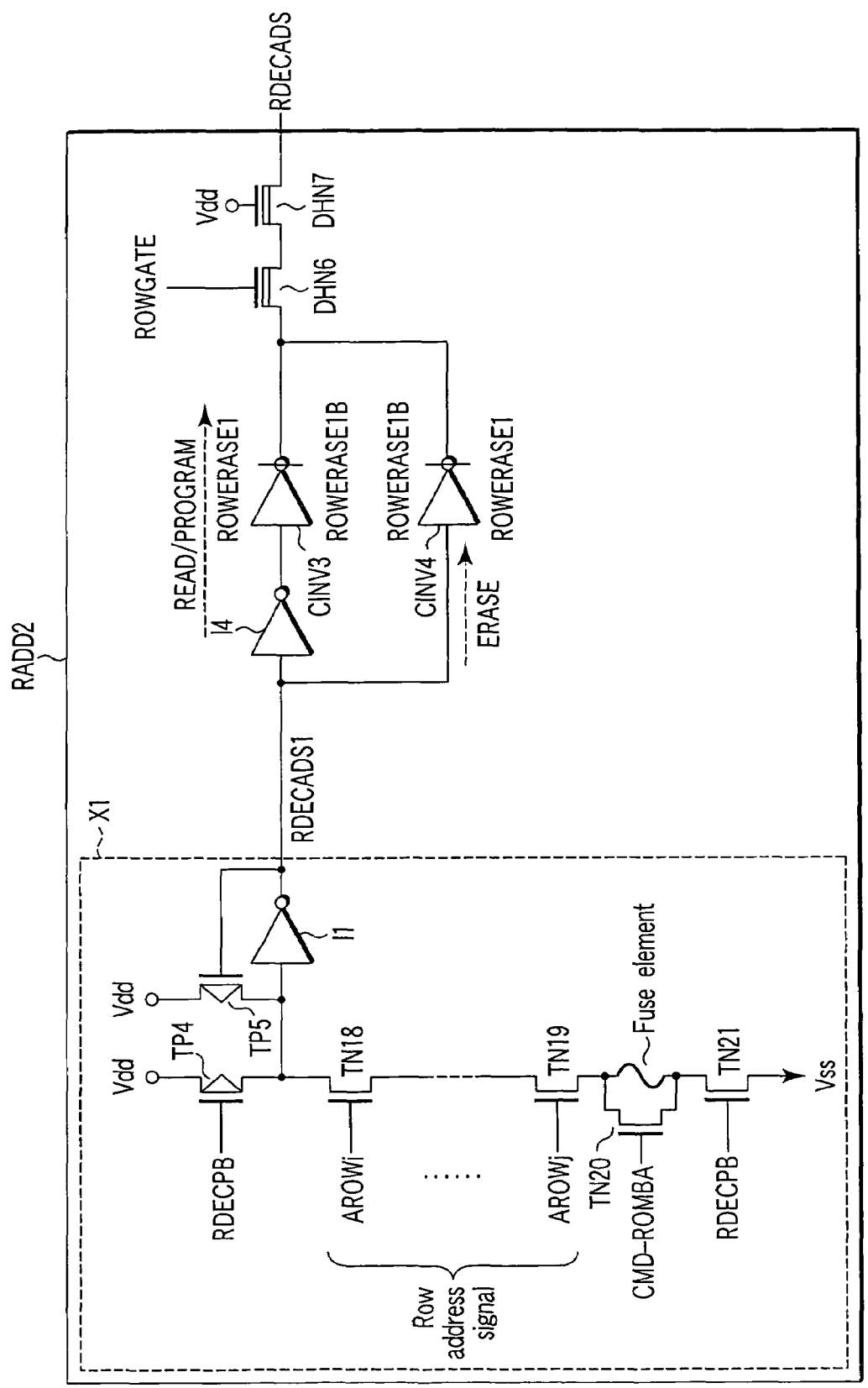
FIG. 27 is a diagram showing a circuit example of RADD2 of FIG. 24.

FIG. 27 shows main parts of the row address decoder provided to correspond to the even memory cell block.

The row address decoder RADD2 includes the same circuits as the row address decoder RADD1 of FIG. 25. That is, the circuits surrounded by a broken line X1 are the same as those of the row address decoder RADD1 of FIG. 25. It is to be noted that, in FIG. 27, the same symbols are given to the same parts as FIG. 25.

This row address decoder RADD2 has an inverter I4, clocked inverters CINV3 and CINV4, and depression type high voltage N-channel MOS transistors DHN6 and DHN7.

The clocked inverter CINV4 has a function, during erasing, to turn the output signal RDECADS (potential of the signal line 22 in FIG. 24) of the row address decoder corresponding to the selected memory cell block to the ground potential Vss, and to turn the output signal RDECADS of the row address decoder corresponding to the unselected memory cell block to the in-chip power supply potential Vdd.

The MOS transistor DHN6 has a function to bring the signal line 22 (see FIG. 24) into a floating state together with the transistor DHN9 in FIG. 28 which will be described later.

During erasing, a signal RDECADS1 is "H (Vdd)" in the selected memory block, and the signal RDECADS1 is "L (Vss)" in the unselected memory block.

If this signal RDECADS1 is given to the signal line 22 (see FIG. 24) on the memory cell array, the signal line 22 (see FIG. 24) on the memory cell array will be "L (Vss)" in the unselected memory block.

In this case, if an attempt is made to increase the potential of the word line in the unselected memory block when the erase potential Vera is given to a cell well by coupling capacitance of the cell well and the word line, the potential of the word line is not sufficiently increased due to the influence of the signal line 22 (see FIG. 24) which is the ground potential Vss.

In the present example, as the clocked inverter CINV4 is provided, the output signal RDECADS is "L (Vss)" in the selected memory block during erasing, and the signal RDECADS is "H (Vdd)" in the unselected memory block.

That is, in the unselected memory block, the signal line 22 (see FIG. 24) on the memory cell array is "H (Vdd)", and is in a floating state since the MOS transistor DHN6 and the MOS transistor DHN9 (FIG. 28) are cut off.

Therefore, when the potential of the word line in the unselected memory block is increased by the coupling capacitance of the cell well and the word line, the potential of the word line is sufficiently increased owing to a lowered effect of the signal line 22 (see FIG. 24) which is the in-chip power supply potential Vdd.

FIG. 28 shows main parts of the word line driver provided to correspond to the even memory cell block.

Among main components of the word line driver RMAIN2, the high voltage switching circuit 26, and the transferring MOS transistors HN5, HN6, HNt1, . . . HNt16 are the same as in the word line driver RMAIN1 shown in FIG. 26. That is, the circuits surrounded by a broken line X2 are about the same as those of the row address decoder RADD1 of FIG. 26. It is to be noted that, in FIG. 28, the same symbols are given to the same parts as FIG. 26.

The word line driver RMAIN2 has clocked inverters CINV5, CINV6 and CINV7, depression type high voltage N-channel MOS transistors DHN8 and DHN9, and enhancement type P-channel MOS transistors TP6 and TP7.

The clocked inverter CINV7 has a function, during erasing, to return the output signal RDECADS (potential of the signal line 22 in FIG. 24) of the row address decoder corresponding to the selected memory cell block from the ground potential Vss to the in-chip power supply potential Vdd, and return the output signal RDECADS of the row address decoder corresponding to the unselected memory cell block from the in-chip power supply potential Vdd to the ground potential Vss, and then give the signal as a signal RDECADS2 to the circuits within the broken line X2.

The MOS transistor DHN9 has a function to bring the signal line 22 (see FIG. 24) into a floating state together with the transistor DHN6 in FIG. 27.

In this way, the inverter I4, the clocked inverters CINV3 and CINV4, and the depression type high voltage N-channel MOS transistors DHN6 and DHN7 that are in the row address decoder RADD2 of FIG. 27, and the clocked inverters CINV5, CINV6 and CINV7, the depression type high voltage N-channel MOS transistors DHN8 and DHN9, and the enhancement type P-channel MOS transistors TP6 and TP7 that are in the word line driver RMAIN2 of FIG. 28 are used as pairs to accomplish the same object.

In addition, these circuits are supplied with Vdd (in-chip power supply potential lower than an external power supply potential Vcc) as the power supply potential in FIG. 25 to FIG. 28, but, for example, the external power supply potential Vcc may be supplied instead.

(11) Regarding the Potential Level of the Signal Line 22

Next, how the potential level of the signal line 22 (see FIG. 24) will be in each operation mode will be described. It should be noted that only the potential level of the signal line 22 will be described.

In the present example, the signal line 22 (FIG. 24) connects the word line driver (FIG. 28) to the row address decoder (FIG. 27) corresponding to the even memory cell block. Therefore, the potential level of the word line driver selection signal RDECADS transmitting through the signal line 22 (FIG. 24) will be described referring to FIG. 27 and FIG. 28.

The potential level of the output signal RDECADS of the row address decoder RADD2 differs depending upon the operation mode.

In the operations (writing, reading, verification reading) other than the erase operation, ROWERASE1B, ROWPROG1, ROWERASE2B, ROWERASE3$n$ and ROWGATE are respectively set to the power supply potential Vdd (the in-chip power supply potential lower than the external power supply potential Vcc. However, it may also be the external power supply potential Vcc.), and ROWERASE1, ROWPROG1B and ROWERASE2 are respectively set to the ground potential Vss.

At this point, the clocked inverters CINV3, CINV5 and CINV6 are in an active state, and the clocked inverters CINV4 and CINV7 are in a non-active state. Further, the MOS transistor TP6 is in an off state.

In selected memory cell block, the output signal RDECADS1 in the part surrounded by the broken line X1 is "H", that is, the in-chip power supply potential Vdd, and the output signal RDECADS of the row address decoder RADD2 is also "H", that is, the in-chip power supply potential Vdd.

On the other hand, in the unselected memory cell block, the output signal RDECADS1 in the part surrounded by the broken line X1 is "L", that is, the ground potential Vss, and the output signal RDECADS of the row address decoder RADD2 is also "L", that is, the ground potential Vss.

Therefore, in the operations other than the erase operation, the signal line 22 (see FIG. 24) disposed on the memory cell array in the unselected memory cell block is the ground potential Vss, and the select gate lines SG1 and SG2 in the unselected memory cell block are also the ground potential Vss, and the signal lines 22, SG1 and SG2 function as shield lines between the bit line and word line. As a result, coupling noise produced in data transmitting through the bit line can be reduced.

In the erase operation, the ROWERASE1B, ROWPROG1, ROWERASE2B, ROWERASE3$n$ and ROWGATE are respectively set to the ground potential Vss, and the ROWERASE1, ROWPROG1B and ROWERASE2 are respectively set to the in-chip power supply potential Vdd (may also be set to the power supply potential Vcc).

At this point, the clocked inverters CINV4 and CINV7 are in an active state, and the clocked inverters CINV3, CINV5 and CINV6 are in a non-active state. Further, the MOS transistor TP6 is in an on state.

In the selected memory cell block, the output signal RDECADS1 in the part surrounded by the broken line X1 is "H", that is, the in-chip power supply potential Vdd, and the output signal RDECADS of the row address decoder RADD2 is "L", that is, the ground potential Vss.

On the other hand, in the unselected memory cell block, the output signal RDECADS1 in the part surrounded by the broken line X1 is "L", that is, the ground potential Vss, and the output signal RDECADS of the row address decoder RADD2 is "H", that is, the in-chip power supply potential Vdd.

Furthermore, as the ROWGATE has the ground potential Vss, the signal line 22 (see FIG. 24) in the unselected memory cell block is in a floating state because the MOS transistors DHN6 and DHN9 are cut off if the potential (potential of the RDECADS) is about 1 to 1.5 V.

In this way, in the erase operation, the signal line 22 (see FIG. 24) disposed on the memory cell array in the unselected memory cell block is 1 to 1.5 V, and in a floating state. In other words, when the erase potential Vera is given to the cell well, the potential of the signal line 22 (FIG. 24) also increases due to the coupling capacitance in the same way as the word line, so that the signal line 22 (FIG. 24) does not prevent the potential of the word line from increasing.

Therefore, it is possible to obtain an effect that the potential of the word line in the unselected memory cell block is easily increased owing to the coupling capacitance between the cell well and the word line when the erase potential Vera is given to the cell well.

In connection with this, since the tunnel oxide film of the memory cell in the unselected memory cell block is not subjected to a large electric field, erroneous erase can be prevented in the unselected memory cell block.

By the way, the fuse element (also the fuse element of FIG. 25) within the broken line X1 of FIG. 27 is not cut off when the memory cell block corresponding to the fuse element (row address decoder) is used as an ordinary memory area for a user.

However, when the memory cell block corresponding to the fuse element (row address decoder) is used as, for example, a ROM-BLOCK area to store device codes, the fuse element is cut off, so that the user can not freely write/erase data in the ROM-BLOCK area.

This ROM-BLOCK area has the following meanings.

Recently, the NAND-structured flash memories have been used in memories of various electronic devices. However, the NAND-structured flash memory is in some cases used as a memory for data associated with copyright such as a memory for storing music information through a telephone communication.

Therefore, a chip number, that is, a device code is stored in the NAND-structured flash memory in order to prevent illegal copy.

This device code is unique to individual NAND-structured flash memory, but if the user can freely rewrite this device code, the original purpose of the device code can not be attained.

For this reason, the device code is written into the ROM-BLOCK area of the NAND-structured flash memory before product shipment, so that the user can not write/erase data in the ROM-BLOCK area. In other words, the fuse element is cut off in the memory cell clock to be the ROM-BLOCK area.

Thus, it is impossible to copy for example when the music information is to be copied from the NAND-structured flash memory at an information providing end to the NAND-structured flash memory at an information receiving end, or when the device code is read from the NAND-structured flash memory at the information providing end, and this device code is different from the device code of the NAND-structured flash memory at the information receiving end.

The fuse element is cut off immediately after the device code is programmed into the memory cell block to be the ROM-BLOCK area.

This is because if a pre-shipment test is performed without cutting off the fuse element, the device code is erased in this test.

Thus, all the blocks are simultaneously selected to perform writing/erasing to reduce test time in the pre-shipment test. That is, all the row address signals AROWi, . . . AROWj are "H", so that when the fuse element is not cut off, the RDECADS1 will be "H" (the RDECAD is "H" in FIG. 25) even if a CMD ROMBA is "L", with the result that the memory cell block to be the ROM-BLOCK area is selected.

On the other hand, in the pre-shipment test, even when all the row address signals AROWi, . . . AROWj are "H", the CMD ROMBA is "L" if the fuse element is cut off, so that the RDECADS1 is "L" (the RDECAD is "H" in FIG. 25), and the memory cell block to be the ROM-BLOCK area is not selected.

Even if the fuse element is cut off, it is necessary to read the device code stored in the ROM-BLOCK area.

Data can be read from the ROM-BLOCK area by turning the CMD ROMBA to "H". That is, if the CMD ROMBA is "H" and the AROWi, . . . AROWj in the ROM-BLOCK area are "H", the memory cell block to be the ROM-BLOCK area will be selected.

Furthermore, also after the fuse element is cut off, a specific command is input to turn the CMD ROMBA and the AROWi, . . . AROWj in the ROM-BLOCK area to "H", whereby the data in the ROM-BLOCK area can be rewritten. In this case, the command to turn the CMD ROMBA to "H" is not open to general users, so that the data in the ROM-BLOCK area can not be rewritten illegally.

In addition, it has been described in the present example that the fuse in the ROM-BLOCK area is cut off, but the fuse in FIG. 25 and the fuse within the broken line X1 of FIG. 27 are cut off also when the memory cell block is a defective block. In this case, the defective block is replaced with a preliminary block by the redundancy circuit.

3. Description of Basic Operation

The main parts of the flash memory (FIG. 1) according to the examples of the present invention in the operation modes such as write and read, that is, the operation of the data circuit (FIG. 23) will be described in detail below.

Before describing the operation, one example of a method of write/read in the memory cell will first be described.

(1) Write/read Method

Figure 29:
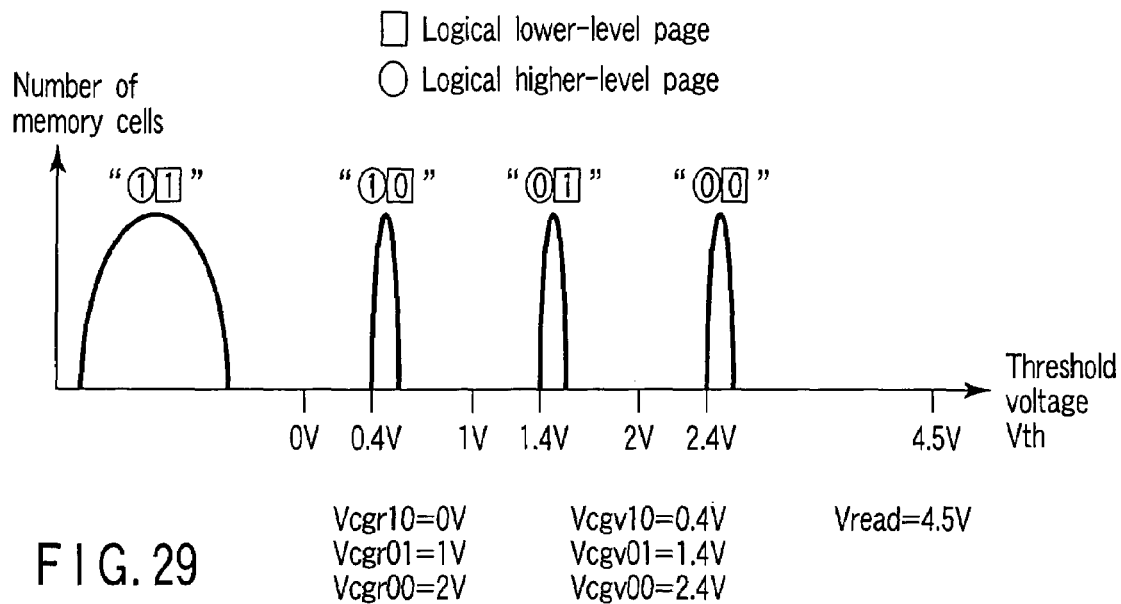
FIG. 29 is a diagram showing a relationship between data in the memory cell and threshold voltage distribution.

FIG. 29 shows an example of threshold voltage (Vth) distribution of the memory cell of a quaternary NAND-structured flash memory.

The examples of the present invention are characterized in that different threshold distributions can be selectively implemented for the memory cells in one chip. However, because means to attain the different threshold distributions has already been described, the method of write/read in the memory cell will simply be described here. 2-bit data (quaternary data) is stored in one memory cell. In the present example, the 2-bit data includes "11", "10", "01" and "00", as described above. The same memory cell stores 1 bit of 2-bit data as the logical lower-level page data (indicated with an outline square), and the other 1 bit as the logical higher-level page data (indicated with a circle).

The relationship between the 2-bit data ("11", "10", "01" and "00") and the threshold voltage of the memory cell is as shown in FIG. 29.

"11" indicates an erased state. In the erased state, the value of the logical lower-level page data and the value of the logical higher-level page data are both "1". The memory cell in the erased state has a negative threshold voltage Vth.

"10", "01" and "00" indicate a written state. The memory cell in the written state has a positive threshold voltage Vth. Moreover, in the written state, the "10" state has the lowest threshold voltage, the "00" state has the highest threshold voltage, and the "01" state has a threshold voltage between the threshold voltages of the "10" state and the "00" state.

The 2-bit data is composed of the logical lower-level page data and the logical higher-level page data as described above, and written into the memory cell by two write operations.

First, the logical lower-level page data is written.

Figure 30:
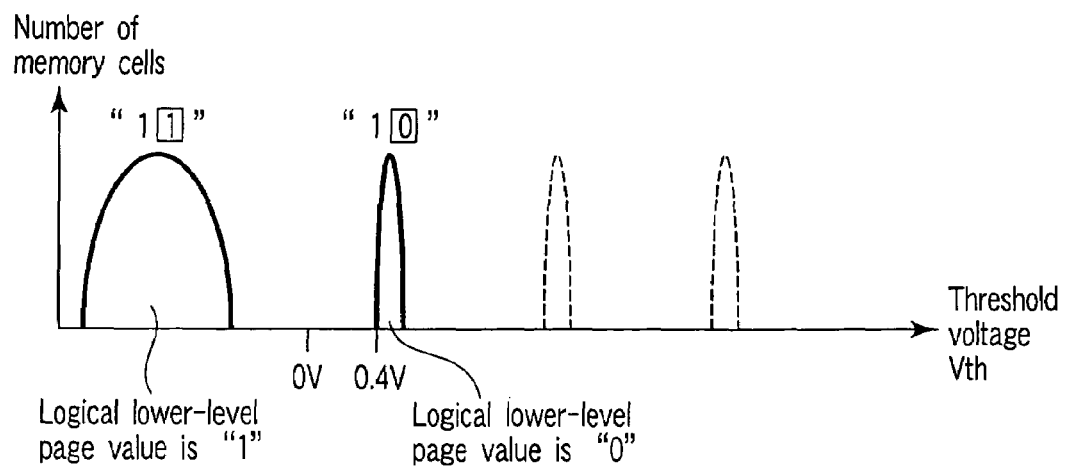
FIG. 30 is a diagram showing how the threshold voltage changes when logical lower-level page data is programmed.

Initially, all the memory cell are in the erased state, that is, in the "11" state. Subsequently, as shown in FIG. 30, if the logical lower-level page data is written, the distribution of the threshold voltage Vth of the memory cell is divided into two in accordance with the value ("1", "0") of the write data (logical lower-level page data).

In other words, if the logical lower-level page data is "1", the bit line is turned to "H" (the word line is turned to the write potential) so that the tunnel oxide film of the memory cell is not subjected to a high electric field, thereby preventing the threshold voltage Vth of the memory cell from increasing. As a result, the memory cell maintains the erased state ("11" state) (the logical lower-level page data "1" is written).

On the other hand, if the logical lower-level page data "0", the bit line is turned to "L" (the word line is turned to the write potential) to apply the high electric field to the tunnel oxide film of the memory cell, and electrons are injected into the floating gate electrode, thereby increasing a predetermined amount of threshold voltage Vth of the memory cell. As a result, the memory cell is changed to the written state ("10" state) (the logical lower-level page data "0" is written).

Subsequently, the logical higher-level page data is written.

The logical higher-level page data is written on the basis of the write data input from the outside of the chip (i.e., the higher-level page data) and the logical lower-level page data already written into the memory cell.

In addition, the logical lower-level page data is read from the memory cell to the data circuit and retained before the logical higher-level page data is written (internal data load).

Figure 31:
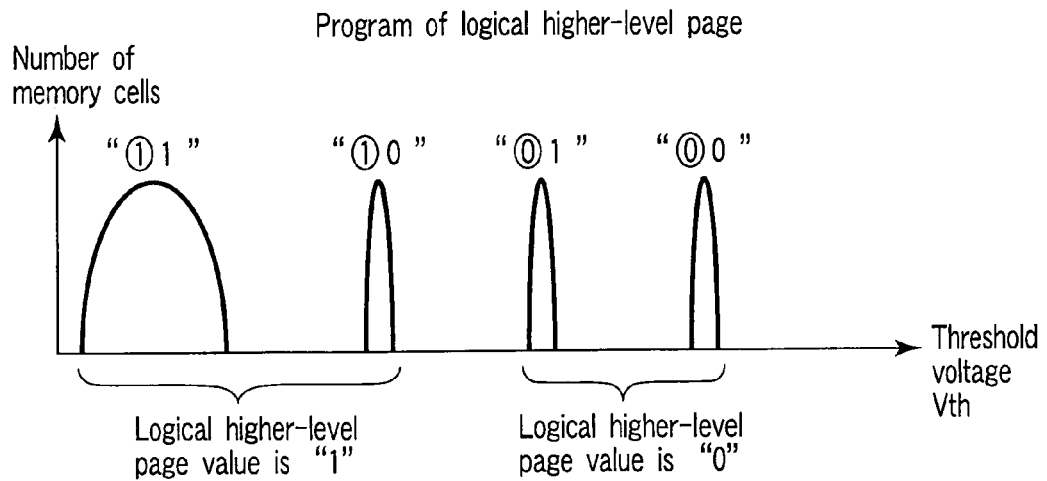
FIG. 31 is a diagram showing how the threshold voltage changes when logical higher-level page data is programmed.

As shown in FIG. 31, when the logical higher-level page data is "1", the bit line is turned to "H" (the word line is turned to the write potential) so that the tunnel oxide film of the memory cell is not subjected to the high electric field, thereby preventing the threshold voltage Vth of the memory cell from increasing. As a result, the memory cell in the "11" state (erased state) in which the logical lower-level page data is "1" maintains the "11" state (the logical lower-level page data "1" is written). Further, the memory cell in the "10" state in which the logical lower-level page data is "0" maintains the "10" state (the logical higher-level page data "1" is written).

On the other hand, as shown in FIG. 31, if the logical higher-level page data is "0", the bit line is turned to "L" to apply the high electric field to the tunnel oxide film of the memory cell, and electrons are injected into the floating gate electrode, thereby increasing a predetermined amount of threshold voltage Vth of the memory cell. As a result, the memory cell in the "11" state (erased state) in which the logical lower-level page data is "1" changes to the "01" state (the logical higher-level page data "0" is written). Further, the memory cell in the "10" state in which the logical lower-level page data is "0" changes to the "00" state (the logical higher-level page data "0" is written).

That is, in the present example, "11" is written into the memory cell when the logical lower-level page data is "1" and the logical higher-level page data is "1", and "10" is written into the memory cell when the logical lower-level page data is "0" and the logical higher-level page data is "1". Moreover, "01" is written into the memory cell when the logical lower-level page data is "1" and the logical higher-level page data is "0", and "00" is written into the memory cell when the logical lower-level page data is "0" and the logical higher-level page data is "0".

In this way, the distribution of the threshold voltage Vth of the memory cell is divided into four ("11", "10", "01" and "00") by two write operations.

In the present example, the memory cell in the "11" state changes to the "01" state when the logical higher-level page data is "0", and the memory cell in the "10" state changes to the "00" state (see FIG. 31).

In addition, in FIG. 29, Vcgv10 is the read potential used for the verification reading of "10", and is, for example, 0.4 V. Vcgv01 is the read potential (e.g., 1.4 V) used for the verification reading of "01", and Vcgv00 is the read potential (e.g., 2.4 V) used for the verification reading of "00". Vread is the transfer potential given to the unselected word line.

The data in the memory cell is "11" if the threshold voltage of the memory cell is below Vcgr10. The data in the memory cell is "10" if the threshold voltage of the memory cell exceeds Vcgr10 and is below Vcgv01. The data in the memory cell is "01" if the threshold voltage of the memory cell exceeds Vcgr01 and is below Vcgr00. The data in the memory cell is "00" if the threshold voltage of the memory cell exceeds Vcgr00.

Ordinary reading of the logical lower-level page data can be achieved by, for example, two read operations ("READ 00", "READ 10"). The READ 00 means a read operation using Vcgr00 (e.g., 2 V) as the read potential, and the READ 10 means a read operation using Vcgr10 (e.g., 0 V) as the read potential. Moreover, reading of the logical higher-level page data can be achieved by, for example, one read operation ("READ 01"). The READ 01 means a read operation using Vcgr01 (e.g., 1 V) as the read potential.

As described above, in the present example, the 2-bit data can be read by a total of three read operations, and it is thus possible to reduce reading time or increase the spread of the read operation.

(2) Write, Erase and Read Operations

Specific examples of the write, erase and read operations will be described below.

Table 2 and Table 3 show the potentials of the parts in the flash memory in erase, write, read and write verification.

TABLE 2

|  | Erasure | First step writing | Second step writing | Write protect | 10 reading | 01 reading | 00 reading |
|---|---|---|---|---|---|---|---|
| BLe | Floating | 0 V | 0.4 V | Vdd | H or L | H or L | H or L |
| BLo | Floating | Vdd | Vdd | Vdd | 0 V | 0 V | 0 V |
| SGD | Floating | Vdd | Vdd | Vdd | 4.5 V | 4.5 V | 4.5 V |
| WL3 | 0 V | 10 V | 10 V | 10 V | 4.5 V | 4.5 V | 4.5 V |
| WL2 | 0 V | Vpgm | Vpgm | Vpgm | 0 V | 1 V | 2 V |
| WL1 | 0 V | 0 V | 0 V | 0 V | 4.5 V | 4.5 V | 4.5 V |
| WL0 | 0 V | 10 V | 10 V | 10 V | 4.5 V | 4.5 V | 4.5 V |
| SGS | Floating | 0 V | 0 V | 0 V | 4.5 V | 4.5 V | 4.5 V |
| C-source | Floating | 0 V | 0 V | 0 V | 0 V | 0 V | 0 V |
| C-p-well | 20 V | 0 V | 0 V | 0 V | 0 V | 0 V | 0 V |

TABLE 3

|  | 10 first step write verification | 10 second step write verification | 01 first step write verification | 01 second step write verification | 00 first step write verification | 00 second step write verification |
|---|---|---|---|---|---|---|
| BLe | H or L | H or L | H or L | H or L | H or L | H or L |
| BLo | 0 V | 0 V | 0 V | 0 V | 0 V | 0 V |
| SGD | 4.5 V | 4.5 V | 4.5 V | 4.5 V | 4.5 V | 4.5 V |
| WL3 | 4.5 V | 4.5 V | 4.5 V | 4.5 V | 4.5 V | 4.5 V |
| WL2 | 0.2 V | 0.4 V | 1.2 V | 1.4 V | 2.2 V | 2.4 V |
| WL1 | 4.5 V | 4.5 V | 4.5 V | 4.5 V | 4.5 V | 4.5 V |
| WL0 | 4.5 V | 4.5 V | 4.5 V | 4.5 V | 4.5 V | 4.5 V |
| SGS | 4.5 V | 4.5 V | 4.5 V | 4.5 V | 4.5 V | 4.5 V |
| C-source | 0 V | 0 V | 0 V | 0 V | 0 V | 0 V |
| C-p-well | 0 V | 0 V | 0 V | 0 V | 0 V | 0 V |

Where BLe indicates the even bit line, BLo indicates the odd bit line, SGD indicates the select gate line of the drain side (bit line side) select gate transistor, SGS indicates the select gate line of the source side (source line side) select gate transistor, and WL1, WL2, WL3 and WL4 indicate the word lines, C-source indicates the source line, and C-p-well indicates the well (cell p-well) in which the memory cell is formed.

Furthermore, in the present example, the word line WL2 and the even bit line BLe are selected during writing/reading.

In an initial state, the memory cell is in the "1138 state. Further, in the erase operation, the cell p-well C-p-well is set at 20 V, and all the word lines WL0, WL1, WL2 and WL3 in the selected block are set at 0 V, whereby electrons are discharged from the floating gate in the memory cell within the selected block, and the memory cell will be in the 11" state.

Here, in the erase operation, the word line within the unselected block, all the bit lines and control gate lines, and the source line are brought into a floating state. Therefore, the potentials of these conductive lines increase to about 20 V due to coupling capacitance with the cell p-well C-p-well.

Writing is performed by giving a voltage of 14 V to 20 V to the selected word line WL2 as the write potential Vpgm. As the selected bit line BLe is set to 0 V, electrons are injected into the floating gate electrode and the threshold value rapidly increases in the selected memory cell connected to the selected word line WL2 and bit line BLe (first step writing).

When the threshold value of the selected memory cell has risen to the vicinity of a targeted value, the selected bit line BLe is increased to about 0.4 V so as to reduce an increasing speed of the threshold value to retain the threshold value of the selected memory cell in the vicinity of the targeted value (second step writing).

In the unselected memory cell, the bit line BLe is set to the power supply potential Vdd (e.g., 3 V) to prohibit the increase of the threshold value (write protect).

Reading is performed by giving a voltage of 0 V, 1 V or 2 V (see FIG. 29) as the read potential to the selected word line WL2.

At this point, if the threshold value of the selected memory cell is below the read potential, the bit line BLe and the common source line C-source cause a short-circuit, and the potential of the bit line BLe will be on the low level "L". On the contrary, if the threshold value of the selected memory cell has exceeded the read potential, the potential of the bit line BLe will be on the high level "H" because the bit line BLe and the common source line C-source are not conductive.

It is possible to judge whether the memory cell is in the "11" state, or in the "10" state, or "01" state or "00" state by setting the read potential to 0 V (10 reading). Further, it is possible to judge whether the memory cell is in the "11" state or "10" state, or in the "01" state or "00" state by setting the read potential to 1 V (01 reading). Still further, it is possible to judge whether the memory cell is in the "11" state, in the "10" state or "01" state, or in the "00" state by setting the read potential to 2 V (00 reading).

The lower limit of threshold distribution of the memory cell in the "10" state is set to a value of 0.4 V or higher, or 0.4 V in the present example, so that, for example, a read potential of 0 V in the 10 reading has a read margin of 0.4 V or higher. Whether or not the threshold values of all the memory cells in the "10" state are 0.4 V or higher is verified by 10 write verification. Then, in the memory cell in which the threshold value has reached 0.4 V, writing is prohibited to prohibit the increase of the threshold value.

In the same manner, the lower limit of threshold distribution of the memory cell in the "01" state is set to a value of 1.4 V or higher, or 1.4 V in the present example, so that, for example, a read potential of 1 V in the 01 reading has a read margin of 0.4 V or higher. Whether or not the threshold values of all the memory cells in the "01" state are 1.4 V or higher is verified by 01 write verification. Then, in the memory cell in which the threshold value has reached 1.4 V, writing is prohibited to prohibit the increase of the threshold value.

Furthermore, the lower limit of threshold distribution of the memory cell in the "00" state is set to a value of 2.4 V or higher, or 2.4 V in the present example, so that, for example, a read potential of 2 V in the 00 reading has a read margin of 0.4 V or higher. Whether or not the threshold values of all the memory cells in the "00" state are 2.4 V or higher is verified by 00 write verification. Then, in the memory cell in which the threshold value has reached 2.4 V, writing is prohibited to prohibit the increase of the threshold value.

Write verification is performed by giving Vcgv10 (=0.4 V), Vcgv01 (=1.4 V), Vcgv00 (=2.4 V) to the selected word line WL2 as the read potential.

Here, two-step write verification is effective to narrow the width of threshold distribution. The two-step write verification is a verification in which two kinds of verification potentials including a regular value and a value lower than the regular value are prepared, and the two kinds of verification potentials are used to perform the write verification.

For example, in the 10 write verification, a voltage of 0.2 V is given to the selected word line WL2 as the verification potential Vcgv10, and a 10 first step write verification is performed. Then, in the memory cell in which the 10 first step write verification has been completed, a voltage of 0.4 V is individually given as the verification potential Vcgv10, and a 10 second step write verification is performed.

In the same manner, in the 01 write verification, a voltage of 1.2 V (01 first step write verification) and a voltage of 1.4 V (01 second step write verification) are used as the verification potential Vcgv01, and in the 00 write verification, a voltage of 2.2 V (00 first step write verification) and a voltage of 2.4 V (00 second step write verification) are used as the verification potential Vcgv00.

If the threshold value of the memory cell has not reached the verification potential, the bit line BLe and the common source line C-source cause a short-circuit, and the potential of the bit line BLe will therefore be on the low level "L". If the threshold value of the memory cell has exceeded the verification potential, the potential of the bit line BLe will be on the high level "H" because the bit line BLe and the common source line C-source are not conductive.

(3) Writing and Threshold Value Control

According to the examples of the present invention, the different threshold distributions can be selectively implemented for the memory cells in one chip. As described above, the different threshold distributions can easily be produced by giving consideration to the writing method.

However, even in the case of the different threshold distributions, it is preferable for the reliability of the flash memory that each threshold distribution be narrow and sharp as much as possible.

Therefore, an example of a writing and threshold value control method to form the narrow and sharp different threshold distributions will be described below.

Figure 32:
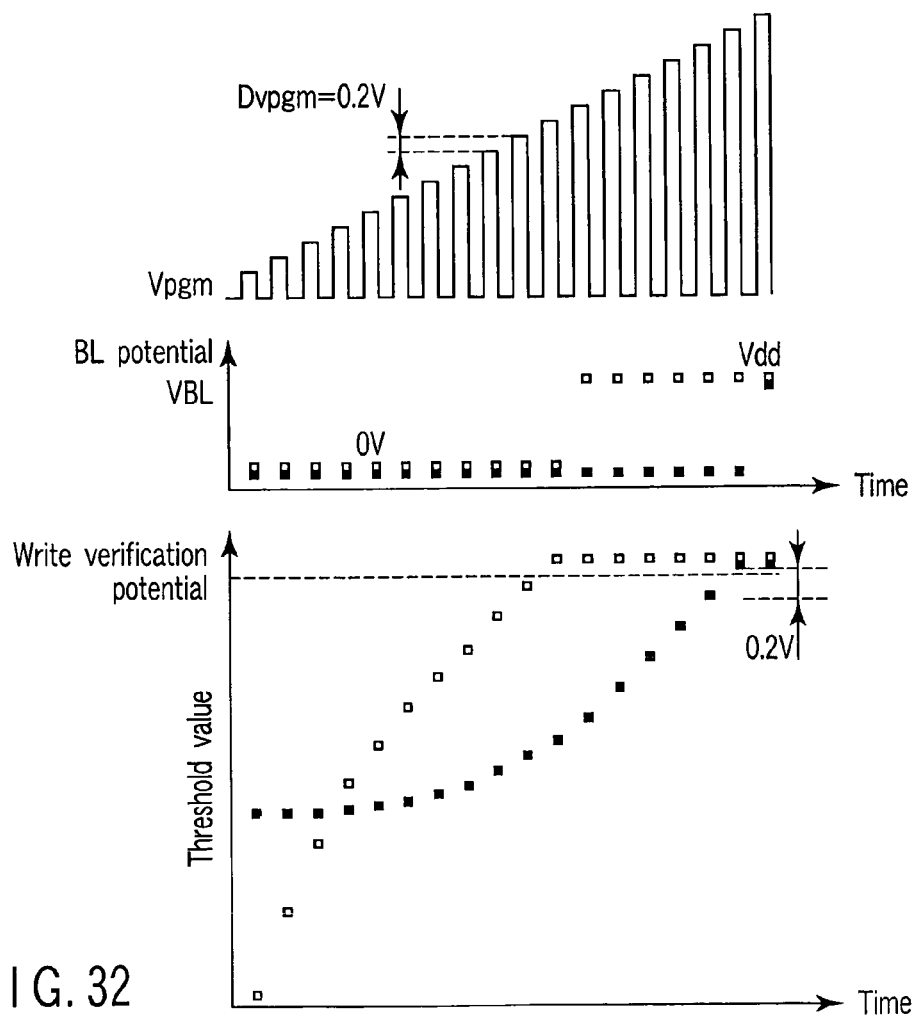
FIG. 32 is a diagram showing a first example of a writing and threshold value control method.

FIG. 32 shows a first example of the writing and threshold value control method.

Outline squares indicate how the threshold value changes in writing into an easily written memory cell, and black squares indicate how the threshold value changes in writing into a not-easily-written memory cell.

These two memory cells belong to the same page, and store the same data. For example, these two memory cells are both in the erased state ("11" state), and have a negative threshold value.

The write potential Vpgm is stepped up from an initial value at a fixed rate Dvpgm (e.g., 0.2 V, 0.05 V, etc., depending on the mode). The write potential Vpgm is applied as a pulse signal (write pulse) to the memory cell, and its degree (write potential Vpgm) is increased every time the pulse signal is given to the memory cell.

If a voltage of 0 V is given to the bit line connected to the memory cell targeted for writing, the threshold value of the memory cell increases at the same increase rate as that of the write potential Vpgm after several pulse signals are given.

The write verification is performed after writing is performed by use of the pulse signals. In the write verification, for the memory cell in which the threshold value has reached the verification potential, the potential of the bit line connected thereto is set to Vdd (power supply potential). That is, whether or not the writing is completed is verified in each memory cell, and the memory cells completed with the writing are individually set to the write protect state.

According to such a writing and threshold value control method, the width of threshold distribution can be restricted to about the same degree as the increase rate of threshold value per pulse.

Figure 33:
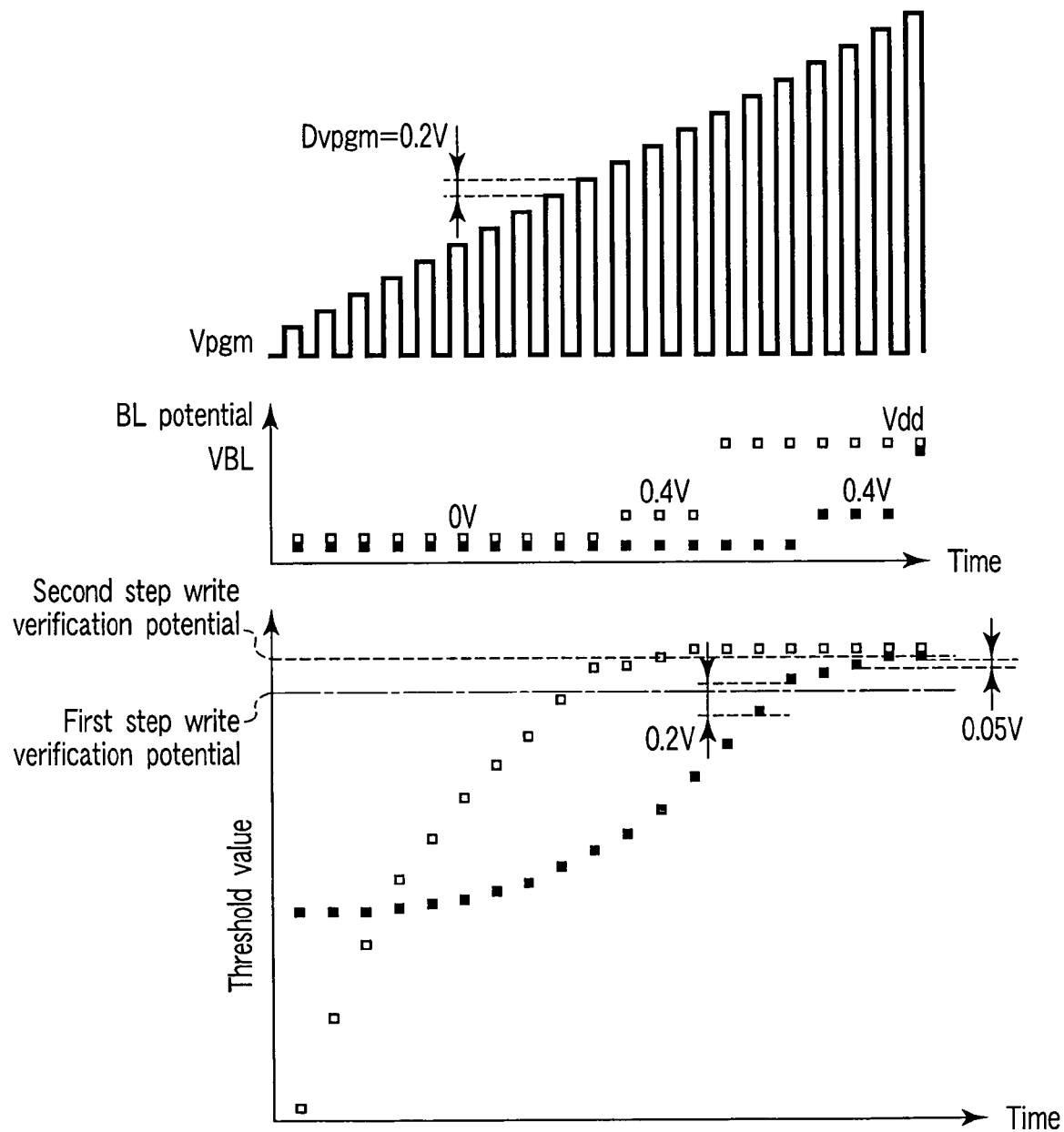
FIG. 33 is a diagram showing a second example of the writing and threshold value control method.

FIG. 33 shows a second example of the writing and threshold value control method.

Outline squares indicate how the threshold value changes in writing into the easily written memory cell, and black squares indicate how the threshold value changes in writing into the not-easily-written memory cell.

These two memory cells belong to the same page, and store the same data. For example, these two memory cells are both in the erased state ("11" state), and have a negative threshold value.

The write potential Vpgm is stepped up from the initial value at the fixed rate Dvpgm (e.g., 0.2 V, 0.05 V, etc., depending on the mode). The write potential Vpgm is applied as the pulse signal to the memory cell, and its degree (write potential Vpgm) is increased every time the pulse signal is given to the memory cell.

If a voltage of 0 V is given to the bit line connected to the memory cell targeted for writing, the threshold value of the memory cell increases at the same increase rate as that of the write potential Vpgm after several pulse signals are given.

The first step write verification and second step write verification are performed after the writing is performed by use of the pulse signals.

In the first step write verification, for the memory cell in which the threshold value has reached the write verification potential, the potential of the bit line connected thereto is set to, for example, 0.4 V. For the memory cell in which the first step write verification is finished, the second step write verification is subsequently performed in each memory cell. In the second step write verification, for the memory cell in which the threshold value has reached the verification potential, the potential of the bit line connected thereto is set to, for example, Vdd (power supply potential). For the memory cell in which the second step write verification is finished, writing is prohibited in each memory cell.

In the second step write verification, the increase rate of threshold value attained by giving one pulse signal is about 0 V/pulse to 0.05 V/pulse in the example shown in FIG. 33.

Therefore, according to such a writing and threshold value control method, the width of threshold distribution can be restricted to about the same degree as the increase rate of threshold value per pulse in the second step write verification, that is, to 0.05 V.

By the way, if the width of the pulse signal is 20 μsec and time required for one write verification is 5 μsec, write time in the first example of FIG. 32 will be (20 μsec+5 μsec)×18 pulses=450 μsec.

However, in the first example, the increase rate of the write potential Vpgm must be reduced from 0.2 V/pulse to 0.05 V/pulse (quarter of 0.2 V) in order to achieve a threshold value width of 0.05 V. This means that the number of pulse signals needed before the completion of writing quadruples.

Therefore, the write time will be

450 μm×4=1800 μsec.

On the other hand, according to the second example of FIG. 33, a threshold value width of 0.05 V can be achieved while the increase rate of the write potential Vpgm is kept at 0.2 V/pulse.

The write time in this case will be (20 μsec+5 μsec+5 μsec)×20 pulses=600 μsec.

In this way, the write time needed to achieve a threshold value width of 0.05 V under the same condition can be significantly reduced to one-third in the second example, as compared to the first example.

(4) Method of Controlling Writing into Lower-Level Page and Threshold Value

The write verification potential of FIG. 32 is set to Vcgv10 (e.g., 0.4 V) to set the first step write verification potential of FIG. 33 to Vcgv10 (e.g., 0.2 V), and the second step write verification potential of FIG. 33 is set to Vcgv10 (e.g., 0.4 V) to perform 10 writing, that is, to write "0" into the lower-level page.

The "11" state is maintained in the memory cell which is not targeted for writing, in other words, in the memory cell into which "1" is written as the lower-level page data.

(5) Method of Controlling Writing into Higher-Level Page and Threshold Value

Figure 34:
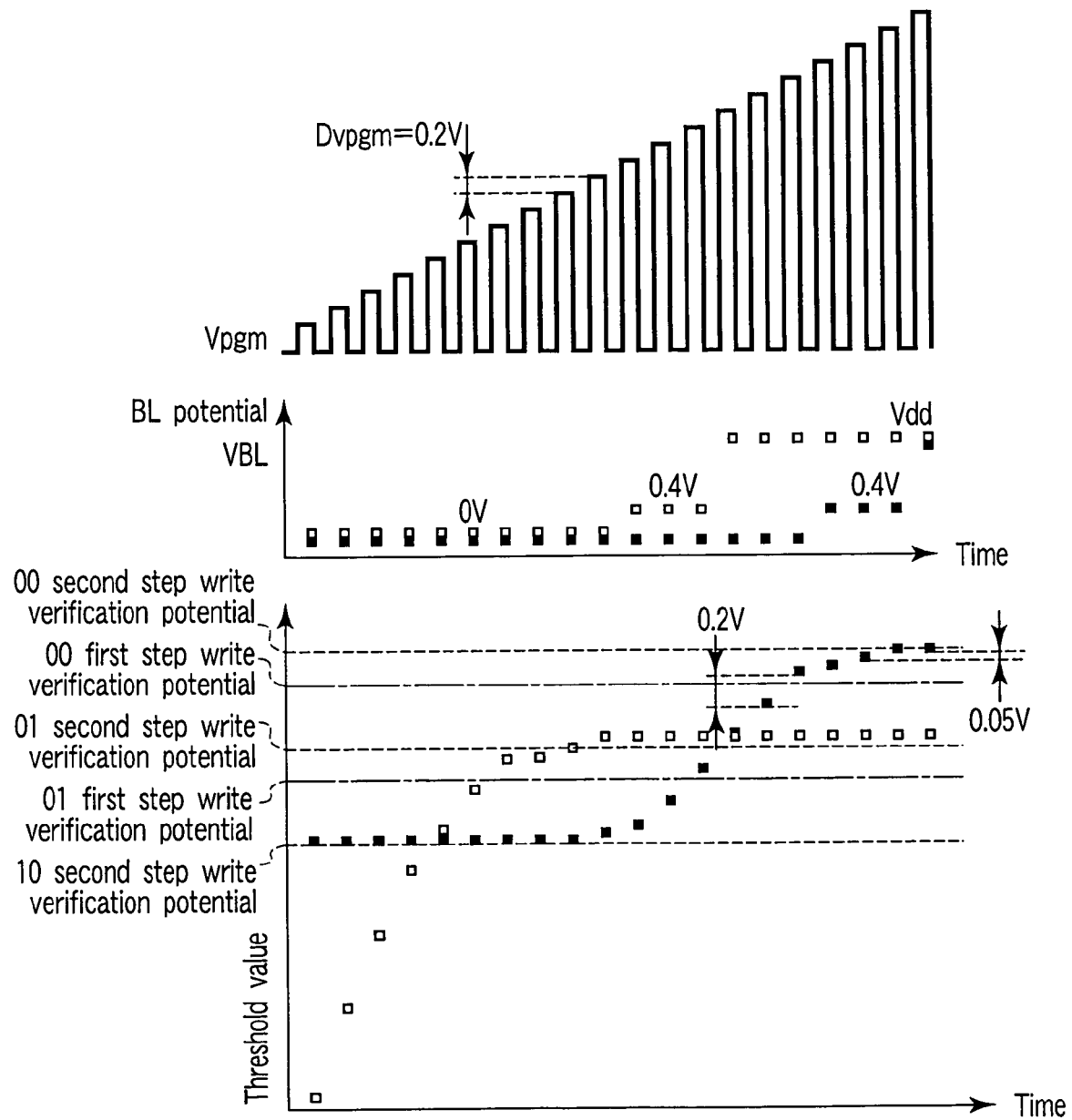
FIG. 34 is a diagram showing an example of the method of controlling writing into a higher-level page and the threshold value.

FIG. 34 shows an example of the method of controlling the writing into the higher-level page.

Outline squares indicate how the threshold value changes in writing into the easily written memory cell, and black squares indicate how the threshold value changes in writing into the not-easily-written memory cell.

Furthermore, the memory cell indicated by the outline squares is in the erased state, that is, the "11" state having a negative threshold value at the time when the writing of the lower-level page data is finished, and the memory cell changes from the "11" state to the "01" state when the higher-level page data "0" is written. In addition, the threshold value is not changed and the "11" state is maintained in the memory cell which is not targeted for "0" writing.

The memory cell indicated by the black squares is in the "10" state at the time when the writing of the lower-level page data is finished, and the memory cell changes from the "10" state to the "00" state when the higher-level page data "0" is written. In addition, the threshold value is not changed and the "10" state is maintained in the memory cell which is not targeted for "0" writing.

The write potential Vpgm is stepped up from the initial value at the fixed rate Dvpgm (e.g., 0.2 V, 0.05 V, etc., depending on the mode). The write potential Vpgm is applied as the pulse signal to the memory cell, and its degree (write potential Vpgm) is increased every time the pulse signal is given to the memory cell.

If a voltage of 0 V is given to the bit line connected to the memory cell targeted for writing, the threshold value of the memory cell increases at the same increase rate as that of the write potential Vpgm after several pulse signals are given.

The 01 first step write verification and 01 second step write verification are performed after the writing is performed by use of the pulse signals, and then, the 00 first step write verification and 00 second step write verification are performed.

In the 01 first step write verification, when the threshold value of the memory cell indicated by the outline squares reaches the write verification potential, the potential of the bit line connected thereto is set to, for example, 0.4 V. For the memory cell in which the 01 first step write verification is finished, the 01 second step write verification is subsequently performed in each memory cell.

Furthermore, in the 00 first step write verification, when the threshold value of the memory cell indicated by the black squares reaches the write verification potential, the potential of the bit line connected thereto is set to, for example, 0.4 V. For the memory cell in which the 00 first step write verification is finished, the 00 second step write verification is subsequently performed in each memory cell.

In the 01 second step write verification, when the threshold value of the memory cell indicated by the outline squares reaches the write verification potential, the potential of the bit line connected thereto is set to, for example, Vdd (power supply potential). For the memory cell in which the 01 second step write verification is finished, writing is prohibited in each memory cell.

Furthermore, in the 00 second step write verification, when the threshold value of the memory cell indicated by the black squares reaches the write verification potential, the potential of the bit line connected thereto is set to, for example, Vdd (power supply potential). For the memory cell in which the 00 second step write verification is finished, writing is prohibited in each memory cell.

Regarding both the memory cell of the outline squares and the memory cell of the black squares, in the second step write verification, the increase rate of threshold value attained by giving one pulse signal is about 0 V/pulse to 0.05 V/pulse in the example shown in FIG. 34.

Therefore, according to such a writing and threshold value control method, the width of threshold distribution can be restricted to about the same degree as the increase rate of threshold value per pulse in the second step write verification, that is, to 0.05 V.

(6) operating Waveform in Writing Lower-Level Page Data

Figure 35:
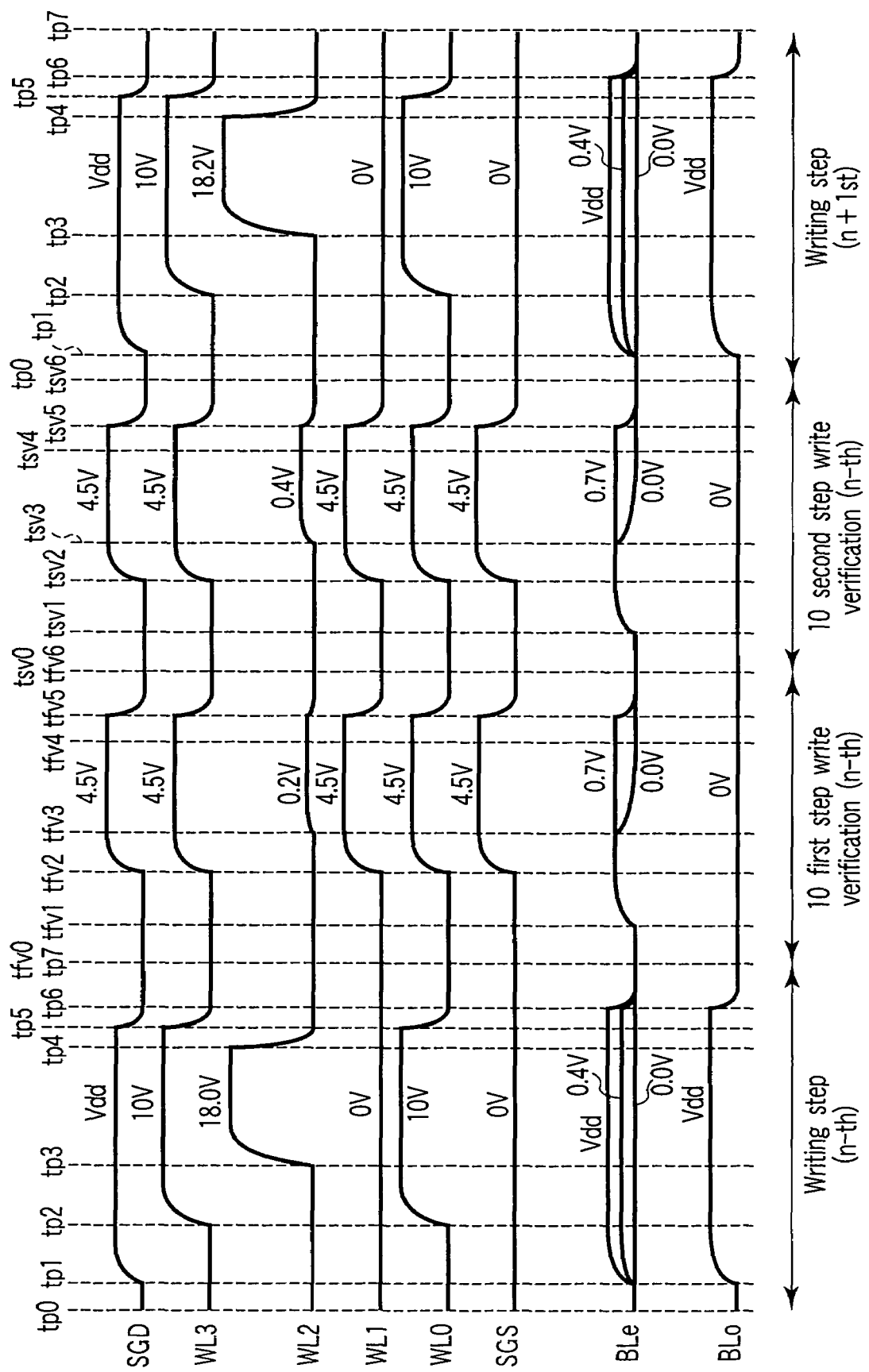
FIG. 35 is a diagram showing operating waveforms in writing into a lower-level page.

FIG. 35 shows operating waveforms in writing the lower-level page data.

A writing step continues from time tp0 to time tp7, and during this period, the pulse signal (write pulse) is given to the memory cell. The 10 first step write verification continues from time tfv0 to time tfv6, and the 10 second step write verification continues from time tsv0 to time tsv6.

This waveform chart shows an example in which the word line WL2 and the even bit line BLe are selected.

In the writing step, the selected bit line BLe is set to 0 V in the case of a write control potential, that is, the first step writing. The selected bit line BLe is set to 0.4 V in the case of the second step writing. The selected bit line BLe is set to Vdd (e.g., 2.5 V) in the case of the write protect state.

In the 10 first and second step write verifications, first, the selected bit line BLe is charged to 0.7 V. Subsequently, when the selected word line WL2 reaches a write verification potential (0.2 or 0.4 V), the potential of the selected bit line BLe changes in the following manner in accordance with the threshold value of the memory cell.

When the threshold value of the memory cell has reached the write verification potential (0.2 or 0.4 V), the bit line BLe maintains 0.7 V, and when the threshold value of the memory cell has not reached the write verification potential, the potential of the bit line BLe gradually decreases from 0.7 V toward 0 V.

If the potential of the bit line BLe is detected at the time of tfv4, tsv4, it is possible to detect whether or not the threshold value of the memory cell has reached the write verification potential. If the threshold value of the memory cell has reached the write verification potential, a detection result is "pass".

In the examples of the present invention, the mode is switched between the first mode to obtain the first threshold distribution and the second mode to obtain the second threshold distribution.

Here, for example, the flash memory is operated with the operating waveform as shown in FIG. 35 in the first mode.

Furthermore, as the threshold distribution of the memory cell needs to be narrower and sharper in the second mode than, for example, in the first mode, the width of stepping up the write potential Vpgm given to the selected word line WL2, for example, during the period from time tp3 to time tp4 is reduced.

In the example of FIG. 35, that is, in the first mode, the write potential Vpgm is increased by 0.2 V in moving from a writing step (n-th) to a writing step (n+1)th. Therefore, in the second mode, the write potential Vpgm is increased by 0.05 V lower than 0.2 V in moving from the writing step (n-th) to the writing step (n+1)th.

Furthermore, if the first mode has the operating waveforms as shown in FIG. 35, the values of the verification read potential given to the selected word line WL2, for example, during the period from time tfv3 to time tfv5 and during the period from time tsv3 to time tsv5 are set to be lower in the second mode than in the first mode.

In the example of FIG. 35, that is, in the first mode, the verification read potential Vcgv10 in the first step write verification (n-th) is 0.2 V, and the verification read potential Vcgv10 in the second step write verification (n-th) is 0.4 V. Therefore, in the second mode, the verification read potential Vcgv10 in the first step write verification (n-th) is set to 0.1 V, and the verification read potential Vcgv10 in the second step write verification (n-th) is set to 0.2 V.

(7) Algorithm of Writing Lower-Level Page Data

Figure 36:
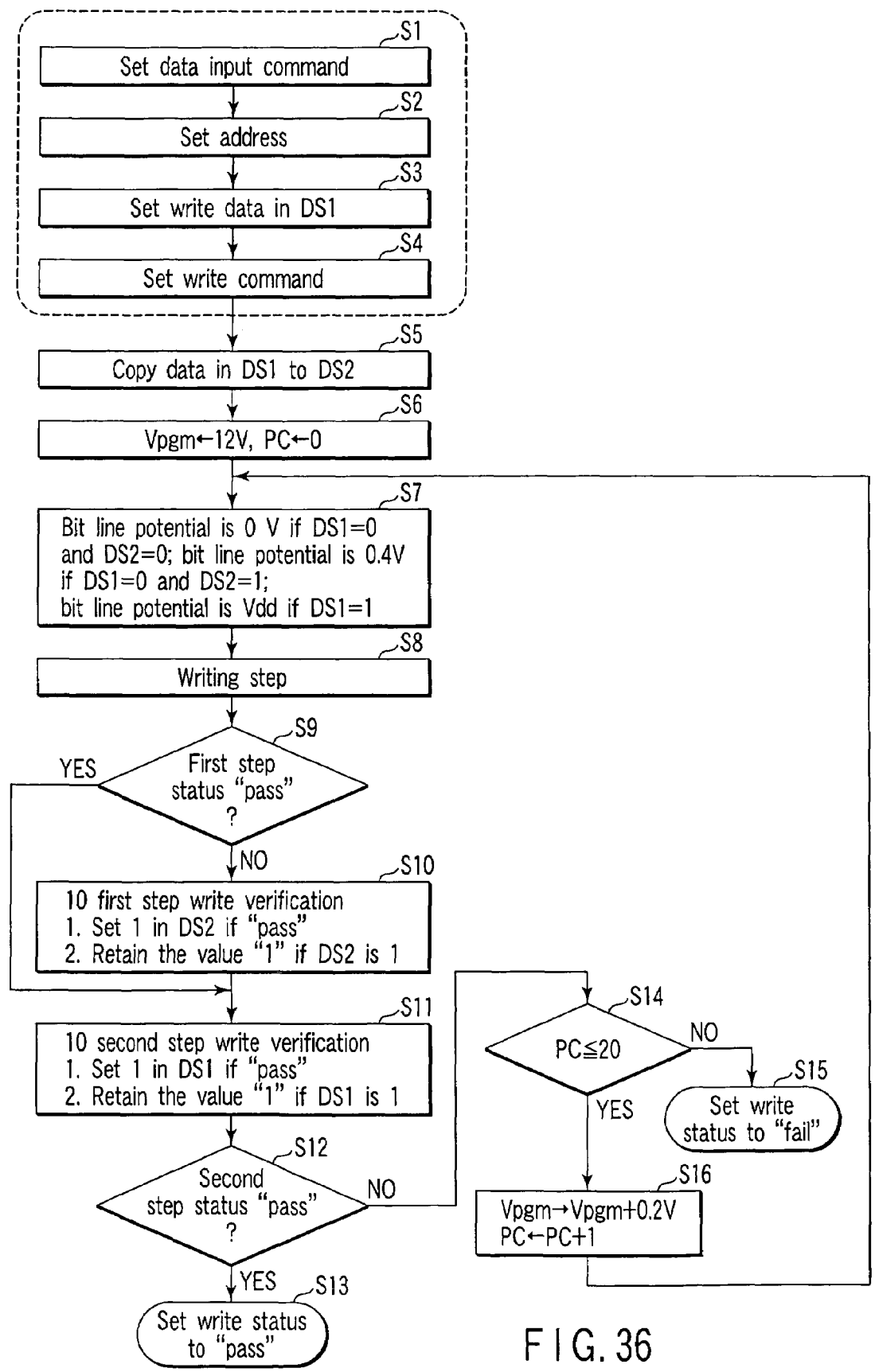
FIG. 36 is a diagram showing an algorithm of writing into the lower-level page.

FIG. 36 shows an algorithm of writing the lower-level page data.

Here, DS1, DS2 and DS3 indicate the storage circuits disposed in the data circuit, and for example, the DS1 corresponds to the page buffer PB in FIG. 23, the DS2 corresponds to the latch circuit LATCH in FIG. 23, and the DS3 corresponds to the MOS capacitor C1 in FIG. 23. Moreover, PC stands for a program cycle, that is, the number of writing.

First, when a data input command is received from the host microcomputer, the data input command is set in the state machine (step S1). Further, when an address data is received from the host microcomputer, an address for selecting a write page is set in the state machine (step S2).

Next, when a one-page amount of write data is received, the write data is stored in the storage circuit DS1 in the data circuit, and the write data is set (step S3). Subsequently, when a write command issued by the host microcomputer is received, the write command is set in the state machine (step S4).

When the write command is set, the state machine automatically executes the following steps S5 to S16.

First, data in the storage circuit DS1 is copied to the storage circuit DS2 (step S5). Subsequently, the initial value of the write potential Vpgm is set to about 12 V, and the count number PC of a write counter is set to "0" (step S6).

If the data in the storage circuit DS1 and the data in the storage circuit DS2 are both "0", it means the first step writing, so that 0 V which is the write control potential is given to the selected bit line. Further, if the data in the storage circuit DS1 is "0" and the data in the storage circuit DS2 is "1", it means the second step writing, so that 0.4 V is given to the selected bit line as the write control potential.

Furthermore, if the data in the storage circuit DS1 and the data in the storage circuit DS2 are both "1", it means the write protect, so that Vdd is given to the selected bit line as the write control potential (step S7).

Thus, writing is performed into the one-page amount memory cells by use of the write potential Vpgm and the write control potential given to the bit line (step S8).

Furthermore, whether or not all the data in the storage circuit DS2 in one page is "1" is detected by the 10 first step write verification, and if all is "1", the first step writing (status) is given "pass", and from next time, the 10 second step write verification is performed (steps S9, S10, S11).

On the other hand, if all the data in the storage circuit DS2 in one page is not "1", the first step writing (status) is not given "pass".

If the first step writing is not given "pass", the 10 first step write verification is performed (step S10). At this point, the data in the storage circuit DS2, which corresponds to the memory cell in which the detection result is "pass" among the one-page amount memory cells, changes from "0" to "1". Subsequently, the storage circuit DS2 storing "1" keeps holding "1".

If the first step writing is given "pass", or if the 10 first step write verification is finished, the 10 second step write verification is performed (step S11). At this point, the data in the storage circuit DS1, which corresponds to the memory cell in which the detection result is "pass" among the one-page amount memory cells, changes from "0" to "1". Subsequently, the storage circuit DS1 storing "1" keeps holding "1".

After the 10 first step write verification, whether or not all the data in the storage circuit DS1 in one page is "1" is detected by the 10 second step write verification, and if all is "1", the second step writing (status) is given "pass", and from next time, the write protect state is set (steps S11, S12, S13).

On the other hand, if all the data in the storage circuit DS1 in one page is not "1", the second step writing (status) is not given "pass".

If the second step writing is given "pass", writing is regarded as having been normally completed, and the write status is set to "pass" to finish writing (step S13).

If the second step writing is not given "pass", the count value PC of the write counter is checked (step S14), and if the value exceeds 20, writing is regarded as having not been normally completed, and the write status is set to "fail" to finish writing (step S15). If the count value PC of the write counter is 20 or less, the count value PC of the write counter is increased by 1, and a set value of the write potential Vpgm is increased by 0.2 V (step S16), and then the writing step (step S8) is again executed through step S7.

Table 4 shows the relationship between data before and after the 10 first step write verification and the threshold value of the memory cell.

TABLE 4

|  | Threshold value of memory cell Vth | |
| --- | --- | --- |
|  | Lower than 0.2 V | Higher than 0.2 V |
| Data DS1/DS2 before | 0/0 | 0/0 | 0/1 |
| n-th 10 first step | 0/1 | 0/1 | 0/1 |
| write verification | 1/1 | 1/1 | 1/1 |

Data DS1/DS2 after n-th 10 first step write verification

Before the n-th 10 first step write verification, the storage circuits DS1 and DS2 can have a value of 0/0, 0/1 or 1/1.

0/0 means that the threshold value of the memory cell has not reached the 10 first step write verification potential by an (n−1)th writing step.

0/1 means that the threshold value of the memory cell has reached the 10 first step write verification potential by the (n−1)th writing step, but not reached the 10 second step write verification potential.

1/1 means that the threshold value of the memory cell has reached the 10 second step write verification potential by the (n−1)th writing step.

It is impossible that the threshold value of the memory cell has reached the 10 second step write verification potential but not reached the 10 first step write verification potential by the (n−1)th writing step, so that a state 1/0 does not exist in the present example.

Before the 1st 10 first step write verification, the storage circuits DS1 and DS2 can have a value of 0/0 or 1/1.

If the threshold value of the memory cell has not reached 0.2 V which is the 10 first step write verification potential in the n-th writing step, the detection result in the 10 first step write verification is not "pass", so that the value of the data in the storage circuit DS2 is not changed.

If the threshold value of the memory cell has reached 0.2 V which is the 10 first step write verification potential in the n-th writing step, the detection result in the 10 first step write verification is "pass", so that the value of the data in the storage circuit DS2 is changed to "1".

If the value of the storage circuit DS2 is "1", the data in the storage circuit DS2 is not changed irrespective of the threshold value of the memory cell.

Table 5 shows the relationship between data before and after the 10 second step write verification and the threshold value of the memory cell.

TABLE 5

|  |  | Threshold value of memory cell Vth | |
| --- | --- | --- | --- |
|  |  | Lower than 0.4 V | Higher than 0.4 V |
| Data DS1/DS2 before n-th 10 second step write verification | 0/0 0/1 1/1 | 0/0 0/1 1/1 | — 1/1 1/1 |

Data DS1/DS2 after n-th 10 second step write verification

Before the n-th 10 second step write verification, the storage circuits DS1 and DS2 can have a value of 0/0, 0/1 or 1/1.

0/0 means that the threshold value of the memory cell has not reached the 10 first step write verification potential by the n-th writing step.

0/1 means that the threshold value of the memory cell has reached the 10 first step write verification potential by the n-th writing step, but the threshold value of the memory cell has not reached the 10 second step write verification potential by the (n−1)th writing step.

1/1 means that the threshold value of the memory cell has reached the 10 second step write verification potential by the (n−1)th writing step.

It is impossible that the threshold value of the memory cell has reached the 10 second step write verification potential by the (n−1)th writing step but not reached the 10 first step write verification potential by the n-th writing step, so that the state 1/0 does not exist in the present example.

If the threshold value of the memory cell has not reached 0.4 V which is the 10 second step write verification potential in the n-th writing step, the detection result in the 10 second step write verification is not "pass", so that the data in the storage circuit DS1 is not changed.

If the threshold value of the memory cell has reached 0.4 V which is the 10 second step write verification potential in the n-th writing step, the detection result in the 10 second step write verification is "pass", so that the data in the storage circuit DS1 is changed to "1".

If the value of the storage circuit DS1 is "1", the data in the storage circuit DS1 is not changed irrespective of the threshold value of the memory cell. 0/0 is not changed by the 10 second step write verification.

(8) Algorithm of Writing Higher-Level Page Data

Figure 37:
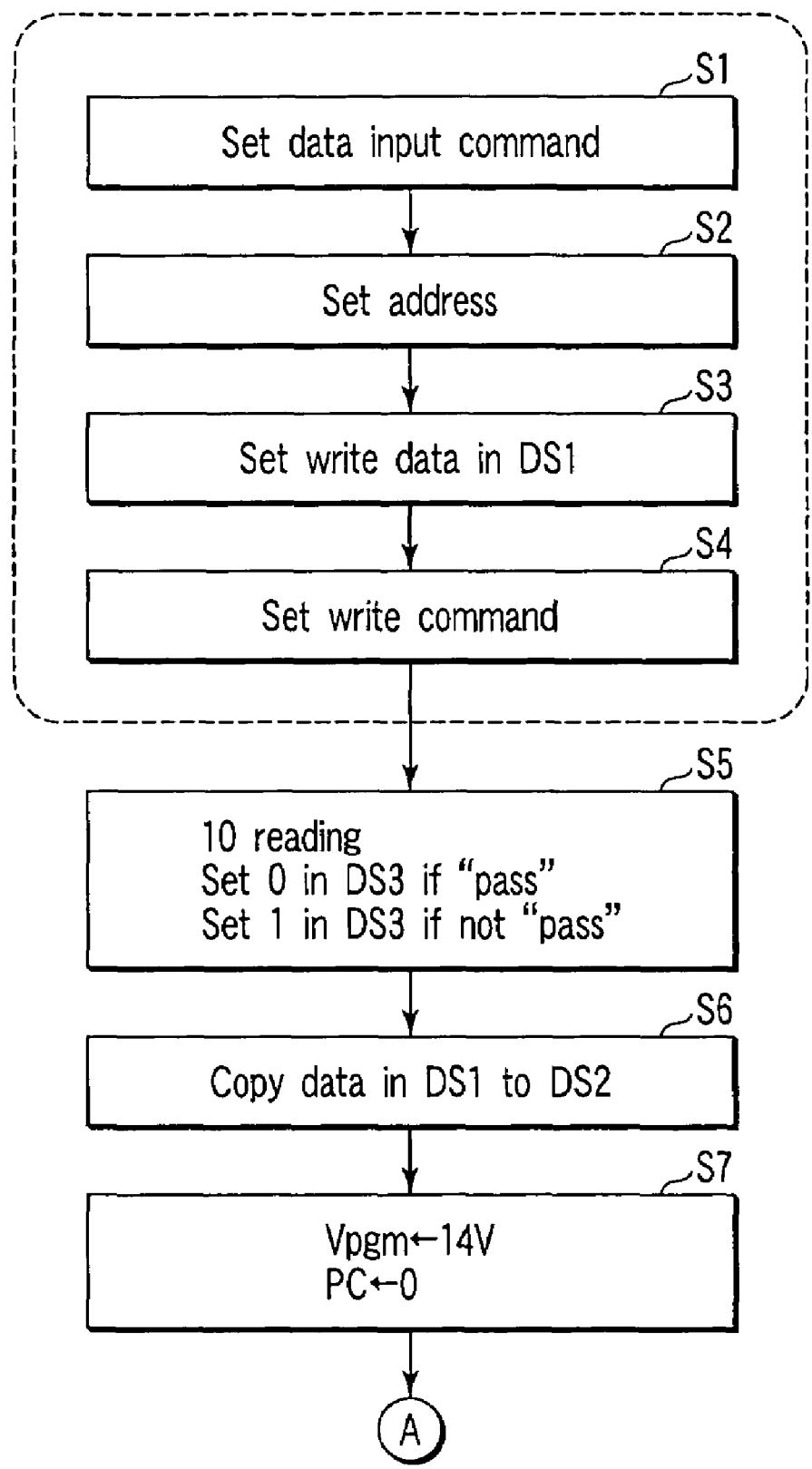
FIG. 37 is a diagram showing an algorithm of writing into the higher-level page.
Figure 38:
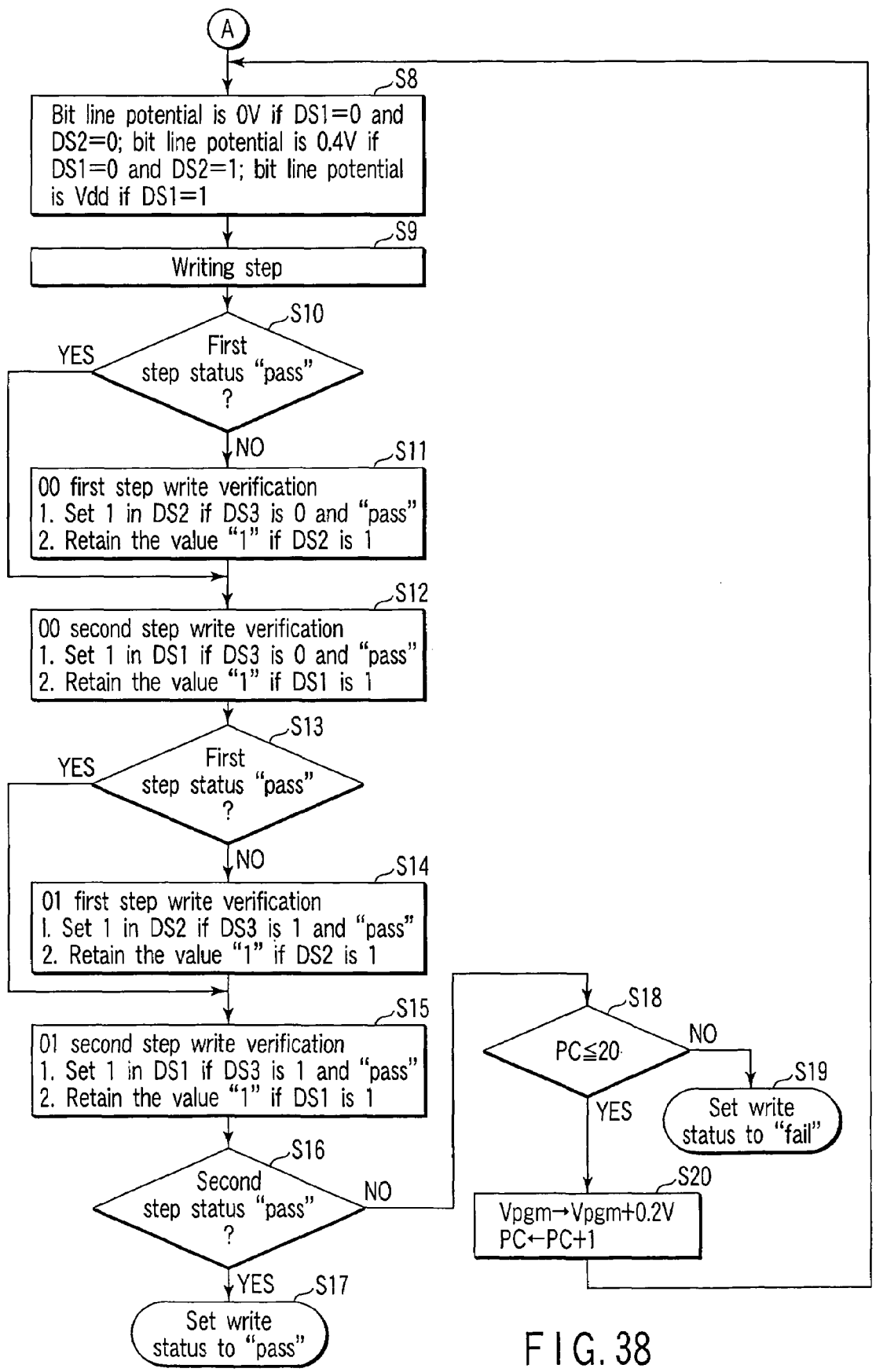
FIG. 38 is a diagram showing an algorithm of writing into the higher-level page.

FIG. 37 and FIG. 38 show an algorithm of writing the higher-level page data.

Here, as in FIG. 36, DS1, DS2 and DS3 indicate the storage circuits disposed in the data circuit, and for example, the DS1 corresponds to the page buffer PB in FIG. 23, the DS2 corresponds to the latch circuit LATCH in FIG. 23, and the DS3 corresponds to the MOS capacitor C1 in FIG. 23. Moreover, PC stands for the program cycle, that is, the number of writing.

First, when a data input command is received from the host microcomputer, the data input command is set in the state machine (step S1). Further, when an address data is received from the host microcomputer, an address for selecting a write page is set in the state machine (step S2).

Next, when a one-page amount of write data is received, the write data is stored in the storage circuit DS1 in the data circuit, and the write data is set (step S3). Subsequently, when a write command issued by the host microcomputer is received, the write command is set in the state machine (step S4).

When the write command is set, the state machine automatically executes the following steps S5 to S20.

First, the 10 reading is performed (step S5). When data in the memory cell is "10" in this reading, it is judged as "pass", and the value of the data in the storage circuit DS3 is set to "0". On the other hand, if the data in the memory cell is "11", it is not judged as "pass", and the value of the data in the storage circuit DS3 is set to "1".

Next, the data in the storage circuit DS1 is copied to the storage circuit DS2 (step S6). Subsequently, the initial value of the write potential Vpgm is set to about 14 V, and the count number PC of the write counter is set to "0" (step S7).

If the data in the storage circuit DS1 is "0" and the data in the storage circuit DS2 is "0", it means the first step writing, so that 0 V is given to the bit line as the write control potential.

If the data in the storage circuit DS1 is "0" and the data in the storage circuit DS2 is "1", it means the second step writing, so that 0.4 V is given to the bit line as the write control potential.

If the data in the storage circuit DS1 is "1" and the data in the storage circuit DS2 is "1", it means the write protect, so that the power supply potential. Vdd is given to the bit line as the write control potential (step S8).

Thus, writing is performed into the one-page amount memory cells by use of the write potential Vpgm and the write control potential given to the bit line (step S9).

In the sub-data circuit in which "0" is stored in the storage circuit DS3, whether or not all the data in the storage circuit DS2 is "1" is detected, and if all is "1" the 00 first step writing (status) is given "pass", and if not, it is not given "pass" (step S10). In the sub-data circuit in which "0" is stored in the storage circuit DS3, if all the data in the storage circuit DS2 is "1", the memory cell in which the 00 first step writing is performed in the writing step (step S9) does not exist.

If the 00 first step writing is not given "pass", the 00 first step write verification is performed (step S11). At this point, in the sub-data circuit in which "0" is stored in the storage circuit DS3 corresponding to the memory cell with the detection result "pass" among the one-page amount memory cells, the data in the storage circuit DS2 changes from "0" to "1". The storage circuit DS2 storing "1" keeps holding "1".

If the 00 first step writing is given "pass", or if the 00 first step write verification is finished, the 00 second step write verification is performed (step S12). At this point, in the sub-data circuit in which "0" is stored in the storage circuit DS3 corresponding to the memory cell with the detection result "pass" among the one-page amount memory cells, the data in the storage circuit DS1 changes from "0" to "1". The storage circuit DS1 storing "1" keeps holding "1".

Next, in the sub-data circuit in which "1" is stored in the storage circuit DS3, whether or not all the data in the storage circuit DS2 is "1" is detected, and if all is "1", the 01 first step writing (status) is given "pass", and if not, it is not given "pass" (step S13). In the sub-data circuit in which "1" is stored in the storage circuit DS3, if all the data in the storage circuit DS2 is "1", the memory cell in which the 01 first step writing is performed in the writing step (step S9) does not exist.

If the 01 first step writing is given "pass", the 01 first step write verification is performed (step S14). At this point, in the sub-data circuit in which "1" is stored in the storage circuit DS3 corresponding to the memory cell with the detection result "pass" among the one-page amount memory cells, the data in the storage circuit DS2 changes from "0" to "1". The storage circuit DS2 storing "1" keeps holding "1".

If the 01 first step writing is given "pass", or if the 01 first step write verification is finished, the 01 second step write verification is performed (step S15). At this point, in the sub-data circuit in which "1" is stored in the storage circuit DS3 corresponding to the memory cell with the detection result "pass" among the one-page amount memory cells, the data in the storage circuit DS1 changes from "0" to "1". The storage circuit DS1 storing "1" keeps holding "1".

After the 01 second step write verification, whether or not all the data in the storage circuit DS1 is "1" is detected, and if all is "1", the second step writing is given "pass", and if not, it is not given "pass" (step S16).

If the second step writing is given "pass", writing is regarded as having been normally completed, and the write status is set to "pass" to finish writing (step S17).

If the second step status is not given "pass", the count value PC of the write counter is checked (step S18), and if the value exceeds 20, writing is regarded as having not been normally performed, and the write status is set to "fail" to finish writing (step S19). If the count value PC of the write counter is 20 or less, the count value PC of the write counter is increased by 1, and the set value of the write potential Vpgm is increased by 0.2V (step S16), and then the writing step (step S9) is again executed through step S8.

Table 6 shows the relationship between data before and after the 01 first step write verification and the threshold value of the memory cell.

TABLE 6

|  | | Threshold value of memory cell Vth | |
|---|---|---|---|
|  | | Lower than 1.2 V | Higher than 1.2 V |
| Data DS1/DS2/DS3 before n-th 01 first step write verification | 0/0/1 | 0/0/1 | 0/1/1 |
|  | 0/1/1 | 0/1/1 | 0/1/1 |
|  | 1/1/1 | 1/1/1 | 1/1/1 |
|  | 0/0/0 | 0/0/0 | 0/0/0 |
|  | 0/1/0 | 0/1/0 | 0/1/0 |
|  | 1/1/0 | 1/1/0 | 1/1/0 |

Data DS1/DS2/DS3 after n-th 01 first step write verification

Before the n-th 01 first step write verification, the storage circuits DS1, DS2 and DS3 can have a value of 0/0/1, 0/1/1, 1/1/1, 0/0/0/, 0/1/0 or 1/1/0.

0/0/1 means that the threshold value of the memory cell has not reached the 01 first step write verification potential by the (n−1)th writing step.

0/1/1 means that the threshold value of the memory cell has reached the 01 first step write verification potential by the (n−1)th writing step, but not reached the 01 second step write verification potential.

1/1/1 means that the threshold value of the memory cell has reached the 01 second step write verification potential by the (n−1)th writing step.

It is impossible that the threshold value of the memory cell has reached the 01 second step write verification potential but not reached the 01 first step write verification potential by the (n−1)th writing step, so that a state 1/0/1 does not exist in the present example.

If the threshold value of the memory cell has not reached 1.2 V which is the 01 first step write verification potential in the n-th writing step, the detection result in the 01 first step write verification is not "pass", so that the value of the data in the storage circuit DS2 is not changed.

If the threshold value of the memory cell has reached 1.2 V which is the 01 first step write verification potential in the n-th writing step, the detection result in the 01 first step write verification is "pass", so that the value of the data in the storage circuit DS2 is changed to "1".

If the value of the storage circuit DS2 is "1", the data in the storage circuit DS2 is not changed irrespective of the threshold value of the memory cell. Further, because 0/0/0, 0/1/0 and 1/1/0 are not targeted for the 01 first step write verification, data in each circuit is not changed.

Table 7 shows the relationship between data before and after the 01 second step write verification and the threshold value of the memory cell.

TABLE 7

|  | | Threshold value of memory cell Vth | |
|---|---|---|---|
|  | | Lower than 1.4 V | Higher than 1.4 V |
| Data DS1/DS2/DS3 before n-th 01 second step write verification | 0/0/1 | 0/0/1 | — |
|  | 0/1/1 | 0/1/1 | 1/1/1 |
|  | 1/1/1 | 1/1/1 | 1/1/1 |
|  | 0/0/0 | 0/0/0 | 0/0/0 |
|  | 0/1/0 | 0/1/0 | 0/1/0 |
|  | 1/1/0 | 1/1/0 | 1/1/0 |

Data DS1/DS2/DS3 after n-th 01 second step write verification

Before the n-th 01 second step write verification, the storage circuits DS1, DS2 and DS3 can have a value of 0/0/1, 0/1/1, 1/1/1, 0/0/0/, 0/1/0 or 1/1/0.

0/0/1 means that the threshold value of the memory cell has not reached the 01 first step write verification potential after the n-th writing step.

0/1/1 means that the threshold value of the memory cell has reached the 01 first step write verification potential by the n-th writing step, but the threshold value of the memory cell has not reached the 01 second step write verification potential before the (n−1)th writing step.

1/1/1 means that the threshold value of the memory cell has reached the 01 second step write verification potential by the (n−1)th writing step.

It is impossible that the threshold value of the memory cell has reached the 01 second step write verification potential by the (n−1)th writing step but the threshold value of the memory cell has not reached the 01 first step write verification potential by the n-th writing step, so that the state 1/0/1 does not exist in the present example.

If the threshold value of the memory cell has not reached 1.4 V which is the 01 second step write verification potential in the n-th writing step, the detection result in the 01 second step write verification is not "pass", so that the data in the storage circuit DS1 is not changed.

If the threshold value of the memory cell has reached 1.4 V which is the 01 second step write verification potential in the n-th writing step, the detection result in the 01 second step write verification is "pass", so that the data in the storage circuit DS1 is changed to "1".

If the value of the storage circuit DS1 is "1", the data in the storage circuit DS1 is not changed irrespective of the threshold value of the memory cell. 0/0/1 is not changed by the 01 second step write verification. Further, because 0/0/0, 0/1/0 and 1/1/0 are not targeted for the 01 second step write verification, data in each circuit is not changed.

Table 8 shows the relationship between data before and after the 00 first step write verification and the threshold value of the memory cell.

TABLE 8

| | | Threshold value of memory cell Vth | |
|---|---|---|---|
| | | Lower than 2.2 V | Higher than 2.2 V |
| Data DS1/DS2/DS3 before n-th 00 first step write verification | 0/0/1 | 0/0/1 | — |
| | 0/1/1 | 0/1/1 | — |
| | 1/1/1 | 1/1/1 | — |
| | 0/0/0 | 0/0/0 | 0/1/0 |
| | 0/1/0 | 0/1/0 | 0/1/0 |
| | 1/1/0 | 1/1/0 | 1/1/0 |

Data DS1/DS2/DS3 after n-th 00 first step write verification

Before the n-th 00 first step write verification, the storage circuits DS1, DS2 and DS3 can have a value of 0/0/1, 0/1/1, 1/1/1, 0/0/0/, 0/1/0 or 1/1/0.

0/0/0 means that the threshold value of the memory cell has not reached the 00 first step write verification potential after the (n−1)th writing step.

0/1/0 means that the threshold value of the memory cell has reached the 00 first step write verification potential, but not reached the 00 second step write verification potential by the (n−1)th writing step.

1/1/0 means that the threshold value of the memory cell has reached the 00 second step write verification potential by the (n−1)th writing step.

It is impossible that the threshold value of the memory cell has reached the 00 second step write verification potential but not reached the 00 first step write verification potential by the (n−1)th writing step, so that the state 1/0/0 does not exist in the present example.

If the threshold value of the memory cell has not reached 2.2 V which is the 00 first step write verification potential in the n-th writing step, the detection result in the 00 first step write verification is not "pass", so that the value of the data in the storage circuit DS2 is not changed.

If the threshold value of the memory cell has reached 2.2 V which is the 00 first step write verification potential in the n-th writing step, the detection result in the 00 first step write verification is "pass", so that the data in the storage circuit DS2 is changed to "1".

If the value of the storage circuit DS2 is "1", the data in the storage circuit DS2 is not changed irrespective of the threshold value of the memory cell. Further, because 0/0/1, 0/1/1 and 1/1/1 are not targeted for the 00 first step write verification, data in each circuit is not changed.

Table 9 shows the relationship between data before and after the 00 second step write verification and the threshold value of the memory cell.

TABLE 9

| | | Threshold value of memory cell Vth | |
|---|---|---|---|
| | | Lower than 2.4 V | Higher than 2.4 V |
| Data DS1/DS2/DS3 before n-th 00 second step write verification | 0/0/1 | 0/0/1 | — |
| | 0/1/1 | 0/1/1 | — |
| | 1/1/1 | 1/1/1 | — |
| | 0/0/0 | 0/0/0 | — |
| | 0/1/0 | 0/1/0 | 1/1/0 |
| | 1/1/0 | 1/1/0 | 1/1/0 |

Data DS1/DS2/DS3 after n-th 00 second step write verification

Before the n-th 01 second step write verification, the storage circuits DS1, DS2 and DS3 can have a value of 0/0/1, 0/1/1, 1/1/1, 0/0/0/, 0/1/0 or 1/1/0.

0/0/0 means that the threshold value of the memory cell has not reached the 00 first step write verification potential after the n-th writing step.

0/1/0 means that the threshold value of the memory cell has reached the 00 first step write verification potential by the n-th writing step, but the threshold value of the memory cell has not reached the 00 second step write verification potential before the (n−1)th writing step.

1/1/0 means that the threshold value of the memory cell has reached the 00 second step write verification potential by the (n−1)th writing step.

It is impossible that the threshold value of the memory cell has reached the 00 second step write verification potential by the (n−1)th writing step but the threshold value of the memory cell has not reached the 00 first step write verification potential by the n-th writing step, so that the state 1/0/0 does not exist in the present example.

If the threshold value of the memory cell has not reached 2.4 V which is the 00 second step write verification potential in the n-th writing step, the detection result in the 00 second step write verification is not "pass", so that the data in the storage circuit DS1 is not changed.

If the threshold value of the memory cell has reached 2.4 V which is the 00 second step write verification potential in the n-th writing step, the detection result in the 00 first step write verification is "pass", so that the data in the storage circuit DS1 is changed to "1".

If the value of the storage circuit DS1 is "1", the data in the storage circuit DS1 is not changed irrespective of the threshold value of the memory cell. 0/0/0 is not changed by the 00 second step write verification. Further, because 0/0/1, 0/1/1 and 1/1/1 are not targeted for the 00 second step write verification, data in each circuit is not changed.

(9) Relationship between Dimension of Memory Cell and Threshold Distribution

Figure 39:
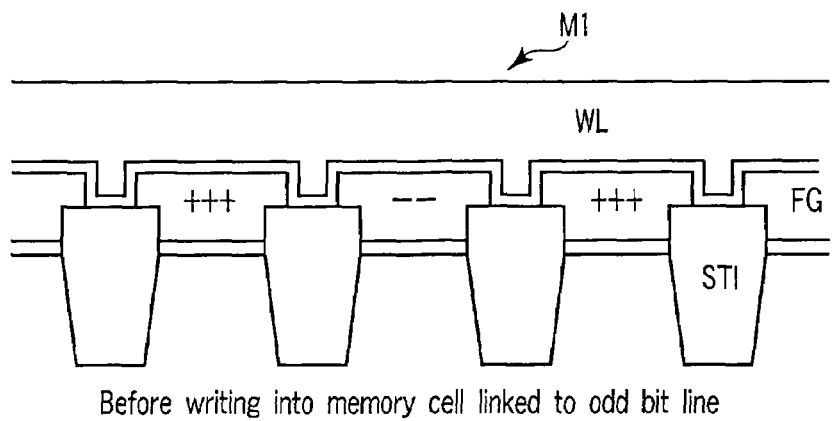
FIG. 39 is a diagram showing a state of electric charges in a floating gate electrode.
Figure 40:
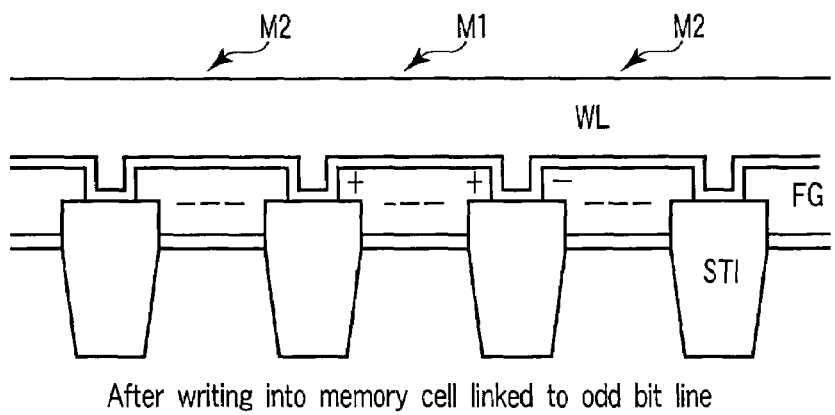
FIG. 40 is a diagram showing a state of electric charges in the floating gate electrode.

FIG. 39 and FIG. 40 show how electric charges in the floating gate electrode change before and after writing into the memory cell linked to the odd bit line.

In the initial state, all the memory cells are in the erased state.

Subsequently, as shown in FIG. 39, if, for example, the 10 writing is performed in the memory cell M1 linked to the even bit line, negative electric charges are injected into the floating gate electrode of the memory cell M1. This state is before writing into the memory cell linked to the odd bit line.

Next, as shown in FIG. 40, if, for example, the 10 writing is performed in the memory cells M2 and M3 linked to the odd bit line, negative electric charges are injected into the floating gate electrodes of the memory cells M2 and M3.

At this point, the electric charges in the floating gate electrode of the memory cell M1 change due to electrostatic coupling capacitance produced between the floating gate electrode of the memory cell M1 and the floating gate electrodes of the memory cells M2 and M3.

Figure 41:
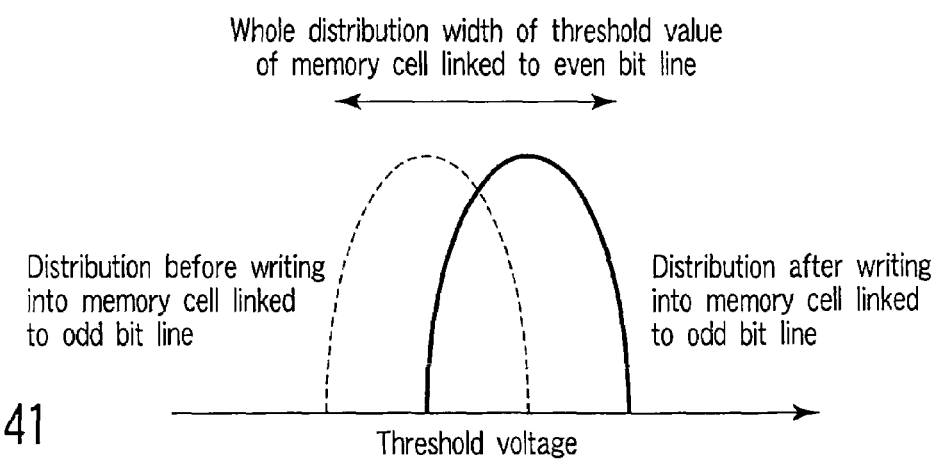
FIG. 41 is a diagram showing the spread of the threshold distribution of the memory cell.

In other words, as shown in FIG. 41, the amount of negative electric charges in the floating gate electrode of the memory cell M1 linked to the even bit line increases, and the threshold value of the memory cell M1 increases.

The threshold value changes more largely as the size of the memory cell decreases and parasitic capacitance produced between the floating gate electrodes of the adjacent memory cells increases. Further, such a phenomenon also apply to the memory cells M2 and M3 linked to the odd bit line before and after writing into the memory cell linked to the even bit line.

In this way, the width of threshold distribution of the memory cell tends to be wider along with the miniaturization of the memory cell. It is therefore conceived that the technique to reduce the width of the threshold distribution as described above will be significantly important in the future

(10) Procedure of Writing into Memory Cells in BLock

Figure 42:
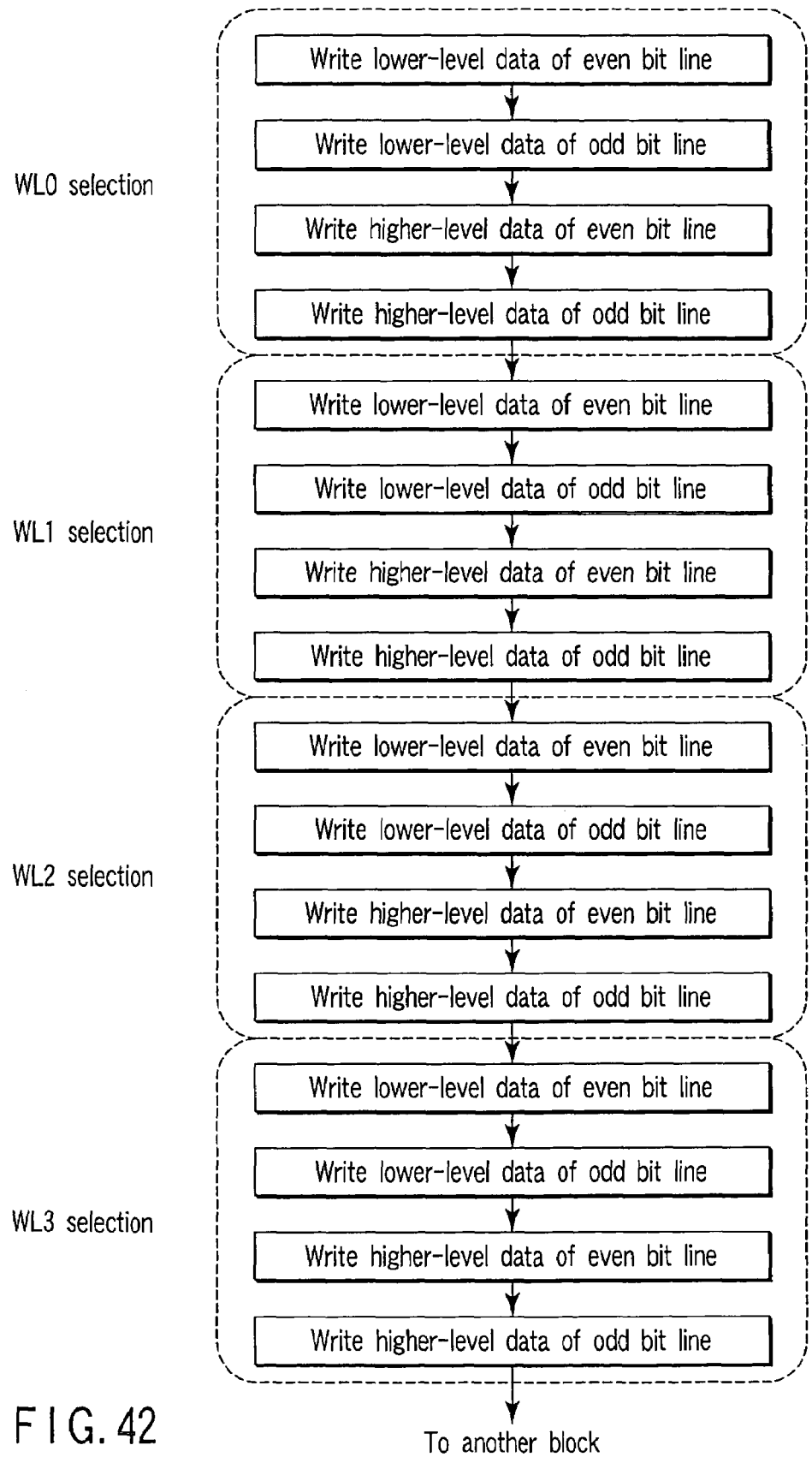
FIG. 42 is a diagram showing a procedure of writing into the memory cells in a block.

FIG. 42 shows an example of writing into the memory cells in the block.

Initially, the word line WL0 is selected, and the lower-level data (lower-level page data) is written into one page composed of the memory cells linked to the even bit line. Next, the lower-level data is written into one page composed of the memory cells linked to the odd bit line.

Subsequently, the higher-level data (higher-level page data) is written into one page composed of the memory cells linked to the even bit line. Finally, the higher-level data is written into one page composed of the memory cells linked to the odd bit line.

In the same manner, the word lines WL1, WL2 and WL3 are sequentially selected, and writing into the memory cells in the block is completed.

According to such writing procedure, interference caused between the floating gate electrodes of the adjacent memory cells can be reduced to the minimum. That is, since the higher-level data is written after the lower-level data is written into all the memory cells in one page, it is possible to reduce the difference between the threshold values of the adjacent memory cells during writing, and to reduce a fluctuation amount of the threshold value.

(11) Reading Algorithm

Figure 43:
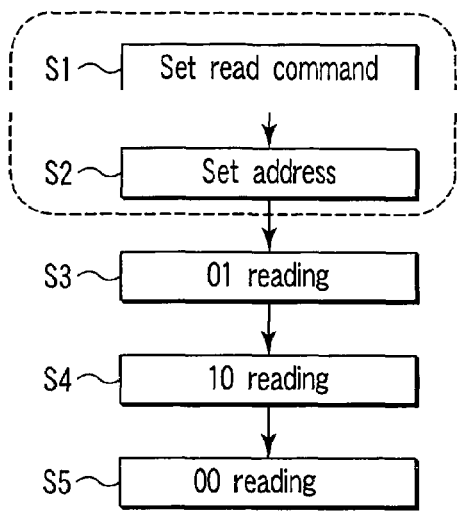
FIG. 43 is a diagram showing an algorithm of reading from the lower-level page.

FIG. 43 shows an algorithm of reading the lower-level page.

First, when a read command is received from the host microcomputer, the state machine sets the read command (step S1). Further, receiving an address data from the host microcomputer, the state machine sets an address for selecting a read page (step S2). When the address is set, the state machine automatically executes steps S3 to S5.

First, the 01 reading is performed (step S3). The read data is stored in the storage circuit in the data circuit.

As a result of the 01 reading, if the read data is "1", that is, if the higher-level page data is "1", the 10 reading is performed (step S4). As a result of the 10 reading, if the read data is "1", the lower-level page data is judged to be "1", and if it is "0", the lower-level page data is judged to be "0".

Furthermore, as a result of the 01 reading, if the read data is "0", that is, if the higher-level page data is "0", the 00 reading is performed (step S5). As a result of the 00 reading, if the read data is "1", the lower-level page data is judged to be "1", and if it is "0", the lower-level page data is judged to be "0".

Figure 44:
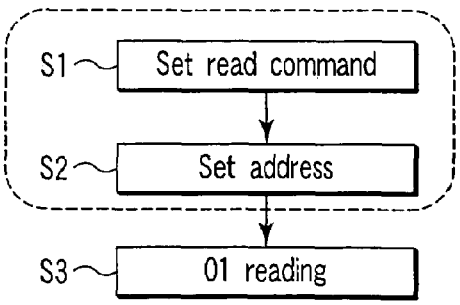
FIG. 44 is a diagram showing an algorithm of reading from the higher-level page.

FIG. 44 shows an algorithm of reading the lower-level page.

First, when a read command is received from the host microcomputer, the state machine sets the read command (step S1). Further, receiving an address data from the host microcomputer, the state machine sets an address for selecting a read page (step S2).

When the address is set, the state machine executes the 01 reading (step S3). The read data is stored in the storage circuit in the data circuit. As a result of the 01 reading, if the read data is "1", the higher-level page data is judged to be "1", and if it is "0", the lower-level page data is judged to be "0".

(12) Modification of Writing Step

Figure 45:
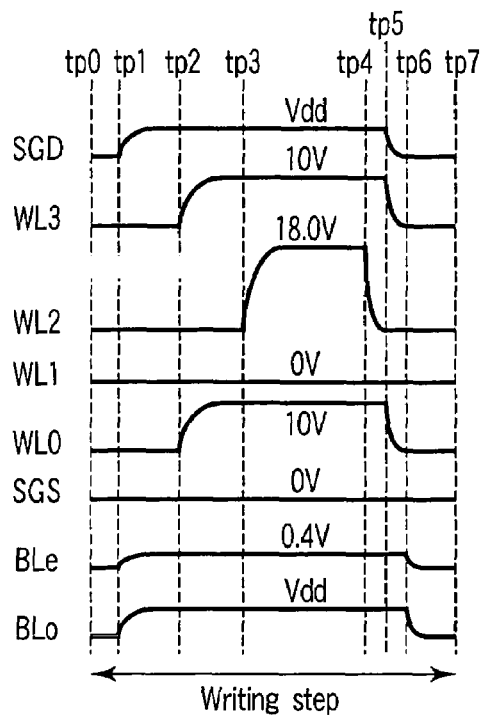
FIG. 45 is a waveform chart showing an example of a writing step.
Figure 46:
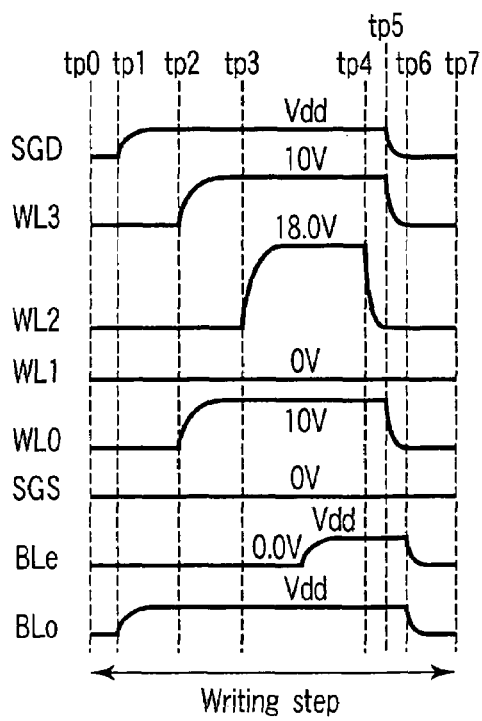
FIG. 46 is a waveform chart showing an example of the writing step.

FIG. 45 shows the writing step in the waveform chart of FIG. 35. FIG. 46 shows a modification of the writing step of FIG. 45.

In an example of FIG. 45, 0.4 V is given to the selected bit line BLe as the write control potential. On the contrary, in an example of FIG. 46, the selected bit line BLe is maintained at 0 V until a certain period passes after the write potential Vpgm has given to the word line WL2, and after that period has passed, the selected bit line BLe is set to a write protect potential (e.g., Vdd). In this way, effective pulse width is decreased, and the threshold value of the memory cell is prevented from increasing.

(13) Modification of Write verification Step

Figure 47:
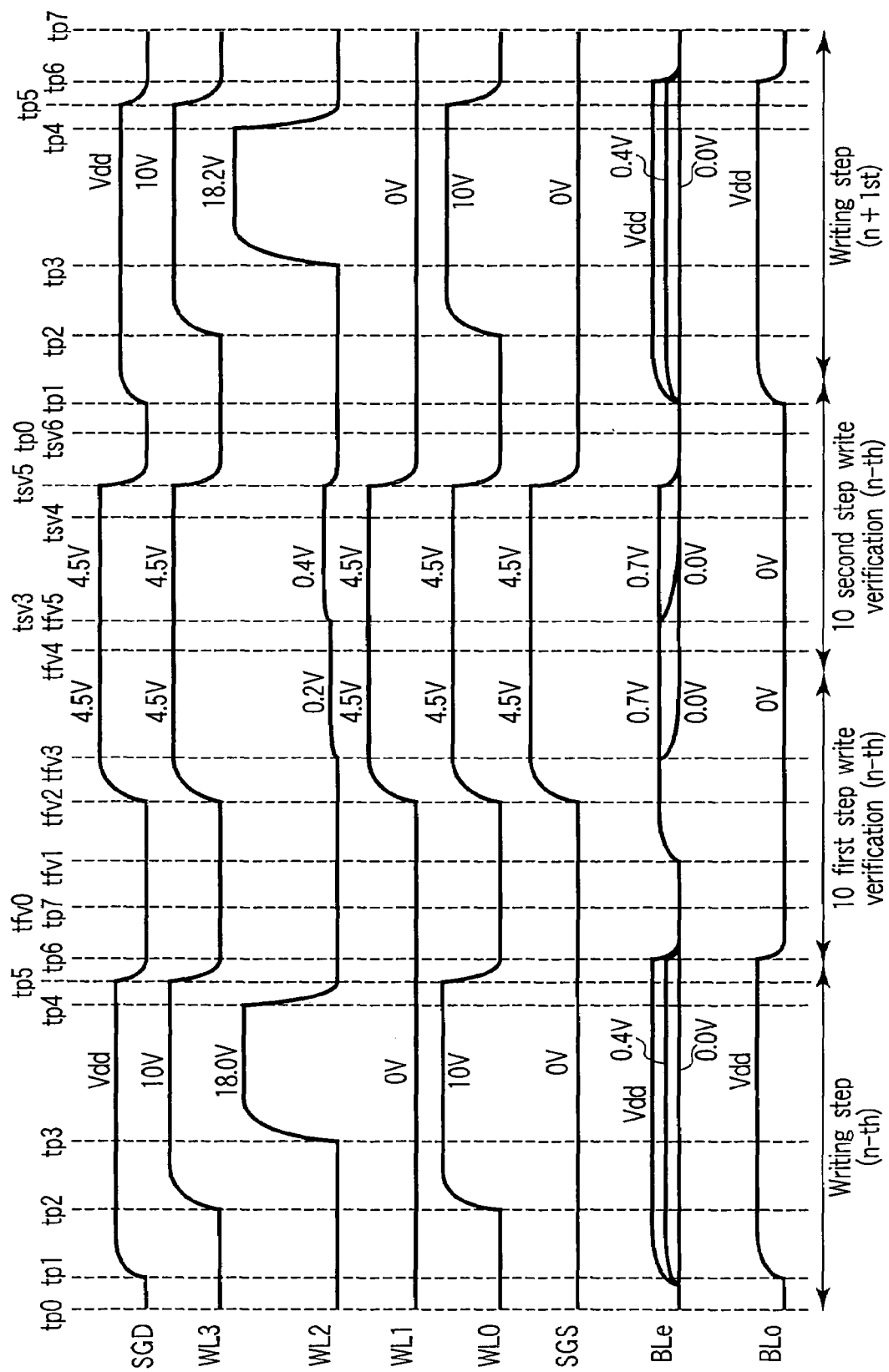
FIG. 47 is a waveform chart showing an example of a write verification step.

FIG. 47 shows a modification of the write verification in the waveform chart of FIG. 35.

In the first step write verification, the selected bit line BLe is first charged to 0.7 V. Subsequently, when the selected word line WL2 reaches a first step write verification potential, the potential of the bit line BLe changes in accordance with the threshold value of the memory cell.

For example, when the threshold value of the memory cell has reached the first step write verification potential, the bit line BLe maintains 0.7 V, and when it has not reached, the potential of the bit line BLe decreases toward 0 V.

Therefore, if the potential of the bit line BLe is detected at time tfv4, it is possible to detect whether or not the threshold value of the memory cell has reached the first step write verification potential. If the threshold value of the memory cell has reached the write verification potential, the detection result will be "pass".

Subsequently, at time tfv5 (time tfv3), the potential of the selected word line WL2 is switched from the first step write verification potential to a second step write verification potential. At this point, if the threshold value of the memory cell has reached the second step write verification potential, the bit line BLe maintains 0.7 V, or contrarily, if it has not reached, the potential of the bit line BLe decreases toward 0 V.

Therefore, if the potential of the bit line BLe is detected at time tfv4, it is possible to detect whether or not the threshold value of the memory cell has reached the second step write verification potential. If the threshold value of the memory cell has reached the write verification potential, the detection result will be "pass".

Thus, according to the present example, since the time to charge the bit line BLe in the second step write verification can be eliminated, high-speed writing is possible.

It should be noted that the write verification step of the present example can be applied not only to the 10 first and second step write verifications, but also to the 01 first and second step write verifications or the 00 first and second step write verifications.

3. Others

The multi-level NAND-structured flash memory has been described in the above embodiments, but the examples of the present invention can also be applied to ordinary binary NAND-structured flash memories, or flash memories having other types of configurations such as NOR, AND, DINOR.

Furthermore, the examples of the present invention can be applied not only to the flash memory but also to general nonvolatile semiconductor memories.

Figure 48:
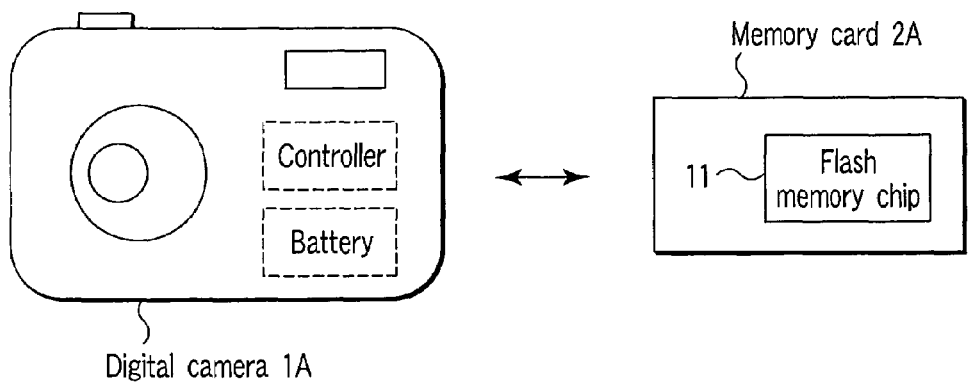
FIG. 48 is a diagram showing an example of a system to which the flash memory according to an example of the present invention is applied.
Figure 49:
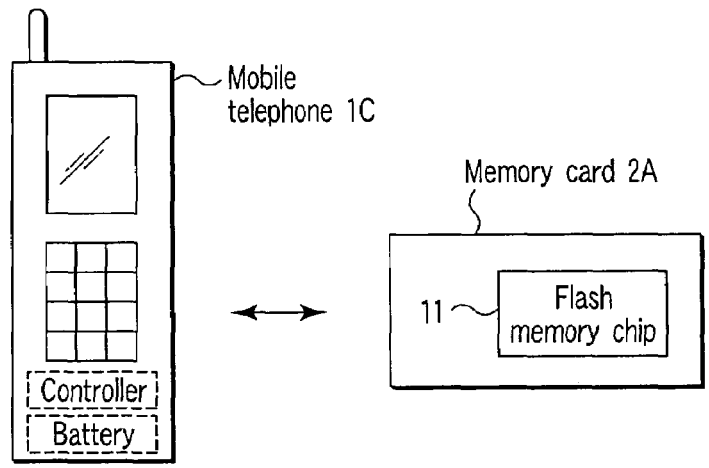
FIG. 49 is a diagram showing an example of a system to which the flash memory according to an example of the present invention is applied.
Figure 50:
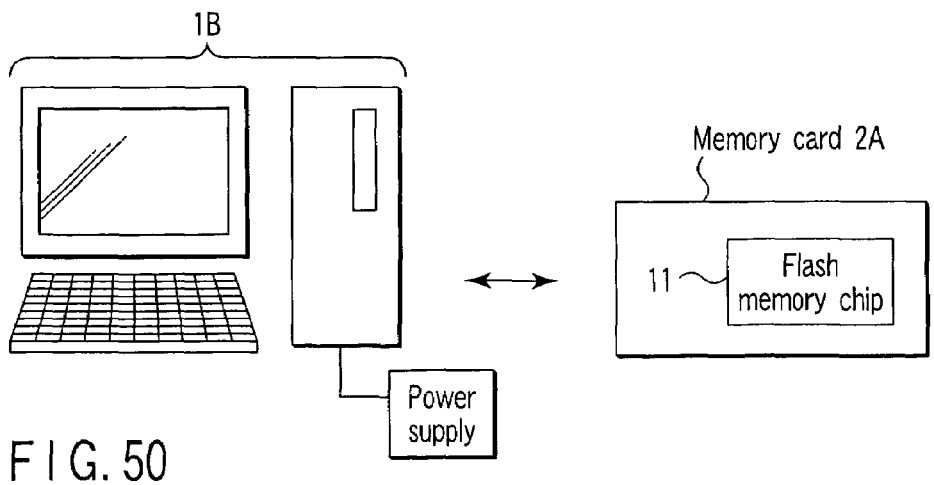
FIG. 50 is a diagram showing an example of a system to which the flash memory according to an example of the present invention is applied.

Still further, the flash memory according to the examples of the present invention can be applied to a digital camera system as shown in FIG. 48, a mobile telephone system as shown in FIG. 49, or a computer system as shown in FIG. 50.

The examples of the present invention are especially effective in the nonvolatile semiconductor memory desired to achieve both high-speed writing and high reliability.

According to the examples of the present invention, it is possible to provide a nonvolatile semiconductor memory in which the shape of threshold distribution of the memory cell can be freely set depending on characteristics of the memory cell after manufacturing the chip, or different shapes of threshold distribution can be produced between the reliable memory cells and unreliable memory cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A nonvolatile semiconductor memory comprising:
   a NAND string which has memory cells connected in series;
   a first select gate transistor which is connected to one end of the NAND string; and
   an internal circuit which writes data to produce a first threshold distribution in a memory cell in said NAND string next to the first select gate transistor by use of a first mode, and to produce a second threshold distribution in a memory cell located at the middle of the NAND string by use of a second mode different from the first mode,
   said NAND string, after writing said data, having said memory cell with said first threshold distribution and said memory cell located at the middle of the NAND string with said second threshold distribution,
   the first threshold distribution having a width narrower than a width of the second threshold distribution.

2. The nonvolatile semiconductor memory according to claim 1, further comprising a second select gate transistor which is connected to another end of the NAND string,
   wherein the internal circuit writes data to a first group in said NAND string including the memory cell next to the first select gate transistor and the memory cell next to the second select gate transistor by use of the first mode, and writes data to a second group in said NAND string including the memory cell provided between the memory cells of the first group by use of the second mode.

3. The nonvolatile semiconductor memory according to claim 1,
   wherein the first mode obtains a first threshold distribution sharper than a second threshold distribution obtained by the second mode.

4. The nonvolatile semiconductor memory according to claim 1,
   wherein the internal circuit performs reading by use of a first read potential when the first mode is selected, and performs reading by use of a second read potential when the second mode is selected.

5. The nonvolatile semiconductor memory according to claim 1,
   wherein the internal circuit performs verification reading by use of a first verification read potential when the first mode is selected, and performs the verification reading by use of a second verification read potential when the second mode is selected.

6. The nonvolatile semiconductor memory according to claim 1,
   wherein the internal circuit performs writing by use of a first write potential having a first step-up width when the first mode is selected, and performs writing by use of a second write potential having a second step-up width when the second mode is selected.

7. The nonvolatile semiconductor memory according to claim 1, comprising:
   a control circuit which controls a switchover between the first mode and the second mode, wherein the switchover between the first mode and the second mode is performed on the basis of a command input from the outside of a chip.

8. The nonvolatile semiconductor memory according to claim 1, comprising:
   a control circuit which controls a switchover between the first mode and the second mode, wherein the switchover between the first mode and the second mode is performed on the basis of data stored in one of the memory cell array and a fuse element inside a chip.

9. The nonvolatile semiconductor memory according to claim 1, comprising:
   a control circuit which controls a switchover between the first mode and the second mode, wherein the switchover between the first mode and the second mode is performed on the basis of a signal whose value is fixed during a wafer process or during chip bonding.

10. The nonvolatile semiconductor memory according to claim 1, wherein:
    said memory comprises a plurality of first select gate transistors respectively connected to one end of a plurality of NAND strings; and
    said internal circuit writes data to produce said first threshold distribution in a memory cell in each of said NAND strings next to a respective first select gate transistor by use of said first mode, and to produce said second threshold distribution in a memory cell located at the middle of each of the NAND strings by use of a second mode different from the first mode,
    each of said NAND strings, after writing said data, having said memory cell with said first distribution and said memory cell located at the middle of the NAND string with said second distribution.

11. The nonvolatile semiconductor memory according to claim 1, wherein:
    said memory comprises a plurality of adjacent first select gate transistors respectively connected to one end of a plurality of adjacent NAND strings; and
    said internal circuit writes data to produce said first threshold distribution in a memory cell in each of said NAND strings next to a respective first select gate transistor by use of said first mode, and to produce said second threshold distribution in a second memory cell located at the middle of each of the NAND strings by use of a second mode different from the first mode,
    each of said NAND strings, after writing said data, having said memory cell with said first distribution and said memory cell located at the middle of the NAND string with said second distribution.

12. The nonvolatile semiconductor memory according to claim 1, wherein:
    said memory comprises a plurality of first select gate transistors respectively connected to one end of a plurality of NAND strings;
    said memory comprises a plurality of second select gate transistors respectively connected to another end of said plurality of NAND strings; and
    said internal circuit writes data to produce said first threshold distribution in a memory cell in each of said NAND strings next to a respective first select gate transistor and to produce said first threshold distribution in a memory cell in each of said NAND strings next to a respective second select gate transistor by use of said first mode, and to produce said second threshold distribution in a memory cell located in the middle of each of said NAND strings, said NAND strings after writing said data having said memory cells with said first distribution and said memory cell located at the middle of the NAND string with said second distribution.

13. The nonvolatile semiconductor memory according to claim 1, wherein:
said memory comprises a plurality of first select gate transistors respectively connected to one end of a plurality of NAND strings;
said memory comprises a plurality of second select gate transistors respectively connected to another end of said plurality of NAND strings; and
said internal circuit writes data to produce said first threshold distribution in a first memory cell in each of said NAND strings next to a respective first select gate transistor and to produce said first threshold distribution in a second memory cell in each of said NAND strings next to a respective second select gate transistor by use of said first mode, and to produce said second threshold distribution in all other memory cells located between said first and second memory cells in each of said NAND strings,
each of said NAND strings, after writing said data, having said memory cells with said first distribution and said memory cells with said second distribution located between said first and second memory cells.

14. A nonvolatile semiconductor memory comprising:
a memory cell array which has memory cells arranged in series in NAND strings and a common data path;
an internal circuit which writes data to a memory cell in a first group in a NAND string by using a first mode, and which writes data to a memory cell in a second group in said NAND string different from the first group by using a second mode different from the first mode, said NAND string, after writing said data, having said memory cell in said first group with a first threshold distribution and said memory cell in said second group with a second threshold distribution,
wherein the first mode obtains said first threshold distribution having a width narrower than a width of said second threshold distribution obtained by the second mode and the first and second threshold distributions are threshold distributions regarding the same data.

15. The nonvolatile semiconductor memory according to claim 14,
wherein the memory cell array comprises a select gate transistor which is connected to one end of the NAND string.

16. The nonvolatile semiconductor memory according to claim 14,
wherein the internal circuit performs reading by use of a first read potential when the first mode is selected, and performs reading by use of a second read potential when the second mode is selected.

17. The nonvolatile semiconductor memory according to claim 14,
wherein the internal circuit performs verification reading by use of a first verification read potential when the first mode is selected, and performs the verification reading by use of a second verification read potential when the second mode is selected.

18. The nonvolatile semiconductor memory according to claim 14,
wherein the internal circuit performs writing by use of a first write potential having a first step-up width when the first mode is selected, and performs writing by use of a second write potential having a second step-up width when the second mode is selected.

19. The nonvolatile semiconductor memory according to claim 14, comprising:
a control circuit which controls a switchover between the first mode and the second mode,
wherein the switchover between the first mode and the second mode is performed on the basis of a command input from the outside of a chip.

20. The nonvolatile semiconductor memory according to claim 14, comprising:
a control circuit which controls a switchover between the first mode and the second mode,
wherein the switchover between the first mode and the second mode is performed on the basis of data stored in one of the memory cell array and a fuse element inside a chip.

21. The nonvolatile semiconductor memory according to claim 14, comprising:
a control circuit which controls a switchover between the first mode and the second mode,
wherein the switchover between the first mode and the second mode is performed on the basis of a signal whose value is fixed during a wafer process or during chip bonding.

22. The nonvolatile semiconductor memory according to claim 14, wherein:
said memory comprises a plurality of NAND strings; and
said internal circuit writes data to produce said first threshold distribution in a memory cell in a first group in each of said NAND strings by use of said first mode, and to produce said second threshold distribution in a memory cell located in said second group in each of the NAND strings by use of a second mode different from the first mode,
each of said NAND strings, after writing said data, having said memory cell in said first group with said first distribution and said memory in said second group with said second distribution.

23. The nonvolatile semiconductor memory according to claim 22, wherein:
said memory comprises a plurality of adjacent first select gate transistors respectively connected to one end of a plurality of adjacent NAND strings; and
said memory cells of said first group are respectively located next to said first select gate transistors.

24. The nonvolatile semiconductor memory according to claim 22, wherein:
said memory comprises a plurality of first select gate transistors respectively connected to one end of a plurality of adjacent NAND strings;
said memory comprises a plurality of second select gate transistors respectively connected to another end of said plurality of adjacent NAND strings; and
said memory cells of said first group are respectively located next to each of said first and second select gate transistors.

25. A nonvolatile semiconductor memory comprising:
a NAND string having memory cells connected in series;
said memory cells consisting of at least one memory cell and remaining memory cells consisting of all other memory cells in said NAND string other than said at least one memory cell, a reliability of said at least one memory cell being lower than a reliability of said remaining memory cells; and an internal circuit which writes data to produce a first threshold distribution only in said at least one memory cell in said NAND string by use of a first mode, and to produce a second threshold distribution only in each of said remaining memory cells in said NAND string by use of a second mode different from said first mode, said NAND string after writing said data having said at least one memory cell with said first threshold distribution and said remaining memory cells with said second threshold distribution; and the first threshold distribution having a width narrower than a width of said second threshold distribution.

26. The nonvolatile semiconductor memory according to claim 25, wherein:
   a word line of said at least one memory cell is thinner than a word line of each of said memory cells in said remaining group of memory cells.

27. The nonvolatile semiconductor memory according to claim 25, wherein:
   said at least one memory cell is located at an end of said NAND string.

28. The nonvolatile semiconductor memory according to claim 25, wherein:
   said at least one memory cell comprises two memory cells located at respective ends of said NAND string.

* * * * *